(12) United States Patent
Maenishi et al.

(10) Patent No.: US 7,313,859 B2
(45) Date of Patent: Jan. 1, 2008

(54) METHOD FOR OPTIMIZING PLACEMENT ORDER BY PLACEMENT APPARATUSES THAT PLACE ELECTRONIC COMPONENTS ON CIRCUIT BOARD

(75) Inventors: Yasuhiro Maenishi, Kofu (JP); Ikuo Yoshida, Kofu (JP); Satoshi Masuda, Hirakata (JP); Akihito Yamasaki, Kurume (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 446 days.

(21) Appl. No.: 10/490,772

(22) PCT Filed: Sep. 24, 2002

(86) PCT No.: PCT/JP02/09790

§ 371 (c)(1),
(2), (4) Date: Oct. 1, 2004

(87) PCT Pub. No.: WO03/030611

PCT Pub. Date: Apr. 10, 2003

(65) Prior Publication Data

US 2005/0065620 A1 Mar. 24, 2005

(30) Foreign Application Priority Data

Sep. 28, 2001 (JP) .............................. 2001-303821
Jul. 9, 2002 (JP) .............................. 2002-200491

(51) Int. Cl.
*B23Q 15/00* (2006.01)
*G05B 13/02* (2006.01)

(52) U.S. Cl. ............................ 29/711; 29/705; 29/706; 29/707; 29/721; 700/28

(58) Field of Classification Search .................. 29/711, 29/705, 721, 707, 706; 700/28, 96, 99, 101, 700/213, 214
See application file for complete search history.

(56) References Cited

U.S. PATENT DOCUMENTS

| | | | | |
|---|---|---|---|---|
| 3,406,379 A | * | 10/1968 | Palevsky et al. | 703/3 |
| 5,086,559 A | * | 2/1992 | Akatsuchi | 29/834 |
| 5,224,325 A | | 7/1993 | Takahashi et al. | 53/443 |
| 6,094,808 A | * | 8/2000 | Mimura et al. | 29/743 |
| 6,272,341 B1 | * | 8/2001 | Threadgill et al. | 455/428 |
| 6,314,640 B1 | * | 11/2001 | Yoshida et al. | 29/834 |

FOREIGN PATENT DOCUMENTS

JP     04196296     7/1992

(Continued)

Primary Examiner—A. Dexter Tugbang
Assistant Examiner—Tai Van Nguyen

(57) ABSTRACT

An optimization apparatus capable of efficiently placing an electronic component. An optimization unit (203) determines a first assignment to the placement apparatus and calculates a first placement time required for placing all the electronic components assigned to the placement apparatus by the first assignment onto a circuit board by the placement apparatus. The optimization unit selects two placement apparatuses among a plurality of placement apparatuses, selects a type of an electronic component assigned for the selected placement apparatus, determines a second assignment by interchanging two selected times assigned, calculates a second placement time required for placing all the electronic components assigned to the placement apparatus by the second assignment onto the circuit board by the placement apparatus, and employs the one of the first assignment and the second assignment which has a smaller placement time.

6 Claims, 57 Drawing Sheets

FOREIGN PATENT DOCUMENTS

| | | |
|---|---|---|
| JP | 06164189 | 6/1994 |
| JP | 06-244589 | 9/1994 |
| JP | 07022774 | 1/1995 |
| JP | 07147499 | 6/1995 |
| JP | 09260893 | 10/1997 |
| JP | 10209697 | 8/1998 |
| JP | 11-087996 | 3/1999 |
| JP | 2002-050900 | 2/2002 |
| JP | 2002-314292 | 10/2002 |
| WO | WO 97/48263 | 12/1997 |

\* cited by examiner

FIG.5

COMPONENT TABLE

| COMPONENT NAME | COMPONENT NUMBER | X COORDINATE VALUE | Y COORDINATE VALUE | ANGLE θ | XY SPEED | CAMERA | NOZZLE | HEAD SPEED |
|---|---|---|---|---|---|---|---|---|
| A | A001 | $X_1$ | $Y_1$ | $\theta_1$ | $V_1$ | 2DS | S | $h_1$ |
| A | A002 | $X_2$ | $Y_2$ | $\theta_2$ | $V_2$ | 2DS | S | $h_2$ |
| A | A003 | $X_3$ | $Y_3$ | $\theta_3$ | $V_3$ | 2DS | S | $h_3$ |
| ... | ... | ... | ... | ... | ... | ... | ... | ... |
| B | B001 | $X_{21}$ | $Y_{21}$ | $\theta_{21}$ | $V_{21}$ | 2DS | L | $h_{21}$ |
| ... | ... | ... | ... | ... | ... | ... | ... | ... |

FIG.6

TACT CALCULATION UNIT
CORRESPONDENCE TABLE

| PLACEMENT APPARATUS NAME | TACT CALCULATION UNIT NAME |
|---|---|
| M/C1 | P1 |
| M/C2 | P2 |
| M/C3 | P3 |

FIG.7

PLACEMENT APPARATUS TYPE TABLE

| PLACEMENT APPARATUS NAME | TYPE | HEAD COUNT |
|---|---|---|
| M/C1 | ROTARY | 1 |
| M/C2 | 1 BY 1 ROBOT | 1 |
| M/C3 | SIMULTANEOUS PICKUP | 4 |

FIG.8

TACT TABLE

| COMPONENT NAME | M/C1 | | M/C2 | | M/C3 | | COMPONENT COUNT |
|---|---|---|---|---|---|---|---|
| | MAXIMUM TACT | PLACEMENT TIME | MAXIMUM TACT | PLACEMENT TIME | MAXIMUM TACT | PLACEMENT TIME | |
| A | 0.1 | | 0.2 | | 0.4 | | 20 |
| B | 0.15 | | 0.3 | | 0.6 | | 20 |
| C | 0.15 | | 0.3 | | 0.6 | | 10 |
| D | 0.2 | | 0.4 | | 0.8 | | 10 |
| E | 0.4 | | 0.8 | | 1.6 | | 5 |
| F | 0.4 | | 0.8 | | 1.6 | | 4 |
| G | 0.5 | | 1.0 | | 2.0 | | 3 |
| H | 0.5 | | 1.0 | | 2.0 | | 2 |
| I | 1.0 | | 2.0 | | 4.0 | | 2 |
| J | ∞ | | ∞ | | 6.0 | | 1 |
| K | ∞ | | ∞ | | 6.0 | | 1 |

FIG.9
TACT TABLE

| COMPONENT NAME | M/C1 | | M/C2 | | M/C3 | | COMPONENT COUNT |
|---|---|---|---|---|---|---|---|
| | MAXIMUM TACT | PLACEMENT TIME | MAXIMUM TACT | PLACEMENT TIME | MAXIMUM TACT | PLACEMENT TIME | |
| A | 0.1 | 2.0 | 0.2 | 4.0 | 0.4 | 8.0 | 20 |
| B | 0.15 | 3.0 | 0.3 | 6.0 | 0.6 | 12.0 | 20 |
| C | 0.15 | 1.5 | 0.3 | 3.0 | 0.6 | 6.0 | 10 |
| D | 0.2 | 2.0 | 0.4 | 4.0 | 0.8 | 8.0 | 10 |
| E | 0.4 | 2.0 | 0.8 | 4.0 | 1.6 | 8.0 | 5 |
| F | 0.4 | 1.6 | 0.8 | 3.2 | 1.6 | 6.4 | 4 |
| G | 0.5 | 1.5 | 1.0 | 3.0 | 2.0 | 6.0 | 3 |
| H | 0.5 | 1.0 | 1.0 | 2.0 | 2.0 | 4.0 | 2 |
| I | 1.0 | 2.0 | 2.0 | 4.0 | 4.0 | 8.0 | 2 |
| J | ∞ | — | ∞ | — | 6.0 | 6.0 | 1 |
| K | ∞ | — | ∞ | — | 6.0 | 6.0 | 1 |

FIG.10

COMPONENT PLACEMENT TABLE

| PLACEMENT APPARATUS NAME | M/C1 | M/C2 | M/C3 |
|---|---|---|---|
| TOTAL PLACEMENT TIME | 0 | 0 | 12.0 |
| COMPONENT NAME, PLACEMENT TIME | | | J, 6.0<br>K, 6.0 |

FIG.11

COMPONENT PLACEMENT TABLE

| PLACEMENT APPARATUS NAME | M/C1 | M/C2 | M/C3 |
|---|---|---|---|
| TOTAL PLACEMENT TIME | 2.0 | 0.0 | 12.0 |
| COMPONENT NAME, PLACEMENT TIME | A, 2.0 | | |

FIG.12

COMPONENT PLACEMENT TABLE

| PLACEMENT APPARATUS NAME | M/C1 | M/C2 | M/C3 |
|---|---|---|---|
| TOTAL PLACEMENT TIME | 2.0 | 6.0 | 12.0 |
| COMPONENT NAME, PLACEMENT TIME | A, 2.0 | B, 6.0 | J, 6.0 |
| | | | K, 6.0 |

FIG.13

COMPONENT PLACEMENT TABLE

| PLACEMENT APPARATUS NAME | M/C1 | M/C2 | M/C3 |
|---|---|---|---|
| TOTAL PLACEMENT TIME | 10.0 | 13.2 | 12.0 |
| COMPONENT NAME, PLACEMENT TIME | A, 2.0 | B, 6.0 | J, 6.0 |
| | C, 1.5 | F, 3.2 | K, 6.0 |
| | D, 2.0 | I, 4.0 | |
| | E, 2.0 | | |
| | G, 1.5 | | |
| | H, 1.0 | | |
| | | | |

FIG.14

TACT TABLE

| COMPONENT NAME | M/C1 | | M/C2 | | M/C3 | | COMPONENT COUNT |
|---|---|---|---|---|---|---|---|
| | MAXIMUM TACT | PLACEMENT TIME | MAXIMUM TACT | PLACEMENT TIME | MAXIMUM TACT | PLACEMENT TIME | |
| A | 0.1 | 4.8 | 0.2 | 4.0 | 0.4 | 8.0 | 20 |
| B | 0.15 | 3.0 | 0.3 | 1.5 | 0.6 | 12.0 | 20 |
| C | 0.15 | 2.4 | 0.3 | 3.0 | 0.6 | 6.0 | 10 |
| D | 0.2 | 2.4 | 0.4 | 4.0 | 0.8 | 8.0 | 10 |
| E | 0.4 | 1.2 | 0.8 | 4.0 | 1.6 | 8.0 | 5 |
| F | 0.4 | 1.6 | 0.8 | 2.3 | 1.6 | 6.4 | 4 |
| G | 0.5 | 0.72 | 1.0 | 3.0 | 2.0 | 6.0 | 3 |
| H | 0.5 | 0.48 | 1.0 | 2.0 | 2.0 | 4.0 | 2 |
| I | 1.0 | 2.0 | 2.0 | 1.2 | 4.0 | 8.0 | 2 |
| J | ∞ | — | ∞ | — | 6.0 | 9.0 | 1 |
| K | ∞ | — | ∞ | — | 6.0 | 9.0 | 1 |

FIG.21

COMPONENT NAME LIST

| COMPONENT NAME INFORMATION ||||||
|---|---|---|---|---|---|
| COMPONENT NAME | COMPONENT THICKNESS | XY SPEED | SHAPE CODE | NOZZLE | CAMERA |
| A | 0.3 | 1 | 0603R | SX | 2DS |
| B | 0.35 | 2 | 0603C | SX | 2DS |
| C | 0.4 | 1 | 1005R | SA | 2DS |
| D | 0.4 | 1 | 1005C | SA | 2DS |
| E | 0.5 | 2 | 1608R | S | 2DS |
| F | 0.5 | 2 | 1608C | S | 2DS |
| ⋮ | ⋮ | ⋮ | ⋮ | ⋮ | ⋮ |

FIG.22

COMPONENT PLACEMENT TABLE

| PLACEMENT APPARATUS NAME | MSR1 | MSR2 |
|---|---|---|
| COMPONENT NAME | A | C |
| | B | D |
| | | E |
| | | F |
| | | |

FIG.23

COMPONENT NAME LIST

| COMPONENT NAME INFORMATION ||||||
|---|---|---|---|---|---|
| COMPONENT NAME | COMPONENT THICKNESS | XY SPEED | SHAPE CODE | NOZZLE | CAMERA |
| A | 0.3 | 1 | 0603R | SX | 2DS |
| B | 0.35 | 2 | 0603C | SX | 2DS |
| C | 0.4 | 2 | 1005R | SA | 2DS |
| D | 0.4 | 2 | 1005C | SA | 2DS |
| E | 0.5 | 2 | 1608R | S | 2DS |
| F | 0.5 | 2 | 1608C | S | 2DS |
| ⋮ | ⋮ | ⋮ | ⋮ | ⋮ | ⋮ |

FIG.26
MOVEMENT TACT TABLE

| COMPONENT NAME | XY MOVEMENT AMOUNT | XY MOVEMENT TACT (a) | Z MOVEMENT AMOUNT | Z MOVEMENT TACT (b) | RETURN TACT (c) | TOTAL MOVEMENT TACT Max{(a),(b)+(c)×2)} |
|---|---|---|---|---|---|---|
| A | 10 | 0.1 | 0 | 0 | 0 | 0.1 |
| A | 20 | 0.2 | 0 | 0 | 0 | 0.2 |
| A | 30 | 0.3 | 0 | 0 | 0 | 0.3 |
| B | 10 | 0.1 | 1 | 0.2 | 0.1 | 0.4 |
| B | 20 | 0.2 | 1 | 0.2 | 0.1 | 0.4 |
| C | 10 | 0.1 | 2 | 0.3 | 0.2 | 0.7 |
| D | 5 | 0.1 | 3 | 0.4 | 0.3 | 1.0 |
| E | 20 | 0.2 | 4 | 0.5 | 0.4 | 1.3 |

FIG.33

COMPONENT NAME LIST

| COMPONENT NAME INFORMATION |||
|---|---|---|
| COMPONENT NAME | COMPONENT COUNT | . . . |
| A | 10 | . . . |
| B | 5 | . . . |
| C | 4 | . . . |
| D | 3 | . . . |
| E | 2 | . . . |
| ⋮ | ⋮ | ⋮ |

FIG.35

Z AXIS LIST

| Z AXIS INFORMATION ||
|---|---|
| COMPONENT NAME | Z COORDINATE VALUE |
| A | 100 |
| B | 80 |
| C | 70 |
| D | 60 |
| E | 50 |
| ⋮ | ⋮ |

FIG.36

COMPONENT NAME LIST

| COMPONENT NAME INFORMATION ||||
|---|---|---|---|
| COMPONENT NAME | · · · | NOZZLE | · · · |
| A | · · · | S | · · · |
| C | · · · | S | · · · |
| B | · · · | M | · · · |
| E | · · · | M | · · · |
| D | · · · | L | · · · |
| ⋮ | ⋮ | ⋮ | ⋮ |

GROUP 1: A, C
GROUP 2: B, E
GROUP 3: D

FIG.37

TASK LIST

| TASK NUMBER | 1 |
|---|---|

| COMPONENT NAME | PLACEMENT ORDER | COMPONENT NUMBER | TASK INFORMATION ||||
|---|---|---|---|---|---|---|
| | | | X COORDINATE VALUE | Y COORDINATE VALUE | Z COORDINATE VALUE | |
| 1 | A | 1 | | | | |
| 2 | A | 2 | | | | |
| 3 | A | 3 | | | | |
| ... | ... | ... | | | | |
| 10 | A | 10 | | | | |

FIG.38

FINAL PLACEMENT POINT LIST

| FINAL PLACEMENT POINT INFORMATION ||
|---|---|
| TASK NUMBER | FINAL PLACEMENT POINT X COORDINATE VALUE |
| 1 | 100 |
| 2 | 10 |
| 3 | 50 |
| 4 | 120 |

FIG.39

MAXIMUM Z COORDINATE LIST

| MAXIMUM Z COORDINATE INFORMATION ||
|---|---|
| TASK NUMBER | MAXIMUM Z COORDINATE |
| 4 | 100 |
| 6 | 80 |
| 7 | 70 |
| 1 | 60 |
| ⋮ | ⋮ |

FIG.40

TASK PAIR LIST

| TASK PAIR INFORMATION | | |
|---|---|---|
| VARIABLE a | FORMER TASK NUMBER | LATTER TASK NUMBER |
| 1 | 10 | 5 |
| 2 | 4 | 7 |
| 3 | 6 | 21 |
| ⋮ | ⋮ | ⋮ |

FIG.41

PLACEMENT ORDER LIST

| PLACEMENT ORDER INFORMATION ||
|---|---|
| PLACEMENT ORDER | TASK NUMBER |
| 1 | |
| 2 | |
| 3 | |
| 4 | |
| 5 | |
| ⋮ | |

FIG.42
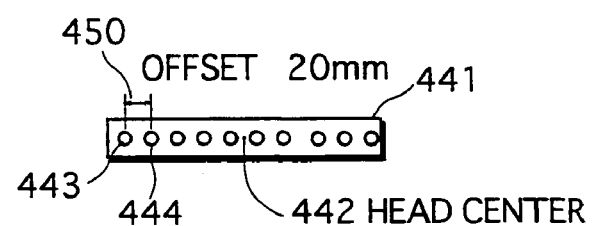
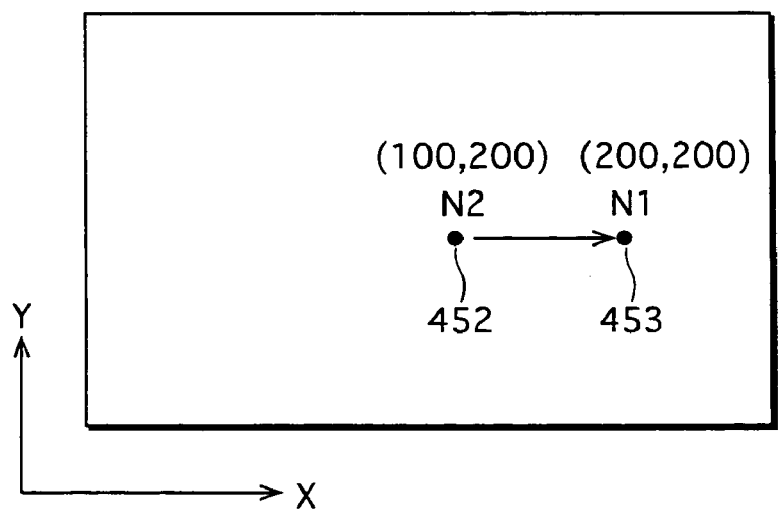

FIG.53

PLANE LIST

| COMPONENT PLANE INFORMATION | | | |
|---|---|---|---|
| COMPONENT NAME | XY SPEED | COMPONENT COUNT | · · · |
| A | SP1 | 5 | · · · |
| B | SP1 | 4 | · · · |
| C | SP1 | 3 | · · · |
| D | SP2 | 5 | · · · |
| E | SP2 | 3 | · · · |

GROUP SP1 (rows A, B, C)

GROUP SP2 (rows D, E)

FIG.54

EXIT CANDIDATE LIST

| ORIGINAL COMPONENT PLANE \ NEXT COMPONENT PLANE | A | B | C | D | E | TOTAL EXIT CANDIDATES |
|---|---|---|---|---|---|---|
| A |  | 3 | 2 | 0 | 0 | 5 |
| B | 3 |  | 1 | 0 | 0 | 4 |
| C | 1 | 2 |  | 0 | 0 | 3 |
| D | 0 | 0 | 0 |  | 0 | 0 |
| E | 0 | 0 | 0 | 0 |  | 0 |

METHOD FOR OPTIMIZING PLACEMENT ORDER BY PLACEMENT APPARATUSES THAT PLACE ELECTRONIC COMPONENTS ON CIRCUIT BOARD

TECHNICAL FIELD

The present invention relates to a technique for placing electronic components on a circuit board.

BACKGROUND ART

Various apparatuses and methods have been proposed for improving placement efficiency in placement apparatuses that place electronic components to circuit boards. (Japanese Laid-Open Patent Application No. 9-81603, Japanese Laid-Open Patent Application No. 10-209697, and Japanese Laid-Open Patent Application No. 10-2096829)

As high productivity in placement apparatuses is increasingly pursued, disparity between manufacturers is disappearing. Instead, productivity is greatly dependant on the degree to which waste can be eliminated in operation of equipment. In light of this, in addition to dividing components evenly between placement apparatuses and reducing waste between pieces of equipment, the importance of optimization software that ensures high productivity without waste in each individual apparatus has come to be recognized, and there are demands to perform placement of electronic components even more effectively.

DISCLOSURE OF THE INVENTION

In order to respond to these demands, the present invention has an object of providing an optimization apparatus, a optimization method, an optimization program, a recording medium on which an optimization program is stored, a placement apparatus, and an electronic component assembly system, for placing electronic components even more effectively.

In order to achieve the stated object, the present invention is an optimization apparatus that optimizes a placement order in which electronic components are placed on a circuit board by two or more placement apparatuses, wherein a first assignment of each type of electronic component to the placement apparatuses has been determined in advance, and a first placement time has been calculated in advance for each placement apparatus, each first placement time being a time required for the placement apparatus to place electronic components assigned thereto according to the first assignment on the circuit board, the optimization apparatus including: an assignment unit operable to select two of the placement apparatuses, select, for each of the two selected placement apparatuses, one type of electronic component that has been assigned to the placement apparatus, and determine a second assignment by swapping the two selected types of electronic components between the two placement apparatuses; a calculation unit operable to calculate, for each of the two placement apparatuses, a second placement time required for the placement apparatus to place on the circuit board the electronic components assigned thereto according to the second assignment; and an assignment adoption unit operable to adopt, by referring to the first placement time and the second placement time, one of the first assignment and the second assignment that has a smaller placement time.

Furthermore, in order to achieve the stated object, the present invention is an optimization apparatus in an electronic component placement system further including two or more placement apparatuses that place electronic components on a circuit board, the optimization apparatus optimizing a placement order in which the electronic components are placed on the circuit board by the placement apparatuses and including: a first assignment unit operable to assign each type of electronic component to one of the placement apparatuses, thereby determining a first assignment for each type of electronic component; a first calculation unit operable to calculate, for each placement apparatus, a first placement time required for the placement apparatus to place all electronic components assigned thereto according to the first assignments on the circuit board; a second assignment unit operable to select two placement apparatuses from the placement apparatuses, select, for each of the two selected placement apparatuses, one type of electronic component that has been assigned to the placement apparatus, and determine a second assignment by swapping the two selected types of electronic components between the two placement apparatuses; a second calculation unit operable to calculate, for each of the two placement apparatuses, a second placement time required for the placement apparatus to place all electronic components assigned thereto according to the second assignment on the circuit board; and an adoption determination unit operable to determine adoption of one of the first assignment and the second assignment that enables a shortest placement time, by comparing a greatest first placement time and a greatest second placement time from among the first placement times and the second placement times calculated for the two placement apparatuses selected for interchanging by the second assignment unit.

Here, the first assignment unit may include: a component count storage sub-unit operable to store, for each type of electric component, a component count of electronic components of the type; a placement time calculation sub-unit operable to calculate (i) for one electrical component of each type and for each placement apparatus, a reference placement time required for the placement apparatus to place the electrical component, and (ii) for each type of electrical component and for each placement apparatus, using the component count of the type, a placement time required for the placement apparatus to place all electronic components of the type on the circuit board; and an assignment determination sub-unit operable to determine, using the placement times calculated for each of the placement apparatuses for each type of electronic component, an assignment of electronic components of the type to one of the placement apparatuses.

Here, the second assignment unit may assign a type of electronic component, from among the types of electronic components, that can only be placed by a particular placement apparatus to the particular placement apparatus, the assignment being performed with priority over other types of electronic components.

Here, the second assignment unit may assign a type of electronic component that has, from among the placement times calculated for each placement apparatus and each type of electronic component, a placement time smaller than a predetermined value, to a placement apparatus that is upstream-most among placement apparatuses having a placement time smaller than a predetermined value, the assignment being performed with priority over other types of electronic components and other placement apparatuses.

Here, each of the first calculation unit and the second calculation unit may include: a component count storage sub-unit operable to store, for each electronic component type assigned to the placement apparatuses, a component count that indicates how many electronic components of the type are to be placed on the circuit board; a total time calculation sub-unit operable to calculate, for each placement apparatus, a total placement time indicating a total time for placing all electronic components assigned to the placement apparatus; and a placement time calculation sub-unit operable to calculate, for each placement apparatus and each type of electronic component, a placement time for all electronic components of the type assigned to the placement apparatus, by multiplying the calculated total placement time by the component count of the type of electronic component, and then dividing by a component count of all electronic components assigned to the placement apparatus, wherein the first calculation unit and the second calculation unit set the respective calculated placement times as the first placement times and the second placement times, respectively.

Here, each of the first calculation unit and the second calculation unit may include a request output sub-unit, tact calculation sub-units equal in number to the placement apparatuses, and a placement time reception sub-unit, the tact calculation sub-units corresponding respectively to the placement apparatuses, wherein the request generation sub-unit outputs to each placement apparatus, a type identifier identifying a type of electronic component, and a component count of electronic components assigned to the placement apparatus, each tact calculation sub-unit calculates, based on the output type identifier and component count, a time required for the corresponding placement apparatus to place the electronic components on the circuit board, and outputs the calculated placement time, the placement time reception sub-unit receives each placement time, and the first calculation unit and the second calculation unit set the respective received placement times as the first placement times.

Here, each of the first calculation unit and the second calculation unit may include a request output sub-unit and a placement time reception sub-unit, and each placement apparatus may include a tact calculation unit, wherein the request generation sub-unit outputs to each placement apparatus, a type identifier identifying a type of electronic component, and a component count of electronic components assigned to the placement apparatus, each tact calculation unit calculates, based on the output type identifier and component count, a time required for the placement apparatus to place the electronic components on the circuit board, and outputs the calculated placement time, the placement time reception sub-unit receives each placement time, and the first calculation unit and the second calculation unit set the respective received placement times as the first placement times.

Here, each of the first calculation unit and the second calculation unit may include a request output sub-unit, conversion sub-units, tact calculation sub-units, reverse conversion sub-units, and a placement time reception sub-unit, the conversion sub-units, the tact calculation sub-units and the reversion conversion sub-units being equal in number to and corresponding respectively to the placement apparatuses, wherein the request generation sub-unit outputs to each placement apparatus, a type identifier identifying a type of electronic component, and a component count of electronic components assigned to the placement apparatus, each conversion unit coverts the output type identifier and component count to a format compatible with the corresponding placement apparatus, each tact calculation sub-unit calculates, based on the converted type identifier and component count, a time required for the corresponding placement apparatus to place the electronic components on the circuit board, and outputs the calculated placement time, each reverse conversion sub-unit converts the output placement time to a format compatible with the optimization apparatus, the placement time reception sub-unit receives the converted placement times, and the first calculation unit and the second calculation unit set the respective received, converted placement times as the first placement times.

Here, the optimization apparatus may be for changing movement speed information relating to the circuit board when the electronic components are placed thereon, and may further include: a movement speed storage unit operable to store circuit board movement speed information for each type of electronic component; an assignment storage unit operable to store, for each type of electronic component, an assignment of the type of electronic component type to one of the placement apparatuses; a selection unit operable to select, from the plurality of placement apparatuses, two adjacent placement apparatuses; an extraction unit operable to extract slowest movement speed information having a slowest movement speed among electronic component types assigned to a placement apparatus that is located upstream-most of the two selected placement apparatuses; an extraction unit operable to extract movement speed information having a faster movement speed than the extracted slowest movement speed information from among electronic component types assigned to a placement apparatus that is located downstream-most of the two selected placement apparatuses; and a replacement unit operable to replace the extracted movement speed information with the slowest movement speed information, in the movement speed information storage unit.

Here, the optimization apparatus may be for optimizing an electronic component placement order used in a placement apparatus in which a feeder that supplies at least one electronic component of at least one type of electronic component moves to a suction position of a placement head, and the placement head picks up electronic components from the feeder and places the electronic components on a circuit board, the optimization apparatus further may include: a first selection unit operable to select one of the electronic components and set the electronic component as a first electronic component; a calculation unit operable to select electronic components other than the first electronic component one at a time, set the selected electronic component as a second electronic component, and calculate (a) a head movement time required for the placement head of the placement apparatus to move relatively from a position where the first electronic component is to be placed to a position where the second electronic component is to be placed, (b) a feeder movement time required for a feeder that supplies the second electronic component to move to the placement head suction position if the second electronic is to be placed, and (c) a return movement time required for a feeder that supplies the first electronic component to move to the placement head suction position after the second electronic component is placed; and a selection unit operable to select, based on the head movement times, feeder movement times and return movement times calculated for all electronic components other than the first electronic component, an electronic component from among all the electronic components, other than the first electronic component, that is to be placed next after the first electronic component.

Here, the optimization apparatus may be for optimizing an electronic component placement order used in a placement apparatus that places electronic components on a circuit board by repeatedly performing tasks until all electronic components to be placed have been placed, each task being composed of: a feeder that supplies at least one electric component of at least one type of electronic component moving to a suction position of a placement head that includes at least one nozzle, and the placement head picking up at least one electronic component from the feeder and placing the at least one picked up electronic component on a circuit board, the optimization apparatus may further include: an information storage unit operable to store task information for each task, each task information including (a) a placement order of electronic components in the task, (b) placement positions, each of which indicates where a different one of the electronic components is to be placed, and (c) a feeder position indicating a position of the feeder that supplies the electronic components; a first generation unit operable to generate an X coordinate list by rearranging the task information for all tasks so as to be in descending order of X coordinate of placement position of an electronic component last in the placement order in each task information; a second generation unit operable to generate a Z coordinate list by rearranging the task information so as to be in ascending order of a greatest feeder position in each task information; and an assignment unit operable to alternately select a task from a top of the X coordinate list and a top of the Z coordinate list in the stated order, and assign each task a position in the placement order according to an order in which the tasks were selected.

Here, the optimization apparatus may be for optimizing an electronic component placement order used in a placement apparatus in which a feeder that supplies at least one electronic component of at least one type of electronic component move to a suction position of a placement head, and the placement head picks up electronic components from the feeder and places the electronic components on a circuit board, the optimization apparatus may further include: a plane generation unit operable to generate, for each electronic component type, an imaginary component plane that includes positions in which electronic components of the type are to be placed, and arrange the generated component planes in a predetermined order; a rearrangement unit operable to rearrange the component planes; an optimum path generation unit operable to generate, within each component plane, an optimum path that connects the components on the component plane; and a 3D path generation unit operable to generate a 3D path that connects the component planes, by connecting the path within each component plane with the paths within other component planes.

Here, the first assignment unit may include: a component count storage sub-unit operable to store, for each type of electric component, a component count of the type of electric component; a placement time calculation sub-unit operable to calculate (a) one of (i) with respect to each type of electronic component and each placement apparatus, a reference placement time required for the placement apparatus to place one electronic component of the type on the circuit board, and (ii) with respect to each type of electronic component and each placement apparatus, a reference placement time required for the placement apparatus to perform a task to place one of the type of electronic component on the circuit board, the task being a series of operations from picking up the electronic component through to placing the electronic component, and (b) with respect to each type of electronic component and each placement apparatus and with use of the component count, a placement time required for the placement apparatus to place all electronic components of the type on the circuit board; and an assignment determination sub-unit operable, for each placement apparatus and for each type of electronic component, to assign, with use of the calculated placement times, the type of electronic component to one of the placement apparatuses.

Here, the first assignment unit may include: a component count storage sub-unit operable to store, for each type of electric component, a component count of the type of electric component; a placement time calculation sub-unit operable to calculate (a) one of (i) with respect to each type of electronic component and each placement apparatus, a reference placement time required for the placement apparatus to place one electronic component of the type on the circuit board, and (ii) with respect to each type of electronic component and each placement apparatus, a reference placement time required for the placement apparatus to perform a task to place one of the type of electronic component on the circuit board, the task being a series of operations from picking up the electronic component through to placing the electronic component, and (b) with respect to each type of electronic component and each placement apparatus and with use of a tool that simulates operations of placement equipment based on the component count of each type of electronic component, a placement time required for the placement apparatus to place all electronic components of the type on the circuit board; and an assignment determination sub-unit operable, for each placement apparatus and for each type of electronic component, to assign, with use of the calculated placement times, the type of electronic component to one of the placement apparatuses.

Here, the optimization apparatus may be for changing tact information relating to the circuit board when the electronic components are placed thereon, and may further include: a tact storage unit operable to store circuit board tact information for each type of electronic component; an assignment storage unit operable to store, for each type of electronic component, an assignment of the type of electronic component type to one of the placement apparatuses; a selection unit operable to select, from the plurality of placement apparatuses, two adjacent placement apparatuses; an extraction unit operable to extract slowest tact information having a slowest tact among electronic component types assigned to a placement apparatus that is located upstream-most of the two selected placement apparatuses; an extraction unit operable to extract tact information having a faster tact than the extracted slowest tact information from among electronic component types assigned to a placement apparatus that is located downstream-most of the two selected placement apparatuses; and a replacement unit operable to replace the extracted tact information with the slowest tact information, in the tact information storage unit.

Furthermore, the present invention is an electronic component placement system composed of at least one placement apparatus that places electronic components on a circuit board, including: the at least one placement apparatus, and the optimization apparatus, wherein the at least one placement apparatus places the electronic components to the circuit board in accordance with an assignment determined by the optimization apparatus.

Furthermore, the present invention is a placement apparatus the places electronic components on a circuit board, wherein the placement apparatus places the components on the circuit board in accordance with an assignment determined by the optimization apparatus.

Furthermore, the present invention is, in an electronic component placement system composed of at least one placement apparatus that places electronic components on a circuit board, an information generation apparatus for changing movement speed information relating to the circuit board when the electronic components are placed thereon, and including: a movement speed storage unit operable to store circuit board movement speed information for each type of electronic component; an assignment storage unit operable to store, for each type of electronic component, an assignment of the type of electronic component type to one of the placement apparatuses; a selection unit operable to select, from the plurality of placement apparatuses, two adjacent placement apparatuses; an extraction unit operable to extract slowest movement speed information having a slowest movement speed among electronic component types assigned to a placement apparatus that is located upstream-most of the two selected placement apparatuses; an extraction unit operable to extract movement speed information having a faster movement speed than the extracted slowest movement speed information from among electronic component types assigned to a placement apparatus that is located downstream-most of the two selected placement apparatuses; and a replacement unit operable to replace the extracted movement speed information with the slowest movement speed information, in the movement speed information storage unit.

Here, the optimization apparatus is for changing tact information relating to the circuit board when the electronic components are placed thereon, and further includes: a tact storage unit operable to store circuit board tact information for each type of electronic component; an assignment storage unit operable to store, for each type of electronic component, an assignment of the type of electronic component type to one of the placement apparatuses; a selection unit operable to select, from the plurality of placement apparatuses, two adjacent placement apparatuses; an extraction unit operable to extract slowest tact information having a slowest tact among electronic component types assigned to a placement apparatus that is located upstream-most of the two selected placement apparatuses; an extraction unit operable to extract tact information having a faster tact than the extracted slowest tact information from among electronic component types assigned to a placement apparatus that is located downstream-most of the two selected placement apparatuses; and a replacement unit operable to replace the extracted tact information with the slowest tact information, in the tact information storage unit.

Furthermore, the present invention is, in an electronic component placement system composed of at least one placement apparatus that places electronic components on a circuit board, an information generation apparatus for changing tact information relating to the circuit board when the electronic components are placed thereon, and includes: a tact storage unit operable to store circuit board tact information for each type of electronic component; an assignment storage unit operable to store, for each type of electronic component, an assignment of the type of electronic component type to one of the placement apparatuses; a selection unit operable to select, from the plurality of placement apparatuses, two adjacent placement apparatuses; an extraction unit operable to extract slowest tact information having a slowest tact among electronic component types assigned to a placement apparatus that is located upstream-most of the two selected placement apparatuses; an extraction unit operable to extract tact information having a faster tact than the extracted slowest tact information from among electronic component types assigned to a placement apparatus that is located downstream-most of the two selected placement apparatuses; and a replacement unit operable to replace the extracted tact information with the slowest tact information, in the tact information storage unit.

Furthermore, the present invention is a computer-readable recording medium storing thereon circuit board movement speed information relating to different types of electronic component, and storing thereon movement speed information that has been replaced by the information generation apparatus.

Furthermore, the present invention is an optimization apparatus for optimizing an electronic component placement order used in a placement apparatus in which a feeder that supplies at least one electronic component of at least one type of electronic component moves to a suction position of a placement head, and the placement head picks up electronic components from the feeder and places the electronic components on a circuit board, the optimization apparatus including: a first selection unit operable to select one of the electronic components and set the electronic component as a first electronic component; a calculation unit operable to select electronic components other than the first electronic component one at a time, set the selected electronic component as a second electronic component, and calculate (a) a head movement time required for the placement head of the placement apparatus to move relatively from a position where the first electronic component is to be placed to a position where the second electronic component is to be placed, (b) a feeder movement time required for a feeder that supplies the second electronic component to move to the placement head suction position if the second electronic is to be placed, and (c) a return movement time required for a feeder that supplies the first electronic component to move to the placement head suction position after the second electronic component is placed; and a selection unit operable to select, based on the head movement times, feeder movement times and return movement times calculated for all electronic components other than the first electronic component, an electronic component from among all the electronic components, other than the first electronic component, that is to be placed next after the first electronic component.

Here, the selection unit includes an operation sub-unit operable, for each electronic component other than the first electronic component, to calculate a value that is a total of (a) twice the return time and (b) the feeder movement time, and adopt the greater of the calculated head movement time and the calculated value; and an electronic component selection sub-unit operable to select, as a next electronic component to be placed after the first electronic component, an electronic component corresponding to a smallest value among all the values adopted by the operation sub-unit for the electronic components other than the first electronic component.

Here, the placement apparatus includes a rotary placement head, and the selection unit selects one electronic component based on the calculated head movement times, feeder movement times, return movement times, and a rotary placement head half-rotation time.

Furthermore, the present invention is an optimization apparatus for optimizing an electronic component placement order used in a placement apparatus that places electronic components on a circuit board by repeatedly performing tasks until all electronic components to be placed have been placed, each task being composed of: a feeder that supplies at least one electric component of at least one type of electronic component moving to a suction position of a placement head that includes at least one nozzle, and the placement head picking up at least one electronic component from the feeder and placing the at least one picked up electronic component on a circuit board, the optimization apparatus including: a task information storage unit operable to store task information for each task, each task information including (a) a placement order of electronic components in the task, (b) placement positions, each of which indicates where a different one of the electronic components is to be placed, and (c) a feeder position indicating a position of the feeder that supplies the electronic components; a first generation unit operable to generate an X coordinate list by rearranging the task information for all tasks so as to be in descending order of X coordinate of placement position of an electronic component last in the placement order in each task information; a second generation unit operable to generate a Z coordinate list by rearranging the task information so as to be in ascending order of a greatest feeder position in each task information; and an assignment unit operable to alternately select a task from a top of the X coordinate list and a top of the Z coordinate list in the stated order, and assign each task a position in the placement order according to an order in which the tasks were selected.

Here, the optimization apparatus further includes: a calculation unit operable to calculates a first total movement amount that indicates a distance that the head moves if all tasks are executed in the placement order assigned by the assignment unit; a task selection unit operable to select two tasks; an interchange unit operable to swap the two selected tasks with each other in the placement order; a calculation unit operable to calculate a second total movement amount that indicates a distance that the head moves if all tasks are executed in the placement order in which the interchange unit has interchanged the two tasks; and an adoption sub-unit operable to adopt a placement order of all tasks that corresponds to a smaller of the first total movement amount and the second total movement amount.

Furthermore, the present invention is an optimization apparatus for optimizing an electronic component placement order used in a placement apparatus in which a feeder that supplies at least one electronic component of at least one type of electronic component move to a suction position of a placement head, and the placement head picks up electronic components from the feeder and places the electronic components on a circuit board, the optimization apparatus including: a plane generation unit operable to generate, for each electronic component type, an imaginary component plane that includes positions in which electronic components of the type are to be placed, and arrange the generated component planes in a predetermined order; a rearrangement unit operable to rearrange the component planes; an optimum path generation unit operable to generate, within each component plane, an optimum path that connects the components on the component plane; and a 3D path generation unit operable to generate a 3D path that connects the component planes, by connecting the path within each component plane with the paths within other component planes.

Here, the rearrangement unit includes an extraction sub-unit operable to extract, for each component plane, an exit electronic component, the exit electronic component being an electronic component for which the placement head movement time from the exit component on an original component plane that is the component plane, to an electronic component on a next component plane that is another component plane, is within a feeder movement time; a calculation sub-unit operable to calculate, for each original component plane and each next component plane, an exit candidate count that is a total number of exit electronic components, and calculate, for each original component plane, an exit candidate total that is a total number of exit electronic components; a selection sub-unit operable to select an original component plane having a smallest exit candidate total and set the selected original component plane as a first component plane, and select a next component plane that has a greatest exit candidate count with respect to selected the first component plane, and set the selected next component plane as a second component plane; and a component plane interchange sub-unit operable to interchange the first component plane and the second component plane in a component plane order.

Here, the extraction unit sets a square-shaped area, each side of the square-shaped area being a length corresponding to a movement time of a feeder, and a center of the square-shaped area being a position where an exit electronic component is to be placed, and, if an electronic component on the next component plane falls within the set square area, judges that the placement head movement time is less than the feeder movement time.

BRIEF DESCRIPTION OF THE DRAWINGS

FIG. 5 shows an example of the data structure of a component table;

FIG. 6 shows an example of the data structure of a tact calculation correspondence table;

FIG. 7 shows an example of the data structure of a placement apparatus type table;

FIG. 8 shows an example of the data structure of a tact table;

FIG. 9 shows an example of a tact table to which a placement time has been written by an optimization unit 203;

FIG. 10 shows an example of the data structure of a component placement table;

FIG. 11 shows an example of the component placement table to which a group of a component name and a placement time has been written;

FIG. 12 shows an example of the component placement table to which a next group of a component name and a placement time has been written;

FIG. 13 shows an example of the component placement table when division of components by the optimization unit 203 has ended;

FIG. 14 shows an example of the tact table obtained by tact table calculation processing by the optimization unit 203;

FIG. 21 shows an example of the data structure of a component name list;

FIG. 22 shows an example of the data structure of the component placement table;

FIG. 23 shows an example of the component name list in which the XY speed has been replaced by the optimization unit 203;

FIG. 26 shows an example of the data structure of a movement tact table;

FIG. 33 is an example showing the data structure of the component name list;

FIG. 35 is an example showing the data structure of the Z axis list;

FIG. 36 shows a component name list in which the component name information has been rearranged;

FIG. 37 is an example showing the data structure of a task list;

FIG. 38 is an example showing the data structure of a final placement point list;

FIG. 39 is an example showing the data structure of a maximum Z coordinate list;

FIG. 40 is an example showing the data structure of a task pair list;

FIG. 41 is an example showing the data structure of a placement order list;

FIG. 42 is a planar view showing the positional relationship between a circuit board 451 and a head 441;

FIG. 53 shows an example of the data structure of a plane list;

FIG. 54 shows an example of the data structure of an exit candidate list;

BEST MODE FOR CARRYING OUT THE INVENTION

The following describes embodiments of the present invention with use of the drawings.

1. First Embodiment

The following describes an assembly system 1 as a first embodiment of the present invention.

1.1 Structure of Assembly System 1

Figure 1:
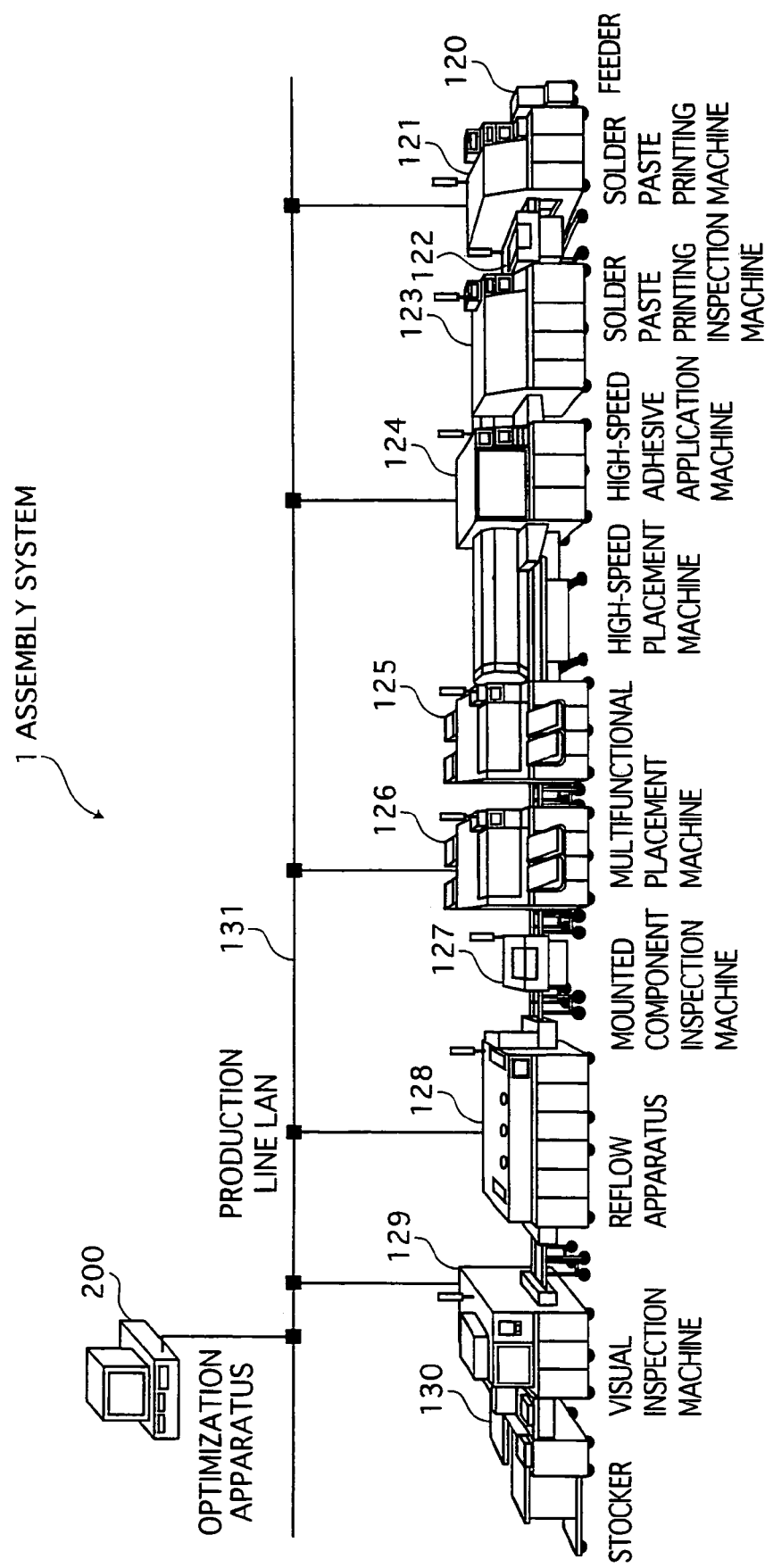
FIG. 1 is a block diagram showing the structure of an assembly system 1.

The assembly system 1, as shown in FIG. 1, is composed of an optimization apparatus 200, a production line LAN 131, a feeder 120, a cream solder printer 121, a cream solder print inspection machine 122, a high-speed adhesive application machine 123, a high-speed placement machine 124, multifunction placement machines 125 and 126, a mounted component inspection machine 127, a reflow apparatus 128, a visual inspection machine 129, and a storage apparatus 130. Note that the assembly system 1 is not limited to having this structure, and may have a structure that does not include all the stated production apparatuses. For example, the assembly system 1 may be without all the stated inspection machines, and may have a plurality of high-speed placement machines. Furthermore, the production apparatuses may be arranged in series in one line as stated, or to compose a plurality of lines in parallel. In addition, the production apparatuses are not limited to being arranged in the stated order.

The optimization apparatus 200, the feeder 120, the cream solder printer 121, the cream solder print inspection machine 122, the high-speed adhesive application machine 123, the high-speed placement machine 124, the multifunction placement machine 125, the multifunction placement machine 126, the mounted component inspection machine 127, the reflow apparatus 128, the visual inspection machine 129, and the storage apparatus 130 are connected via the production line LAN 131. Note that the means of connection is not limited to being a LAN. For example, the production apparatuses may be connected by RS232C. Alternatively, data may be stored on a floppy disk, and the floppy disk used to transfer the data instead of having the production apparatuses connected by a network.

The feeder 120, the cream solder printer 121, the cream solder print inspection machine 122, the high-speed adhesive application machine 123, the high-speed placement machine 124, the multifunction placement machine 125, the multifunction placement machine 126, the mounted component inspection machine 127, the reflow apparatus 128, the visual inspection machine 129, and the storage apparatus 130 are arranged in the stated order along a transfer line.

Each apparatus subjects the circuit board to a respective predetermined process, and transfers the processed circuit board to the apparatus that performs the next procedure. In this way, the circuit board is produced by being successively processed by each apparatus while being passed from an upstream procedure through to a downstream procedure. Here, upstream procedure refers to the procedure at the feeder 120 end of the transfer line, and down stream procedure refers to procedure at the storage unit 130 end of the transfer line.

1.2 Production Apparatuses

Initially, the feeder 120 keeps a stock of a plurality of circuit boards on which electronic components have not yet been mounted. Note however that it is possible for some components to have been mounted on these circuit boards by other lines. Note also that these circuit boards may include double-sided circuit boards on which electronic components are placed on both sides. The feeder 120 feeds one circuit board at a time to the cream solder printer 121.

The cream solder printer 121 receives one circuit board at a time from the feeder 120, prints cream solder on the received circuit board, and feeds the circuit board on which the cream solder has been printed to the cream solder print inspection machine 122.

The cream solder print inspection machine 122 receives one circuit board at a time from the cream solder printer 121, inspects the state of the cream solder printed on the received circuit board, and feeds the inspected circuit board to the high-speed adhesive application machine 123.

The high-speed adhesive application machine 123 receives one circuit board at a time from the cream solder print inspection machine 122, applies adhesive for placing electrical components and the like to the received circuit board, and feeds the circuit board on which the adhesive has been applied to the high-speed placement machine 124.

The high-speed placement machine 124 receives one circuit board at a time from the high-speed adhesive application machine 123, places electrical components on the received circuit board at high speed, and feeds the circuit board on which the electrical components have been placed to the multifunction placement machine 125.

Figure 2:
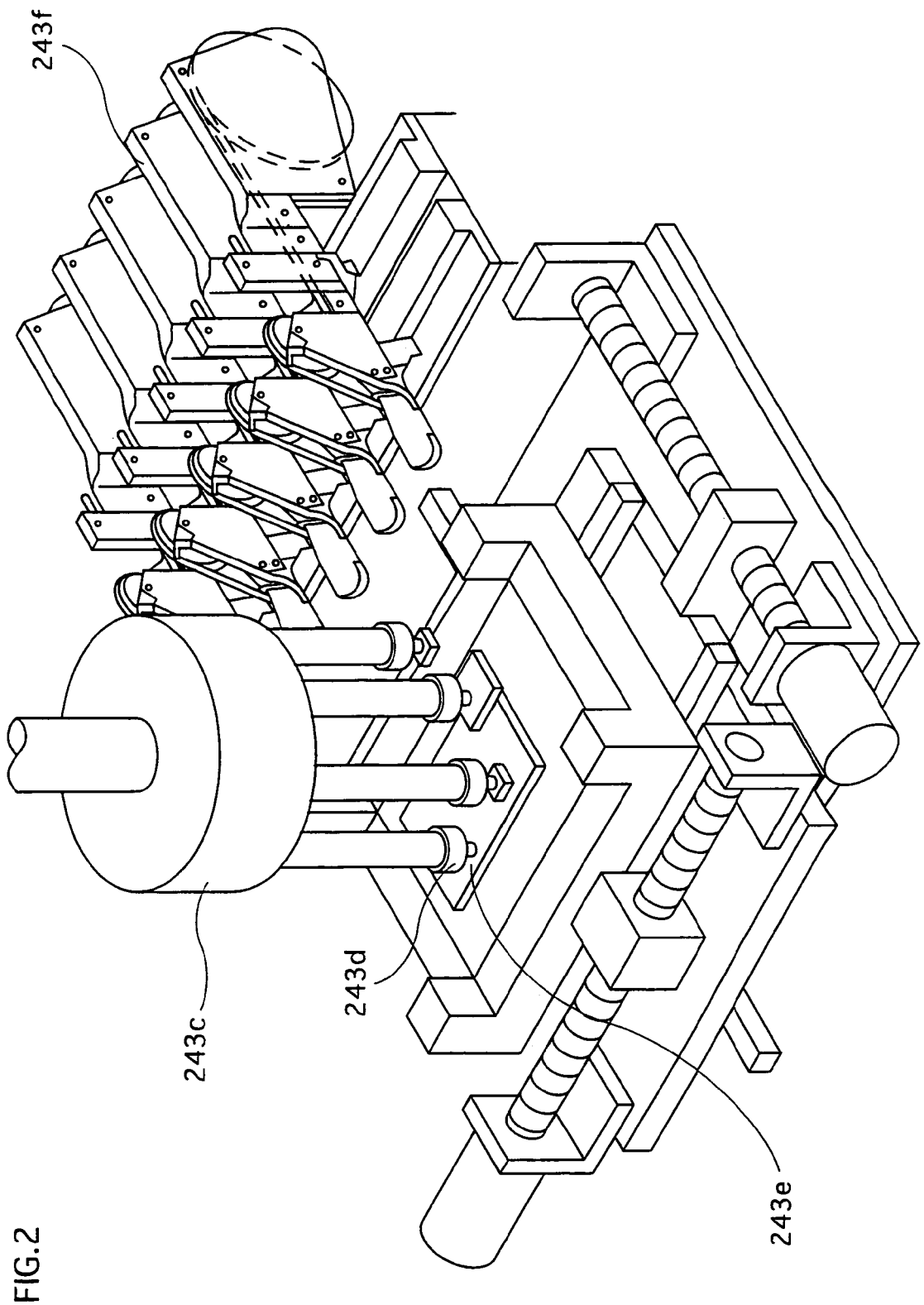
FIG. 2 is a perspective drawing showing the main compositional elements of a high-speed placement machine 124.

FIG. 2 shows the main compositional elements of the high-speed placement machine 124. Each of suction nozzles 243$d$ provided on respective bottom tips of a placement head 243$c$ picks up a component from a component feeder unit 243$f$ and performs component recognition. The placement head 243$c$ rotates to a predetermined position, and the suction nozzles 243$d$ place the components on respective predetermined positions on a circuit board 243$e$.

The high-speed placement machine 124 and the multifunction placement machine 125 are different types of placement machines that place electronic components to a circuit board. The high-speed placement machine 124 is for the purpose of placing a small number of types of electronic components on a circuit board at high speed, and the multifunction placement machine 125 is for placing a large number of types of electronic components having different shapes on a circuit board. The high-speed placement machine 124 and the multifunction placement machine 125 have a common function of placing electronic components on a circuit board.

The multifunction placement machine 125 receives one circuit board at a time from the high-speed placement machine 124, places components on the received circuit board, and feeds the circuit board on which the electronic components have been placed to the multifunction placement machine 126.

Figure 3B:
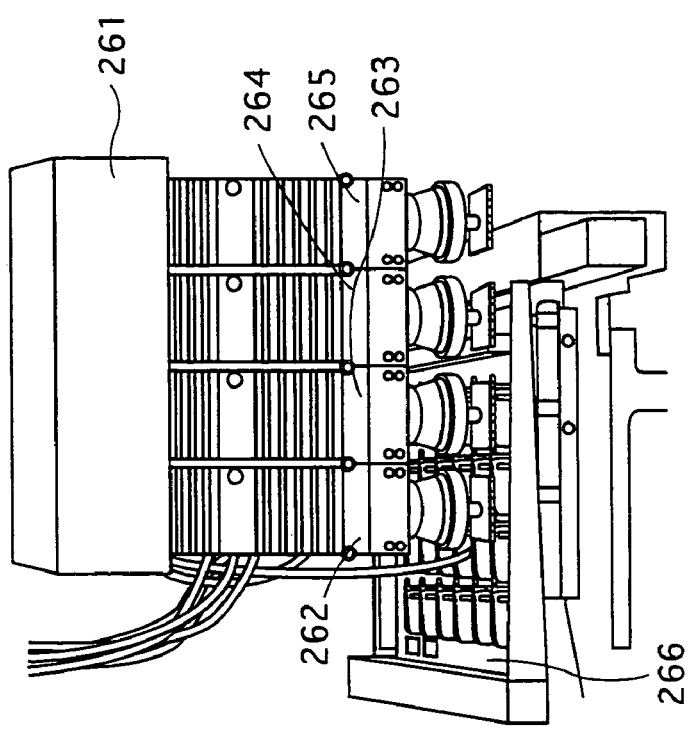
FIG. 3B is a perspective drawing of the main components of a multifunction placement machine 125, and shows electronic components being absorbed.
Figure 3A:
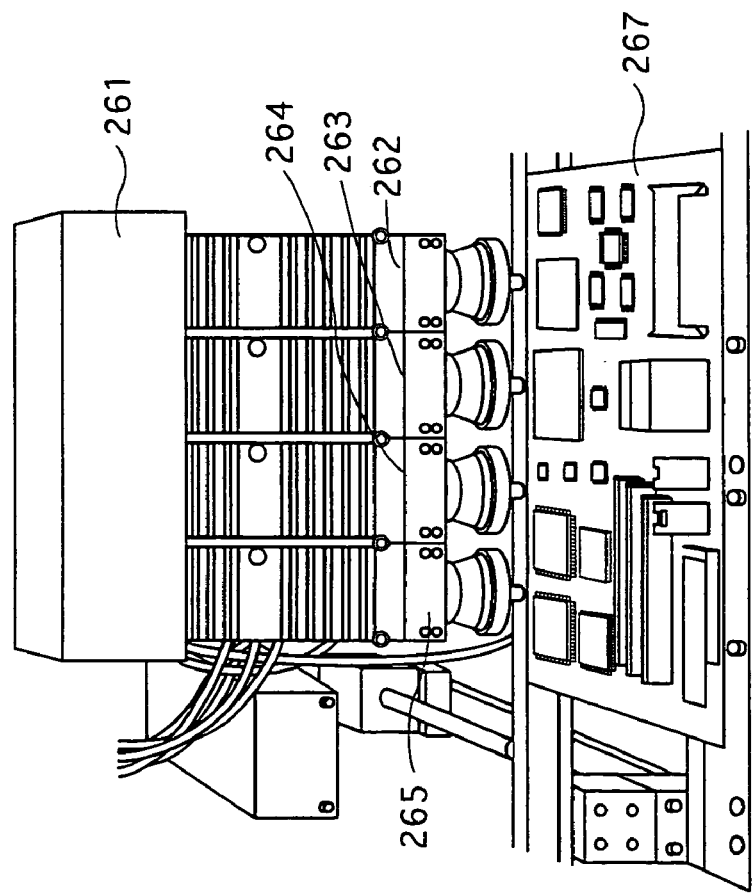
FIG. 3A is a perspective drawing of the main components of a multifunction placement machine 125, and shows electronic components being placed.

FIGS. 3A and 3B show the main compositional elements of the multifunction placement machine 125. Four suction nozzles 262 to 265 are provided on a lower side of a placement head 261. The suction nozzles 262 to 265 pick up components from a component feeder unit 266, and in the case of ordinary components, performs component recognition. Depending on check rules, there are cases in which component recognition is not performed when the component is component such as a connector. Next, the placement head 261 moves to a predetermined position, and the suction nozzles 262 to 265 place the components in respective predetermined positions on the circuit board 267.

The multifunction placement machine 126 is the same as the multifunction placement machine 125.

The mounted component inspection machine 127 receives one circuit board at a time from the multifunction placement machine 126, inspects for defects or misalignment of the electronic components on the received circuit board, and feeds the inspected circuit board to the reflow apparatus 128.

The reflow apparatus 128 receives one circuit board at a time from the mounted component inspection machine 127, melts the cream solder on the received circuit board, and feeds the circuit board on which the cream solder has been melted to the visual inspection machine 129.

The visual inspection machine 129 receives one circuit board at a time from the reflow apparatus 128, visually inspects the state of the soldering and the state of the components, and feeds the inspected circuit board to the storage apparatus 130.

The storage apparatus 130 receives one circuit board at a time at the end of the process from the visual inspection machine 129, and stores each received circuit board.

Note that the transfer line may have two transfer rails (called a dual lane), and two or four circuit boards may be simultaneously provided, transferred, and processed by each production apparatuses from the upstream procedure through to the downstream procedure. Furthermore, although the above description describes one circuit board being received at a time, two circuit boards may instead be transferred at a time.

1.3 Structure of the Optimization Apparatus 200

Figure 4:
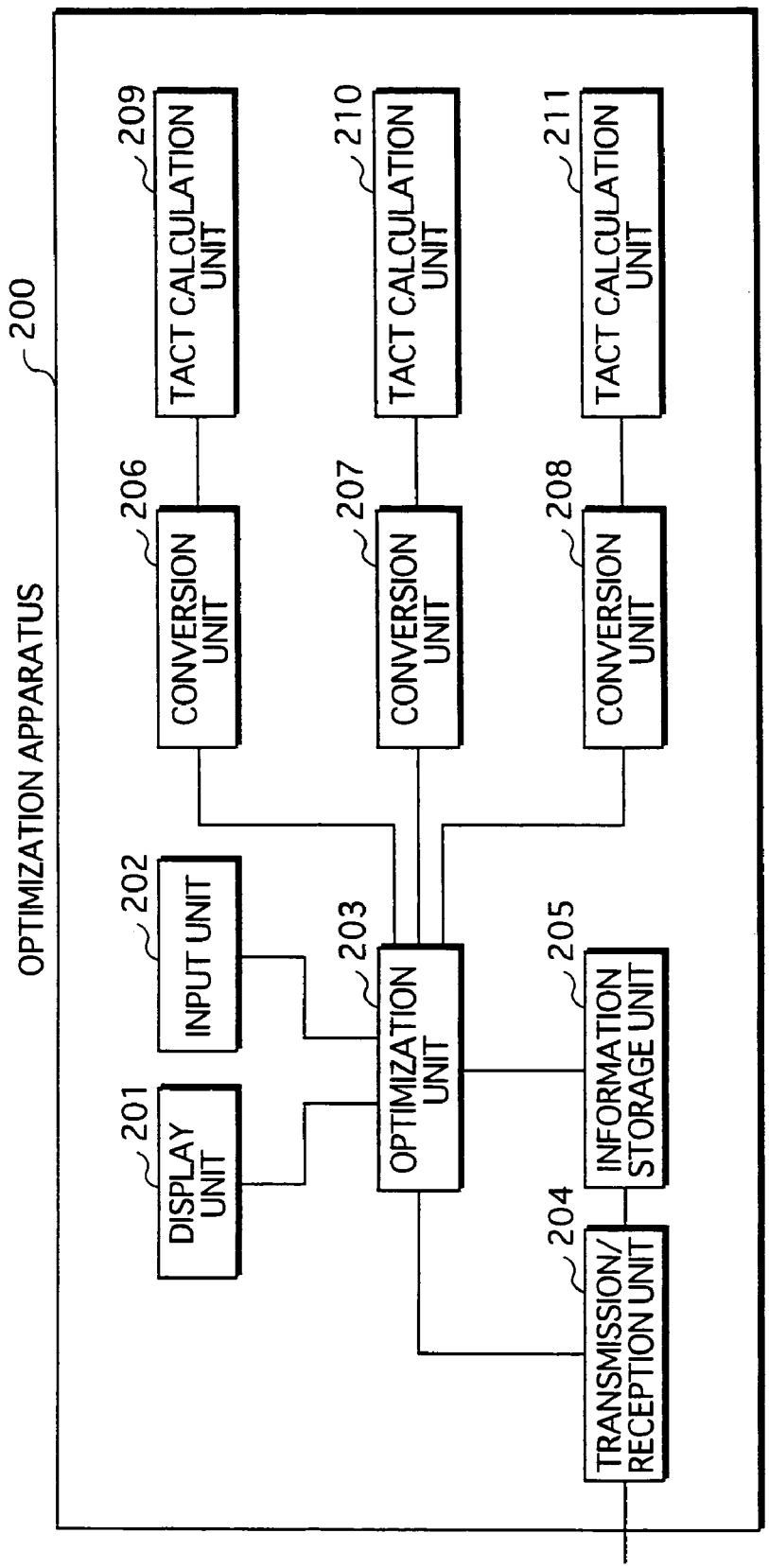
FIG. 4 is a block diagram showing the structure of an optimization apparatus 200.

The optimization apparatus 200, as shown in FIG. 4, is composed of a display unit 201, an input unit 202, an optimization unit 203, a transmission/reception unit 204, an information storage unit 205, conversion units 206 to 208, and tact calculation units 209 to 211.

Specifically, the optimization apparatus 200 is a computer system that includes a microprocessor that stores a computer program. The optimization apparatus 200 achieves its functions by the microprocessor operating according to the computer program.

(1) Information Storage Unit 205

The information storage unit 205 has a component table, a tact calculation unit correspondence table, a placement machine type table, a tact table, and a component placement table.

<Component Table>

As shown in FIG. 5, the component table is a data table that includes a plurality of pieces of component information, each of which includes a component name, a component number, an X coordinate value, a Y coordinate value, an angle θ, an XY speed, a camera, a nozzle, and a head speed.

The piece of component information corresponds to one component placed on the circuit substrate.

The component name identifies the type of a component. Here, type refers not only to components having differing shapes, such as a QFP, a connector, or a chip, but refers also to components having the same shape but different names for reasons such as having different resistance values. Such components are considered to be different types of components.

The component number is an identifier for uniquely identifying a component placed on the circuit board.

The X coordinate value and Y coordinate value indicates, respectively, the X coordinate value and Y coordinate value of the position of the component identified by the component number.

The angle θ indicates the angle formed between an X axis and a side surface of the component identified by the component number, if the component is rotated to be placed on the surface of the circuit board.

The XY speed indicates the speed at which the circuit board moves on an XY plane.

The camera indicates a type of camera provided in the placement apparatus.

The nozzle indicates a type of nozzle provided on the head.

The head speed indicates a speed at which a head of the placement apparatus moves on an XY plane.

<Tact Calculation Unit Correspondence Table>

The tact correspondence table, as shown in FIG. 6, is a data table having a plurality of pieces of correspondence information, each of which is composed of a placement apparatus name and a tact calculation unit name.

The placement apparatus name identifies a placement apparatus.

The tact calculation unit name identifies a tact calculation unit in the optimization apparatus 200. Each piece of correspondence information indicates an association between the placement apparatus identified by the placement apparatus name in the piece of correspondence information and the tact calculation unit identified by the tact calculation unit name in the piece of correspondence information.

<Placement Apparatus Type Table>

As shown in FIG. 7, the placement apparatus type table is a data table that has a plurality of pieces of placement apparatus information, each piece of which is composed of a placement apparatus name, a type and a head count.

The placement apparatus name identifies a placement apparatus.

The type is an identifier that identifies the type of placement apparatus.

The head count indicates the number of heads on the placement apparatus.

<Tact Table>

As shown in FIG. 8, the tact table is a data table that has areas for storing a plurality of pieces of component tact information, each piece of information being composed of a component name, a plurality of pieces of apparatus tact information, and a total.

Each piece of component tact information corresponds to a type of component placed on the circuit board.

The component name identifies a type of component.

The piece of apparatus tact information includes a maximum tact and a placement time.

The maximum tact is the shortest of possible times for picking up the component through to placing the component on the circuit board, and is written to the tact table in advance.

The placement time is the amount of time required for one task. A task denotes a sequence of component placing operations consisting of (a) the placement head moving to the component feeder and picking up electronic components, (b) the placement head moving at a set speed in a photographic range of the recognition camera, and the recognition camera performing recognition scanning for photographing all electronic components picked up by the placement head, and (c) the placement head placing the electronic components on the circuit board.

The component count indicates how many components identified by the component name are to be placed on the circuit board.

<Component Placement Table>

As shown in FIG. 10, the component placement table is a data table that has areas for storing a plurality of pieces of component placement information.

Each piece of component placement information includes a placement apparatus name, a total placement time, and at least one set of a component name and a placement time.

The placement apparatus name identifies a placement apparatus.

The component name indicates the name of a component placed by the placement apparatus identified by the placement apparatus name.

Furthermore, the placement time indicates the amount of time required to place the component.

When a piece of component placement information includes a plurality of sets of a component name and placement time, the sets are arranged in the piece of component placement information in a manner that indicates the order in which the components are placed.

The total placement time is a total value of each placement time in the pieces of component placement information.

(2) Optimization Unit 203

The optimization unit 203 provisionally calculates a tact table described later.

Next, the optimization unit 203 repeatedly performs component assignment processing described later and tact table calculation processing described later, a designated number of times.

The optimization unit 203 then repeatedly performs swap processing described later and tact table calculation processing described later, a designated number of times. Each repeat, the optimization unit 203 judges whether a line tact is less than a previously calculated line tact, and when the line tact is less than the previously calculated line tact, end the repeats.

<Tact Table Provisional Calculation>

The optimization unit 203 performs the following processing, for each placement apparatus.

1) The optimization unit 203 reads the placement apparatus name from the placement apparatus type table, and reads the type and head count corresponding to the read placement apparatus name from the placement apparatus type table.

2) Next, the optimization unit 203 reads the tact calculation unit name corresponding to the read placement apparatus name from the tact calculation unit correspondence table, and selects the tact calculation unit.

3) Next, the optimization unit 203 repeatedly performs the following processing for each component name placed on the circuit board.

3)-1 The optimization unit 203 reads the maximum tact and the component count corresponding to the placement apparatus and the component name from the tact table, reads the type and the head count corresponding to the placement apparatus from the placement apparatus type table, and outputs the component name, the maximum tact, the component count, the type, and the head count to conversion unit corresponding to the selected tact calculation unit.

3)-2 The optimization unit 203 receives the placement time from the tact calculation unit via the conversion unit, and writes the received placement time to the area for storing the placement time that corresponds to the component name and placement apparatus in the tact table.

FIG. 9 shows one example of the tact table to which placement times have been written by the optimization unit 203. The parts shown with white characters in FIG. 9 indicate placement times written according to the above-described processing.

<Component Assignment>

The optimization unit 203 assigns components that can only be placed by a particular placement apparatus to that placement apparatus, writes the component name and placement time to the component placement table, calculates a total placement time for the placement apparatus to which the components are assigned, and writes the total placement time to the component placement table.

FIG. 10 shows an example of the component placement table to which the optimization unit 203 has written component names of components that can only be placed by a particular placement apparatus, and the placement times therefor. The parts shown with white characters in FIG. 10 indicate placement times written according to the above-described processing.

Next, the optimization unit 203 repeats the following processing for remaining components that have not been assigned to a placement apparatus.

1) The optimization unit 203 selects the placement apparatus having the lowest total placement time.

2) The optimization unit 203 selects a remaining component that is at the top of the tact table.

3) The optimization unit 203 assigns the selected component to the selected placement apparatus, and writes the component name and placement time to the component placement table.

4) The optimization unit 203 calculates the total placement time of the placement apparatus to which the component has been assigned, and writes the total placement time to the component placement table.

FIG. 11 shows an example of the component placement table in FIG. 10 to which the optimization unit 203 has further written one set of a component name and a placement time. The part shown with white characters in FIG. 11 indicates the component name and the placement time written according to the above-described processing.

FIG. 12 shows an example of the component placement table in FIG. 11 to which the optimization unit 203 has further written the next set of a component name and a placement time. The part shown with white characters in FIG. 12 indicates the component name and the placement time written according to the above-described processing.

FIG. 13 shows an example of the component placement table when the optimization unit 203 has finished assigning components.

<Tact Table Calculation>

The optimization unit 203 performs the following processing for each placement apparatus.

1) The optimization unit 203 selects a tact calculation unit.

2) The optimization unit 203 obtains from the component table the X coordinate value, the Y coordinate value, the angle θ, the XY speed, the camera, the nozzle, and the head speed for all components assigned to the placement apparatus, and outputs the all obtained X coordinate values, Y coordinate values, angles E, XY speeds, cameras, nozzles, and head speeds to the conversion unit that corresponds to the selected tact calculation unit.

3) The optimization unit 203 receives the total placement time from the tact calculation unit via the conversion unit.

4) The optimization unit 203 performs the following processing for each component name to be placed on the circuit board.

4)-1 The optimization unit 203 calculates the tact using the following expression.

tact=(component count of the type)/(total number of components assigned to the placement apparatus)*(total placement time)

4)-2 The optimization unit 203 overwrites the area in the tact table that corresponds to the placement apparatus and the component, with the calculated tact.

FIG. 14 shows an example of the tact table obtained according to the optimization unit 203 performing the above-described tact table calculation processing. The parts shown with white characters in FIG. 14 indicate the placement times written according to the above-described processing.

<Swap Processing>

The optimization unit 203 selects, from the component placement table, a placement apparatus Px that has the greatest total placement time, and selects one component name Nx assigned to the selected placement apparatus Px. Next, the optimization unit 203 selects another placement apparatus Py, and selects one component name Ny assigned to the selected placement apparatus Py. The optimization unit 203 then writes the component name Nx and the component name Ny in place of each other in the component placement table.

(3) Conversion Units 206 to 208

The conversion unit 206 receives information from the optimization unit 203, converts the received information to a type that is compatible with the tact calculation unit 209, and outputs the converted information to the tact calculation unit 209.

Furthermore, the conversion unit 206 receives information from the tact calculation unit 209, converts the received information to a type that is compatible with the optimization unit 203, and outputs the converted information to the optimization unit 203.

The conversion unit 207 and 208 are the same as the conversion unit 206, and therefore are not described here.

(4) Tact Calculation Unit 209 to 211

The tact calculation unit 209 receives a component name, a maximum tact, a component count, a type and a head count from the optimization unit 203 via the conversion unit 206.

1) When the type is "rotary" or "1 by 1 robot", the tact calculation unit 209 calculates the placement time according to the following expression.

placement time=maximum tact of component indicated by received component name*received component count Here, the maximum tact of the component indicated by the received component name is stored in advance by the tact calculation unit 209, and is the tact by the placement apparatus corresponding to the tact calculation unit 209.

2) When the type is "simultaneous pick up", the tact calculation unit 209 calculates the placement time according to the following expression.

placement time=[component count/head count]*time per task

Here, the square brackets ([ ]) indicate a rounding operation. Furthermore, the time per task is stored in advance by the tact calculation unit 209, and is the tact of the placement apparatus corresponding to the tact calculation unit 209.

Furthermore, on receiving a plurality of component names, the tact calculation unit 209 calculates the placement time for each component name in the manner described above, totals the calculated placement times, and sets the total value as the placement time.

Next, the tact calculation unit 209 outputs the calculated placement time to the optimization unit 203 via the conversion unit 206.

The tact calculation units 210 and 211 are the same as the tact calculation unit 209, and therefore are not described here.

(5) Display Unit 201, Input Unit 202, and Transmission/Reception Unit 204

The input unit 202 receives input of an operation from the user. The display unit 201 displays information. The transmission/reception unit 204 transmits information optimized by the optimization unit 203 to the production apparatuses.

1.4 Operations by the Optimization Apparatus 200

The following describes operations by the optimization apparatus 200.

(1) Outline of Overall Operations by the Optimization apparatus 200

Figure 15:
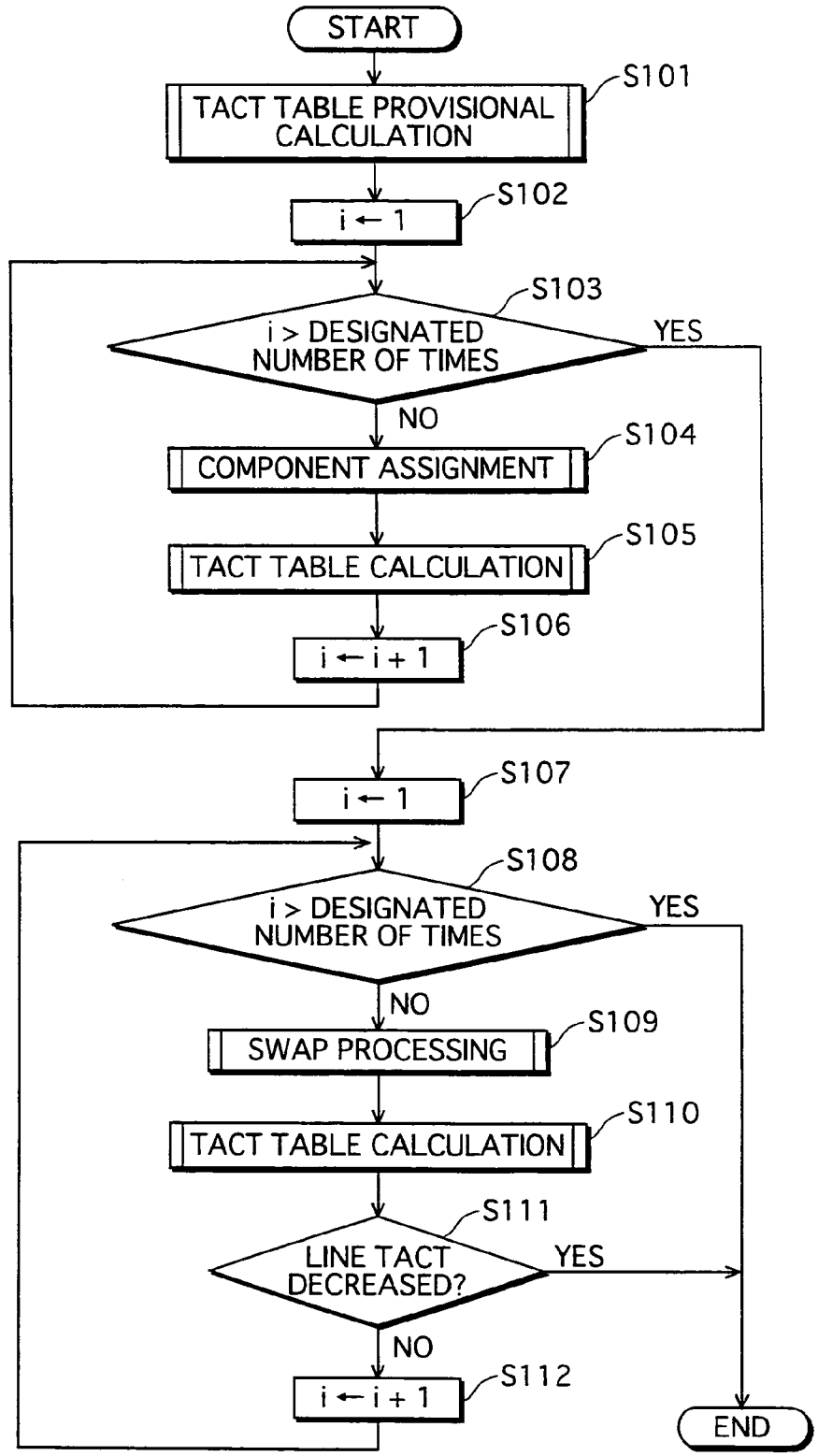
FIG. 15 is a flowchart showing an outline of operations performed by the optimization apparatus 200.

The following describes an outline of operations by the optimization apparatus 200, with use of the flowchart in FIG. 15.

The optimization unit 203 provisionally calculates the tact table (step S101).

Next, the optimization unit 203 sets a value 1 in a variable i (step S102), compares the variable i with the designated number of times, and when the variable i is equal to or less than the designated number of times (step S103), the optimization unit 203 performs component assignment (step S104), calculates the tact table (step S105), and adds a value 1 to the variable i (step S106). The optimization unit 203 then returns to step S103 and repeats the processing.

When the variable i is greater than the designated number of times (step S103), the optimization unit 203 sets a value 1 in the variable i (step S107), compares the variable i with the designated number of times, and when the variable i is equal to or less than the designated number of times (step S108), the optimization unit 203 performs swap processing (step S109), and calculates the tact table (step S110). Next, the optimization unit 203 judges whether or not the line tact has decreased, and when the line tact has decreased (step S111), ends the processing.

When the line tact is remains the same or has increased (step S111), the optimization unit 203 adds a value 1 to the variable i (step S112), and returns to step S108 and repeats the processing.

When the variable i is greater than the designated number of times (step S108), the optimization unit 203 ends the processing.

(2) Operations for Provisional Calculation of the Tact Table

Figure 16:
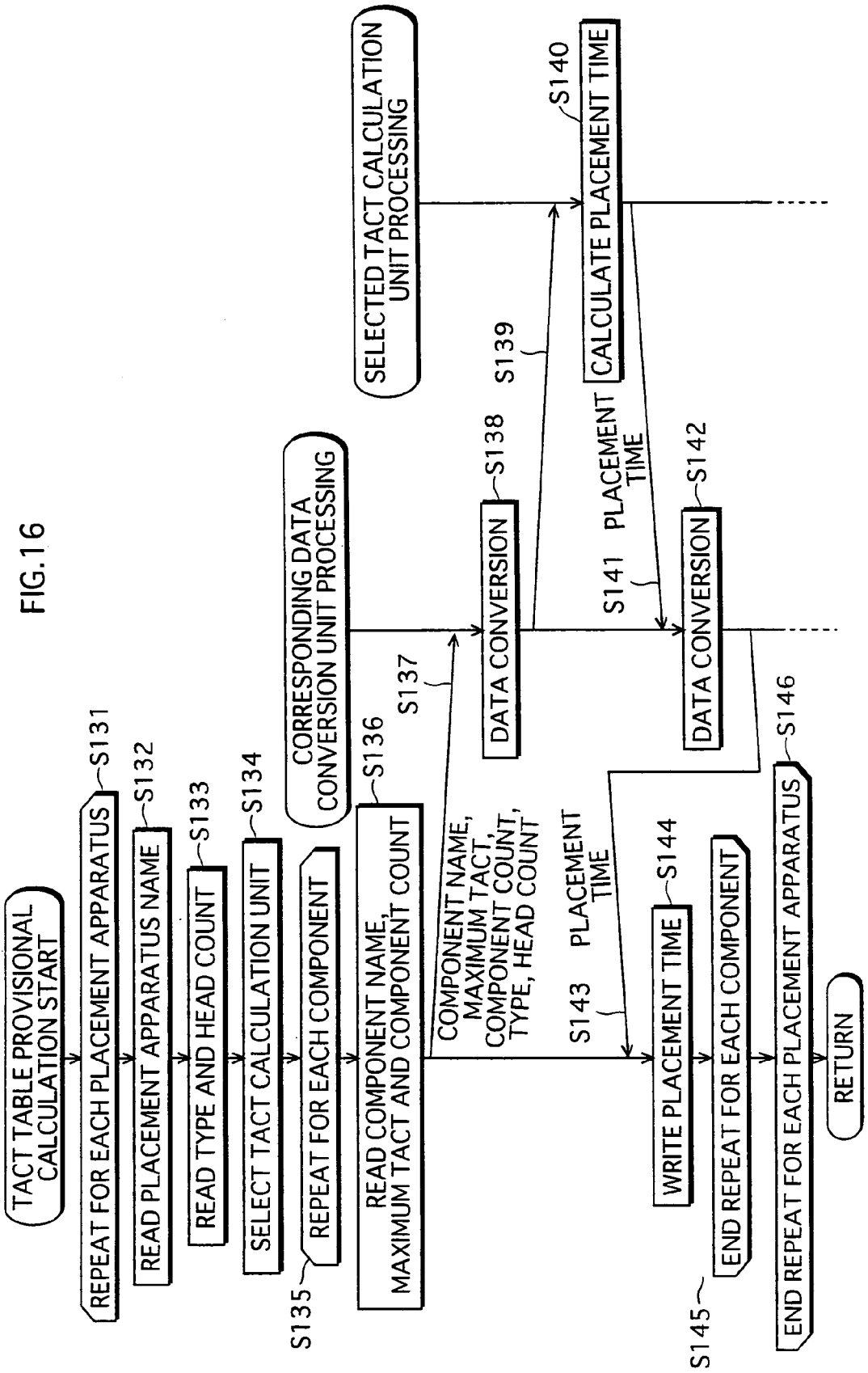
FIG. 16 is a flowchart showing operations for provisional calculation of the tact table.

The following describes operations for provisional calculation of the tact table, with use of the flowchart in FIG. 16. The operations for provisional calculation of the tact table described here are the details of step S101 of FIG. 15.

The optimization unit 203 repeats steps S131 to S146 for each placement apparatus.

The optimization unit 203 reads a placement apparatus name from the placement apparatus type table (step S132), and reads the type and head count corresponding to the read placement apparatus name, from the placement apparatus type table (step S133).

Next, the optimization unit 203 reads the tact calculation unit name corresponding to the read placement apparatus name, from the tact calculation unit correspondence table, and selects the tact calculation unit (step S134).

The optimization unit 203 then repeatedly performs steps S135 to S145 for each component name to be placed on the circuit board.

The optimization unit 203 reads the maximum tact and the component count corresponding to the placement apparatus and the component name, from the tact table, and reads the type and head number corresponding to the placement apparatus, from the placement apparatus type table (step S136). The optimization unit 203 then outputs the component name, the maximum tact, the component count, the type and the head count to the conversion unit corresponding to the selected tact calculation unit (step S137).

The conversion unit converts the received component name, maximum tact, component count, type, and head count, thereby generating a component name, a maximum tact, a component count, a type and a head count in a data type compatible with the selected tact calculation unit (step S138), and outputs the generated component name, maximum tact, component count, type, and head count to the selected tact calculation unit (step S139).

The selected tact calculation unit calculates the placement time based on the received component name maximum tact, component count, type, and head count (step S140), and outputs the calculated placement time to the conversion unit (step S141).

Next, the conversion unit converts the received placement time (step S142), and outputs the converted placement time to the optimization unit 203 (step S143).

The optimization unit 203 then writes the received placement time to the tact table, in an area for storing the placement time corresponding to the component name and the placement apparatus (step S144).

(3) Operations for Component Assignment

Figure 17:
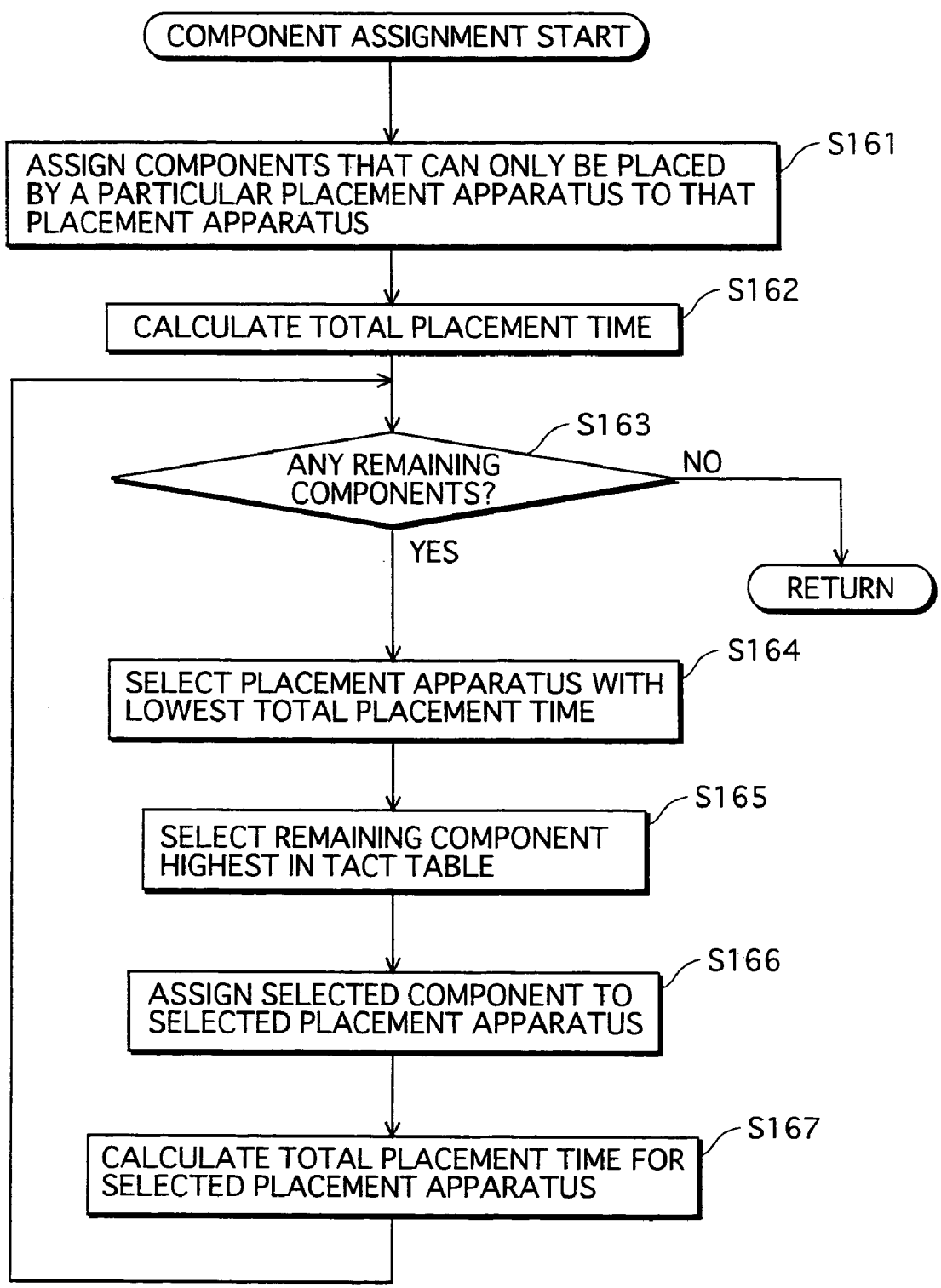
FIG. 17 is a flowchart showing operations for dividing components.

The following describes operations for assignment of components, with use of the flowchart in FIG. 17. The operations for component assignment described here are details of step S104 of FIG. 15.

The optimization unit 203 assigns any components that can only be placed by a particular placement apparatus to that placement apparatus, and writes the component names and the placement times to the component placement table (step S161). The optimization unit 203 calculates the total placement time of the placement apparatus to which the components have been assigned, and writes the total placement time to the component placement table (step S162).

Next, the optimization unit 203 judges whether or not any remaining components not yet assigned to any of the placement apparatuses exist, and if not (step S163), ends the processing.

If any remaining components not yet assigned to any of the placement apparatuses exist (step S163), the optimization unit 203 selects the placement apparatus having the shortest total placement time (step S164), selects one remaining component from the top of the tact table (step S165), assigns the selected component to the selected placement apparatus and writes the component name and the placement time to the component placement table (step S166). The optimization unit 203 then calculates the total placement time for the placement apparatus to which the component has been assigned, and writes the total placement time to the component placement table (step S167).

Next the optimization unit 203 returns to step S163 and repeats the processing.

(4) Operations for Tact Table Calculation

Figure 18:
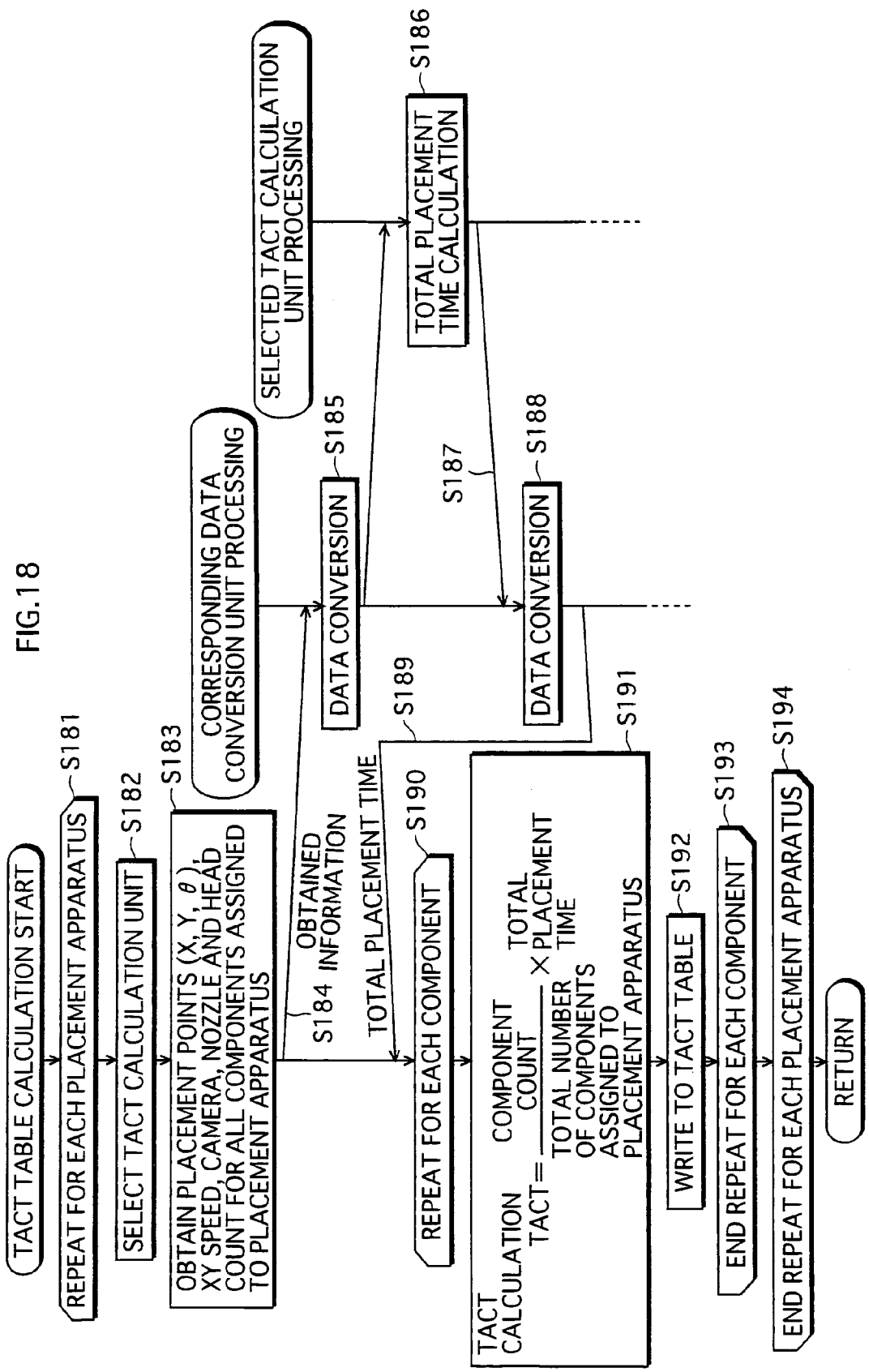
FIG. 18 is a flowchart showing operations for calculating the tact table.

The following describes operations for calculation the tact table, with use of the flowchart in FIG. 18. The operations for tact table calculation described here are details of step S105 and step S110 in FIG. 15.

The optimization unit 203 repeats steps S181 to S194 for each placement apparatus.

The optimization unit 203 selects a tact calculation unit (step S182), obtains, from the component table, the X coordinate value, the Y coordinate value, the angle θ, the XY speed, the camera, the nozzle, and the head speed of each component assigned to the placement apparatus (step S183), and outputs the obtained X coordinate values, Y coordinate values, angles θ, XY speeds, cameras, nozzles, and head speeds to the conversion unit corresponding to the selected tact calculation unit (step S184).

The corresponding conversion unit converts all the X coordinate values, Y coordinate values, angles θ, XY speeds, cameras, nozzles, and head speeds, and outputs the converted data to the tact calculation unit (step S185).

The selected tact calculation unit calculates a total placement time based on all the X coordinate values, Y coordinate values, angles θ, XY speeds, cameras, nozzles, and head speeds (step S186), and outputs the calculated total placement time to the conversion unit (step S187).

The conversion unit converts the total placement time (step S188), and outputs the converted total placement time to the optimization unit 203 (step S189).

Next, the optimization unit 203 repeatedly performs steps S190 to S193 for each component name place on the circuit board.

The optimization unit 203 calculates the tact according to the next expression.

tact=(component count of the type)/(total component count assigned to the placement apparatus)* (total placement time)    (step S191)

Next, the optimization unit 203 overwrites the area in the tact table for the placement time corresponding to the placement apparatus and component in the tact table, with the calculated tact (step S192).

(5) Operations for Swap Processing

Figure 19:
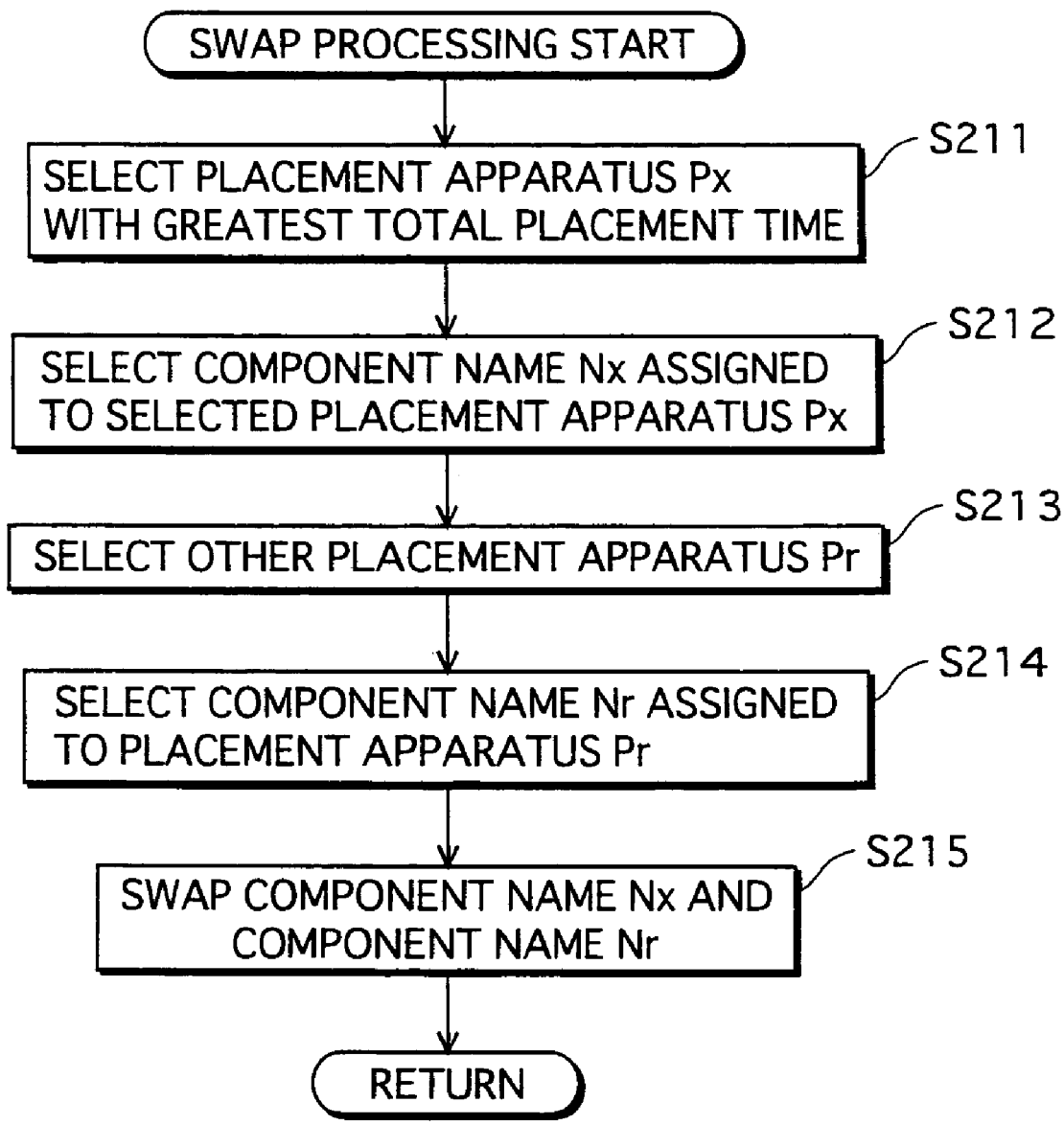
FIG. 19 is a flowchart showing operations for SWAP processing.

The following describes operations for swap processing, with use of the flowchart in FIG. 19. The operations for swap processing described here are details of step S109 in FIG. 15.

The optimization unit 203 selects, from the component placement table, a placement apparatus Px that has the greatest total placement time (step S211), selects one component name Nx assigned to the selected placement apparatus Px (step S212), selects another placement apparatus Py (step S213), and selects one component name Ny that is assigned to the selected placement apparatus Py (step S214).

Next, the optimization unit writes the component name Nx and the component name Ny in place of each other in the component placement table (step S215).

1.5 Conclusion

According to the technique disclosed in Japanese Laid-open Patent Application No. 10-209697, components are respectively assigned to a plurality of placement apparatuses using a placement tact that is either a reference placement tact pre-set for each component, or is a maximum placement tact. Therefore, there is a problem that when the placement apparatuses actually place the components, the total placement times will not necessarily be even between placement apparatuses.

On the other hand, as described, according to the first embodiment, components are respectively assigned to the placement apparatuses based on a tact calculated for all components assigned to each placement apparatus. Therefore, compared with the conventional technique, total placement time are likely to be more even between placement apparatuses when the placement apparatuses actually place the components.

1.6 Modifications

Figure 20:
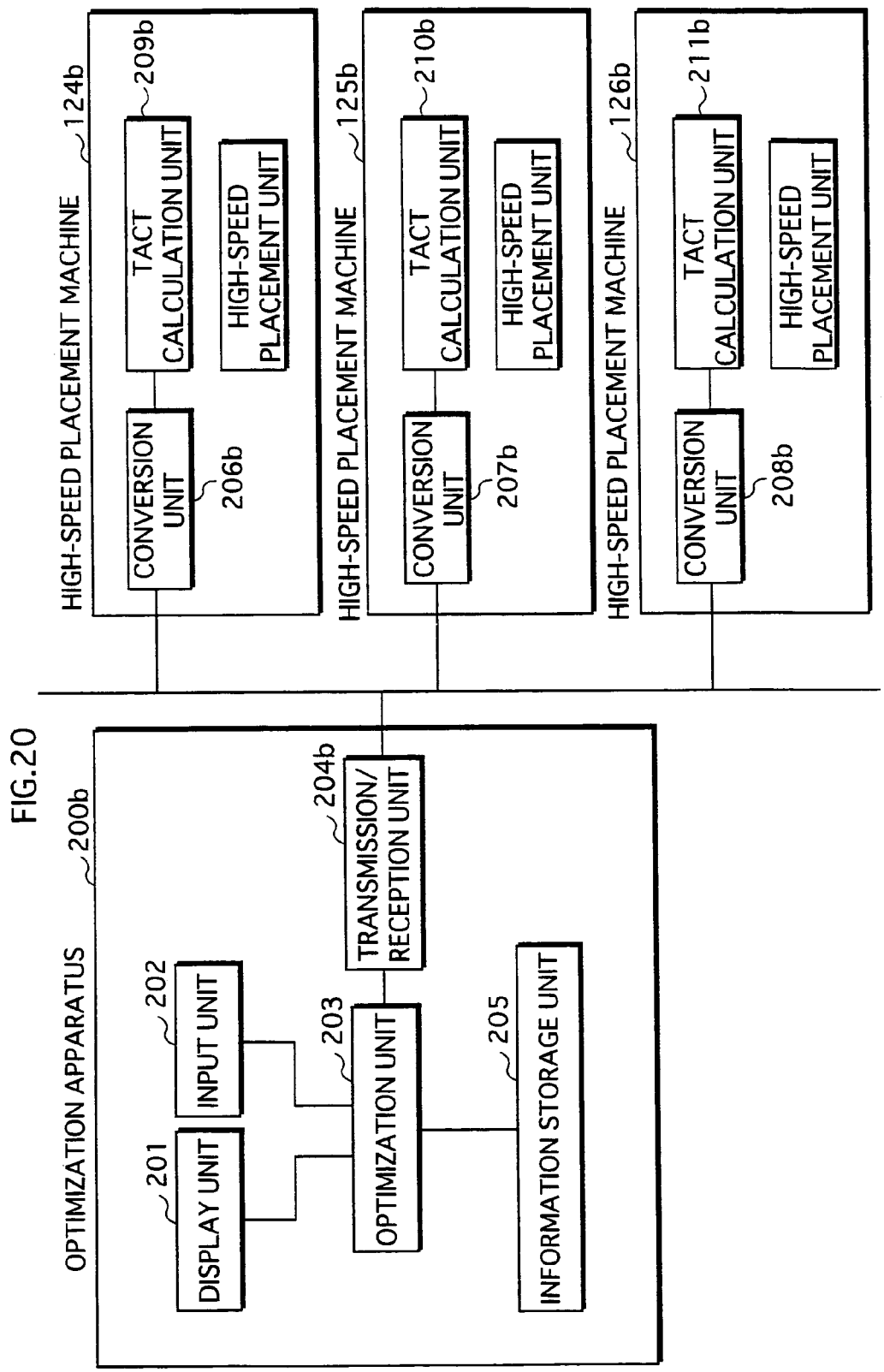
FIG. 20 is a block diagram showing the structure of an assembly system as a modification of the first embodiment.

As shown in FIG. 20 an assembly system that is one modification of the first embodiment is composed, similarly to the assembly system 1, of an optimization apparatus 200b, a high-speed placement machine 124b, a multifunction placement machine 125b, a multifunction placement machine 126b, and other production apparatuses (not illustrated).

The optimization apparatus 200b is composed of a display unit 201, an input unit 202, an optimization unit 203, a transmission/reception apparatus unit 204b, and an information storage unit 205.

The high-speed placement machine 124b is composed of a high-speed placement unit that places electronic components at high-speed, a conversion unit 206b, and a tact calculation unit 209b. The multifunction placement machine 125b is composed of a multifunction placement unit that performs multifunctional placing of electronic components, a conversion unit 207b, and a tact calculation unit 210b. The multifunction placement machine 126b is composed of a multifunction placement unit that performs multifunction placing of electronic components, a conversion unit 208b, and a tact calculation unit 211b.

In this modification, compositional elements having the same reference numbers as those in the first embodiment have the same structure as the compositional element in first embodiment.

The conversion units 206b, 207b, and 208b are identical in structure to the conversion units 206, 207, and 208 of the first embodiment. Furthermore, the tact calculation units 209b, 210b, and 211b are identical in structure to the tact calculation unit 209, 210, and 211 of the first embodiment.

The transmission/reception unit 204b performs transmission/reception between the optimization unit 203 and the conversion unit 206b, between the optimization unit 203 and the conversion unit 207b, and between the optimization unit 203 and the conversion unit 208b.

As described, in this modification the conversion unit 206 and the tact calculation unit 209 of the optimization apparatus 200 in the first embodiment have been moved to the high-speed placement machine 124, the conversion unit 207 and the tact calculation unit 210 have been moved to the multifunction placement machine 125, and the conversion unit 208 and the tact calculation unit 211 have been moved to the multifunction placement machine 126.

Furthermore, the optimization apparatus may perform the component assignment at step S104 in the following manner.

The optimization apparatus may assign electronic components to the placement apparatuses by using references placement times, each of which indicates the time required for one placement apparatus to place one component of one type component on the circuit board. Furthermore, the optimization apparatus may assign electronic components by using reference placement times, each indicating the time required for one placement apparatus to perform one task consisting of the series of operations from picking up through to placing one component of one type on the circuit board. Furthermore, these methods may be combined.

Furthermore, the optimization apparatus may find placement times, each of which indicating the time required for one placement apparatus to place all electronic components of a type. Such placement time are found by using reference placement times required for placing components on a circuit board, and a tool (computer program) that simulates operations of placing equipment based on the component count of each type. The optimization apparatus then assigns the electronic components to the placement apparatus with use of the found placement times.

2. Second Embodiment

The assembly system 1 of the second embodiment has the same structure of the assembly system 1 of the first embodiment.

The following focuses on describing the points that differ from the assembly system 1 of the first embodiment.

2.1 Structure of the Optimization Apparatus 200

(1) Information Storage Unit 205

The information storage unit 205 stores a component name list and a component placement table.

<Component Name List>

The component name list, as shown in FIG. 21, is a data table that includes a plurality of pieces of component information, each of which is composed of a component name, a component thickness, an XY speed, a shape code, a nozzle, and a camera.

The component thickness indicates the dimensions of the component in a height direction.

The shape code is an identifier for specifying the shape of the component.

The component name, the XY speed, the nozzle, and the camera are as described earlier, and therefore are not described here.

<Component Placement Table>

The component placement table, as shown in FIG. 22, includes an area for storing at least one component name for each placement apparatus.

The placement apparatus name and the component name are the same as described earlier, and therefore are not described here.

<Optimization Unit 203>

The optimization unit 203 rearranges the pieces of component information included in the component name list into ascending order of component thickness. An example of the component name list rearranged in ascending order of component thickness is shown in FIG. 21.

Next, the optimization unit 203 assigns the components to the placement apparatuses. Assignment of components to the placement apparatuses is as described earlier, and therefore is not described here. An example of the component placement table generated by the optimization unit 203 is shown in FIG. 22.

As shown in the figure, components identified by component names "A" and "B" are assigned to a placement apparatus identified by a placement apparatus name "MSR1", and components identified by component names "C", "D", "E" and "F" are assigned to a placement apparatus identified by a placement apparatus name "MSR2".

Next, the optimization unit 203 extracts all sets of previous process placement apparatuses and subsequent process placement apparatuses, and repeats the following processing for each extracted set. Here, the previous process placement apparatus is the placement apparatus directly upstream of the placement apparatus, and the subsequent placement apparatus is the placement apparatus directly downstream of the placement apparatus.

1) The optimization unit 203 extracts, from among the components assigned to the previous process placement apparatus, the lowest XY speed Vmin.

2) The optimization unit 203 extracts, for the components assigned to the subsequent process placement apparatus, all the speeds greater than the XY speed Vmin.

3) The optimization unit 203 replaces XY speed Vmin the with the extracted XY speed.

An example of the component name list in which the XY speed has been replaced by the optimization unit 203 is shown in FIG. 23.

2.2 Operations by the Optimization Apparatus 200

Figure 24:
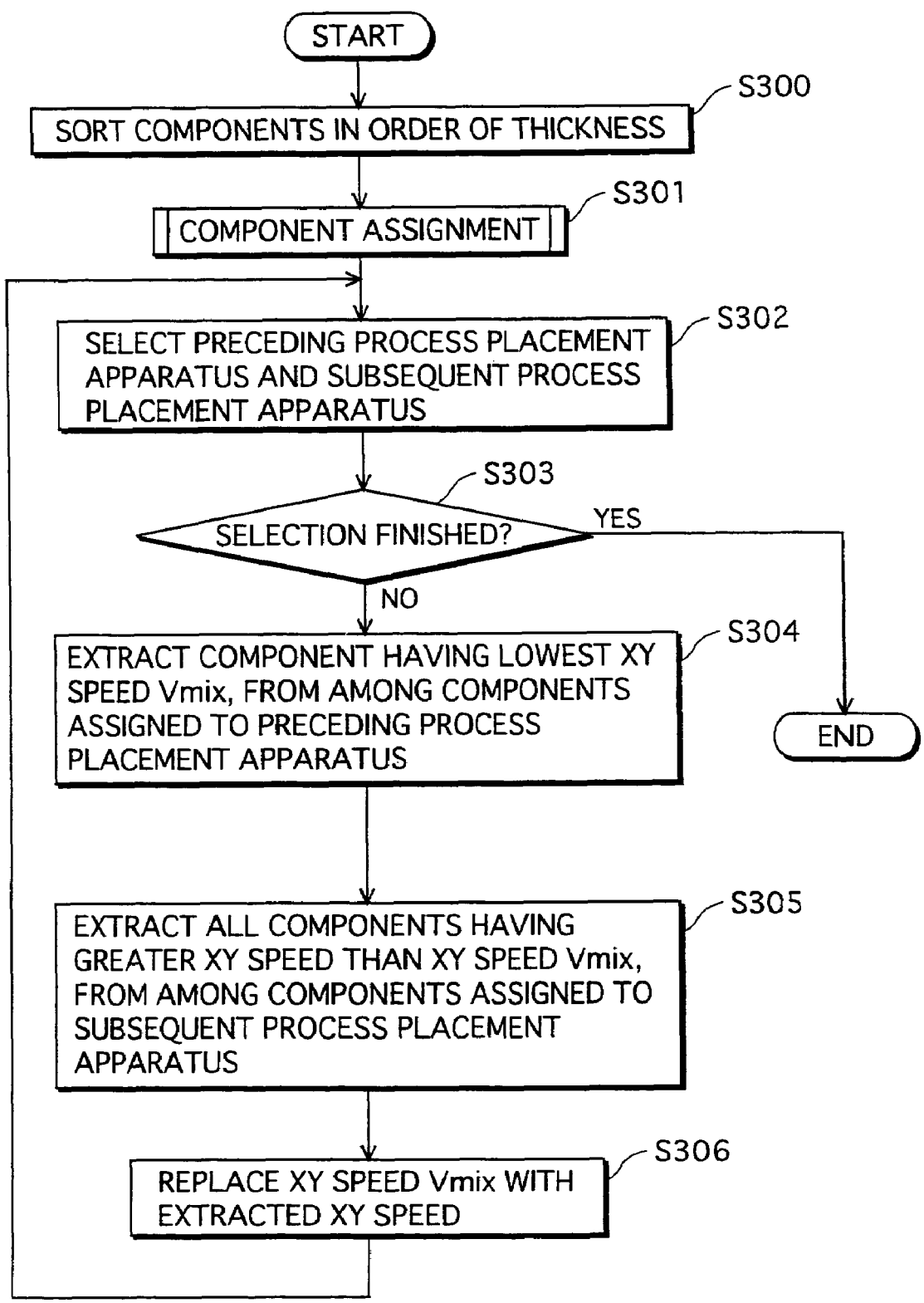
FIG. 24 is a flowchart showing operations by the optimization apparatus 200.

The following describes operations by the optimization apparatus 200, with use of the flowchart in FIG. 24.

The optimization unit 203 rearranges the pieces of component information in the component name list, in ascending order of component thickness (step S300), and assigns the components to the placement apparatuses (step S301).

The optimization unit 203 selects a set of a previous process placement apparatus and a subsequent process placement apparatus (step S302). If all sets have already been selected (step S303), the processing ends.

If any sets remain that have not yet been selected (step S303), the optimization unit 203 extracts, from among the components assigned to the previous process placement apparatus, that having the lowest XY speed Vmin (step S304), and extracts, from among the components assigned to the subsequent process placement apparatus, all speed higher than the XY speed Vmin (step S305). The optimization unit 203 then replaces the XY speed Vmin with the extracted XY speed (step S306), and returns to step S302 to repeat the processing.

2.3 Conclusion

As has been described, according to the assembly system 1 of the second embodiment, the XY speed of components assigned to the subsequent process placement apparatus is set so as not to exceed the XY speed of components assigned to the previous process placement apparatus. Therefore, the components placed by the previous process placement apparatus do not move from their predetermined positions or protrude from the circuit board during the placing operations by the subsequent process placement apparatus.

Note that instead of the described movement time, the optimization apparatus may control using tact information of the circuit board when the electronic components are placed.

3. Third Embodiment

The assembly system 1 of the third embodiment has the same structure as the assembly system 1 of the first embodiment.

The following focuses on describing the points that differ from the assembly system 1 of the first embodiment.

Figure 25:
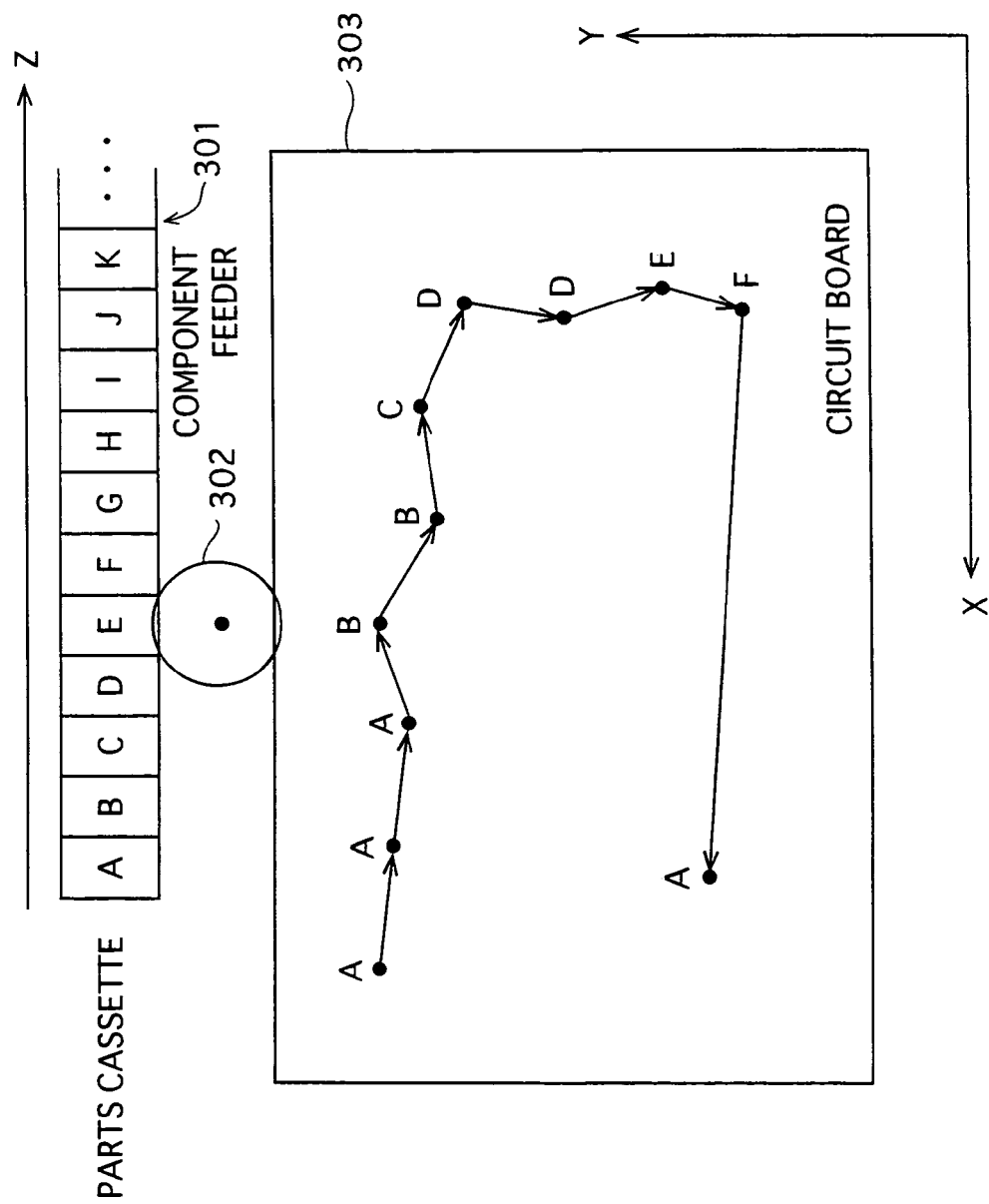
FIG. 25 a conceptual drawing showing the positional relationship between a component feeder 301, a rotary head 302, and a circuit board 3030 in the high-speed placement machine 124.

The high-speed placement machine 124, as shown in FIG. 25, has a component feeder 301. A plurality of parts cassettes are provided aligned in parallel in the component feeder 301. Each parts cassette supplies a particular type of component. The component feeder 301 moves in a left-right direction in the drawing, this direction being referred to as the Z direction.

The high-speed placement machine 124 further includes a rotary head 302. The rotary head 302 picks up a component from one parts cassette, when in suction position, rotates a half-turn, and places the picked up component in a placement position on the circuit board 303.

As the rotary head 302 repeatedly picks up and places components, the components are successively placed on the circuit board 303.

The characters "A", "B", "C", etc. on the circuit board 303 indicate components, and the arrows on the circuit board 303 indicate the order in which the components are placed.

3.1 Structure of the Optimization Apparatus 200

(1) Information Storage Unit 205

The information storage unit 205 has a movement tact table.

The movement tact table, as shown in FIG. 26, has an area for storing a plurality of pieces sets of information, each set consisting of a component name, an XY movement amount, a XY movement tact, a Z movement amount, a Z movement tact, a return tact, and a total movement tact. Each set corresponds to one of the components placed on the circuit board.

The component name is for identifying a component.

The XY movement amount indicates a distance, when placing a component, from the position where the previously placed component was placed to the position where the current component is to be placed.

The XY movement tact is the time required for the head to move the distance indicated by the XY movement amount.

The Z movement amount indicates a distance that the component feeder moves in the Z direction when a component to be placed differs in type to the previously placed component, from a state in which the parts cassette that supplies the previously placed component is in the suction position of the head, so that the parts cassette that supplies the component to be placed is in the suction position.

The Z movement tact is the time required for the component feeder to move the distance indicated by the Z movement amount.

The return tact indicates a distance, when a component that has been presently placed differs in type to the component previously placed, that the component feeder moves in the Z direction from a state in which the parts cassette that supplies the presently placed component is in the suction position of the head so that the parts cassette that supplies the previously placed component is in the suction position.

The total movement tact is a time calculated according to the following expression.

total movement tact={(*XY* movement tact),((*Z* movement tact)+(return tact)*2)}

(2) Optimization Unit 203

The optimization unit 203 rearranges the pieces of component information included in the component name list into ascending order of placement tact. Next, the optimization unit 203 divides the component name list, in which the component information has been rearranged in ascending order of placement tact, into a plurality of groups of pieces of component information having the same placement time. Each group is assigned to a placement apparatus. Here, the group with the shortest placement time is assigned to the placement apparatus closest to the upstream end. Next, the optimization unit 203 rearranges the component information in each group in descending order of the component count.

Next, the optimization unit 203 finds a component R0 closest to the home position of the head, from among the first group of components assigned to the upstream-most placement apparatus.

Next, the optimization unit 203 repeats the following for each remaining component.

1) The optimization unit 203 calculates an XY movement amount from the component R0 for all other components.

2) The optimization unit 203 calculates an XY movement tact from R0 for all other components.

3) The optimization unit 203 calculates a Z movement amount from R0 for all other components.

4) The optimization unit 203 calculates a Z movement tact from R0 for all other components.

5) The optimization unit 203 calculates a return tact from R0 for all other components.

6) The optimization unit 203 calculates a total movement tact for all other components, according to the following expression.

total movement tact=Max{(*XY* movement tact),((*Z* movement tact)+(return tact)*2)}

7) The optimization unit 203 selects the lowest total movement tact from among the movement tacts.

8) The optimization unit 203 connects a path from R0 to the component R1 that corresponds to the selected total movement tact.

9) The optimization unit 203 sets the component R1 as the component R0.

Next, when a path that causes a loss in tact exists, the optimization unit 203 divides the path, thereby generating a plurality of clusters, and re-connects the divided path so that the tact is a minimum.

3.2 Operations by the Optimization Apparatus 200

Figure 27:
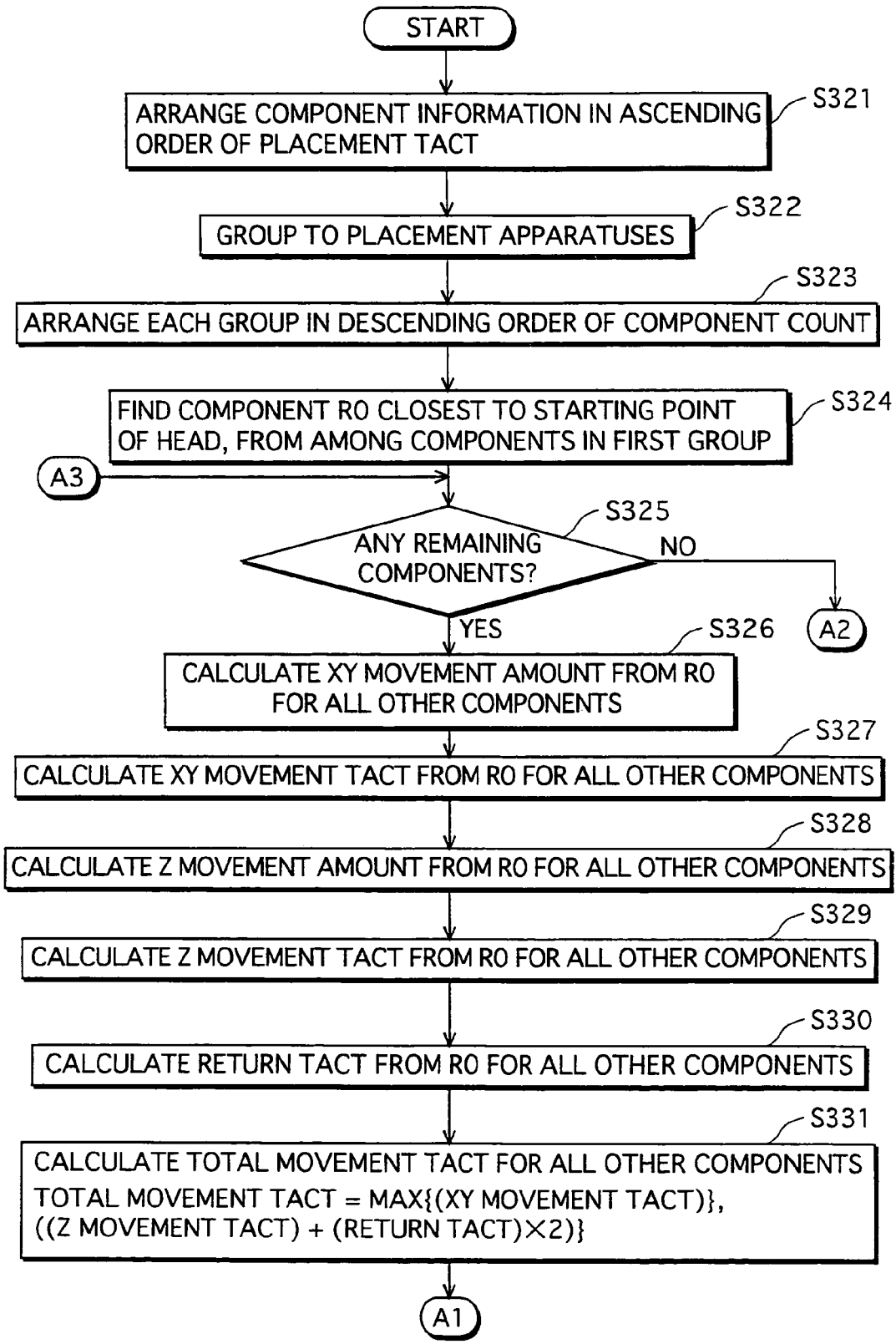
FIG. 27 is a flowchart showing operations of the optimization apparatus 200, and continues in FIG. 28.
Figure 28:
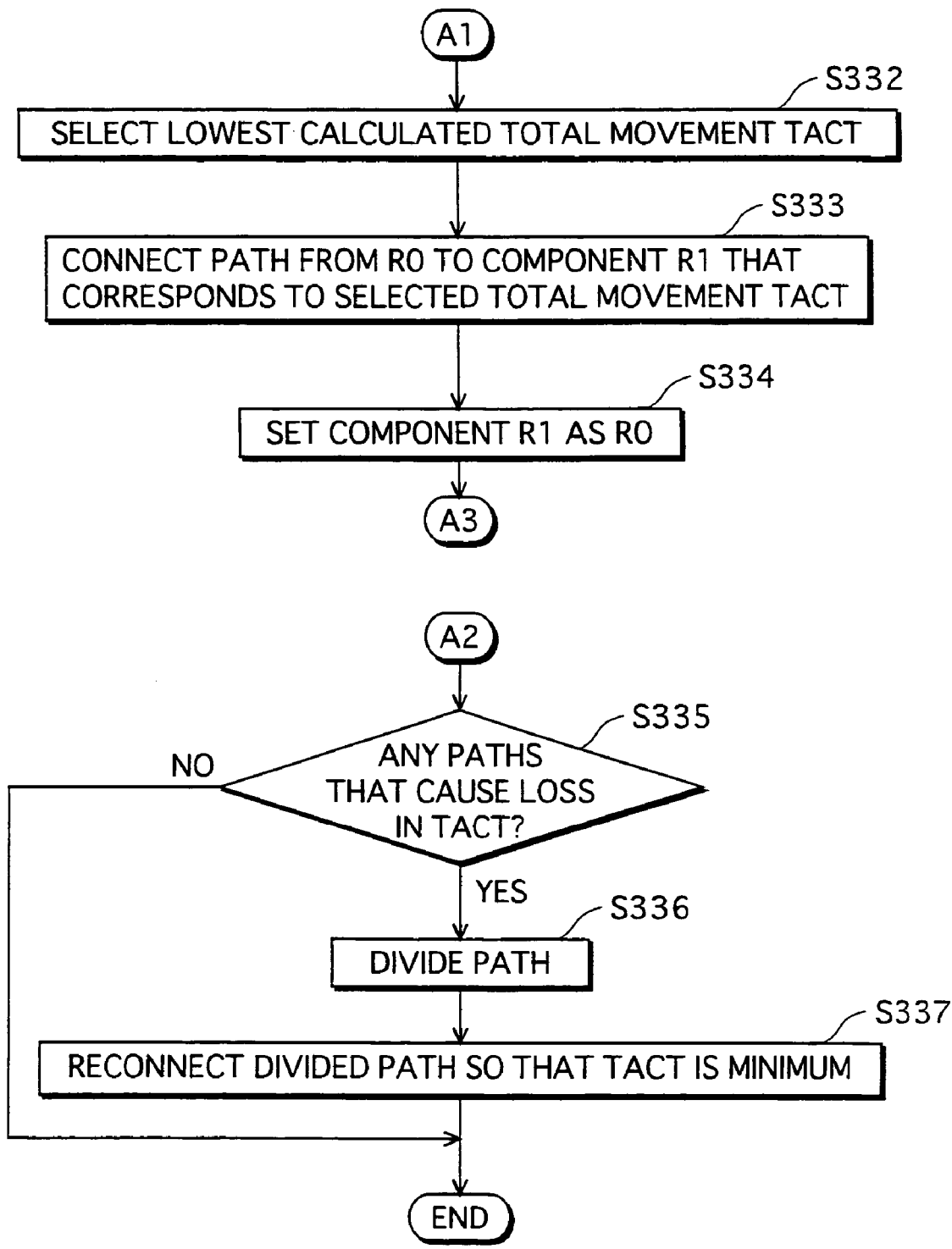
FIG. 28 is a flowchart showing operations of the optimization apparatus 200, and continues from FIG. 27.

The following describes operations by the optimization apparatus 200, with use of the flowcharts in FIGS. 27 to 28.

The optimization unit 203 rearranges the pieces of component information in the component name list, into ascending order of placement tact (step S321), assigns the pieces of component information in the component name list into a plurality of groups, thereby grouping the components with respect to the placement apparatuses (step S322), and, within each group, rearranges the pieces of component information into descending order of component count (step S323).

Next, the optimization unit 203 finds the component R0 closest to the home position of the head, from among the components in the first group (step S324).

The optimization unit 203 then judges whether or not any components remain, and when a component remains (step S325), calculates the XY movement amount from the component R0 for all of the other components (step S326), calculates the XY movement tact from R0 for all of the other components (step S327), calculates the Z movement amount from R0 for all of the other components (steps S328), calculates the Z movement tact from R0 for all of the other components (steps S329), and calculates the return tact from R0 for all of the other components (step S330).

Next, the optimization unit 203 calculates the total movement tact for each of the other components according to the following expression.

total movement tact=Max{(*XY* movement tact),((*Z* movement tact)+(return tact)*2)}  (step S331)

Next, the optimization unit 203 selects the lowest total movement tact from among the calculated movement tacts (step S332), connects a path from R0 to the component R1 corresponding to the selected total placement tact (step S333).

The optimization unit 203 then sets the component R1 as the component R0 (step S334), and returns to step S325 to repeat the processing.

The optimization unit 203 judges whether or not any remaining components exist, and when no remaining components exist (step S325), and when a path that is a cause of tact loss exists (step S335), divides the path into a plurality of clusters (step S336), and reconnects the divided path so that the tact is a minimum (step S337). The optimization unit 203 then ends the processing.

When no path that is a cause of tact loss exists (step S335), the optimization unit 203 ends the processing.

3.3 Conclusion

As has been described, by determining the placement order of components based on a Z movement tact and a return tact in addition to an XY movement tact, large moves in the Z direction can be reduced.

3.4 Modification

The following describes an assembly system as a modification of the third embodiment.

Figure 29:
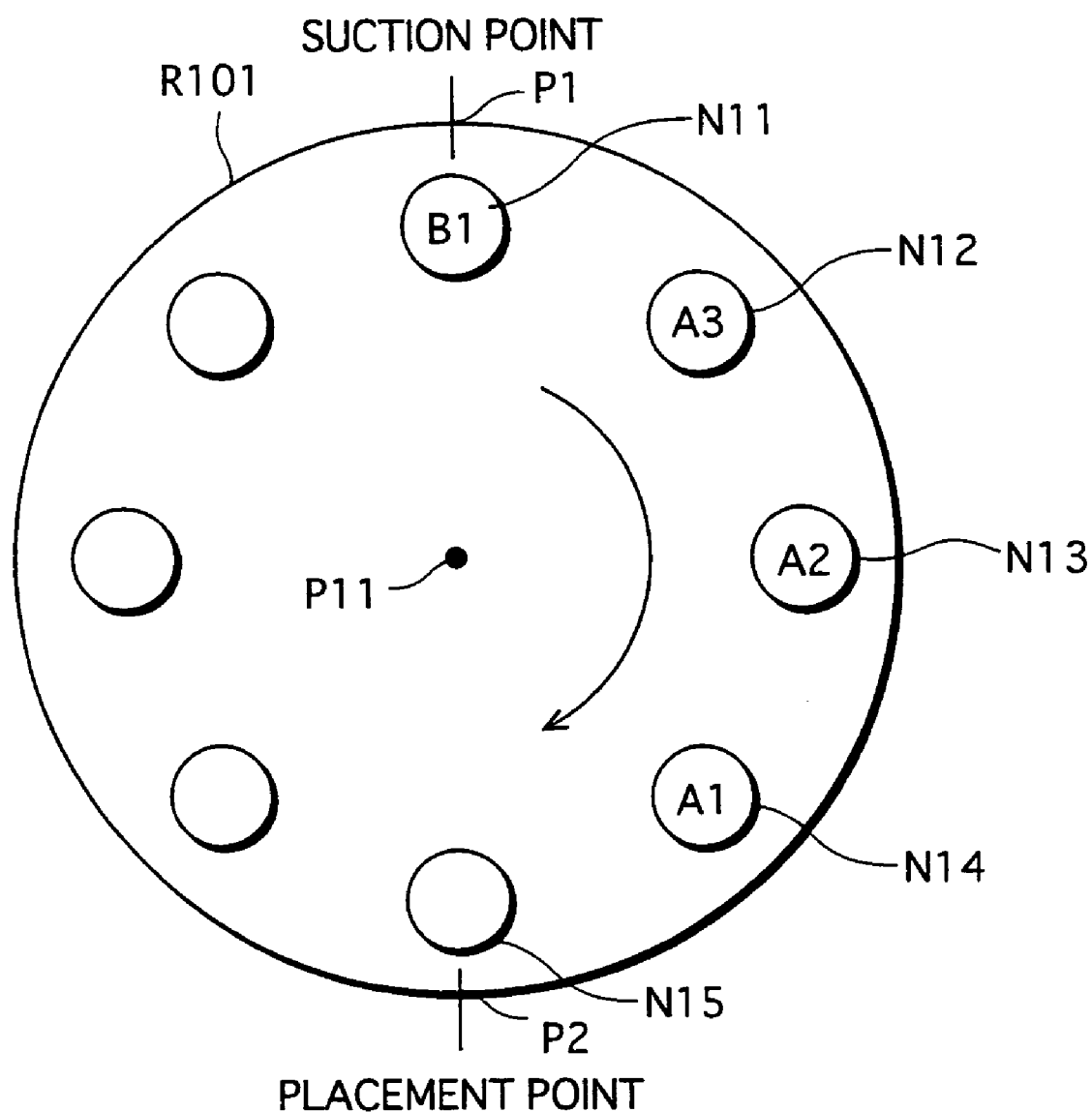
FIG. 29 is a view of the rotary head of the high-speed placement machine 124 from below, and shows the rotary head at a time t4.
Figure 30:
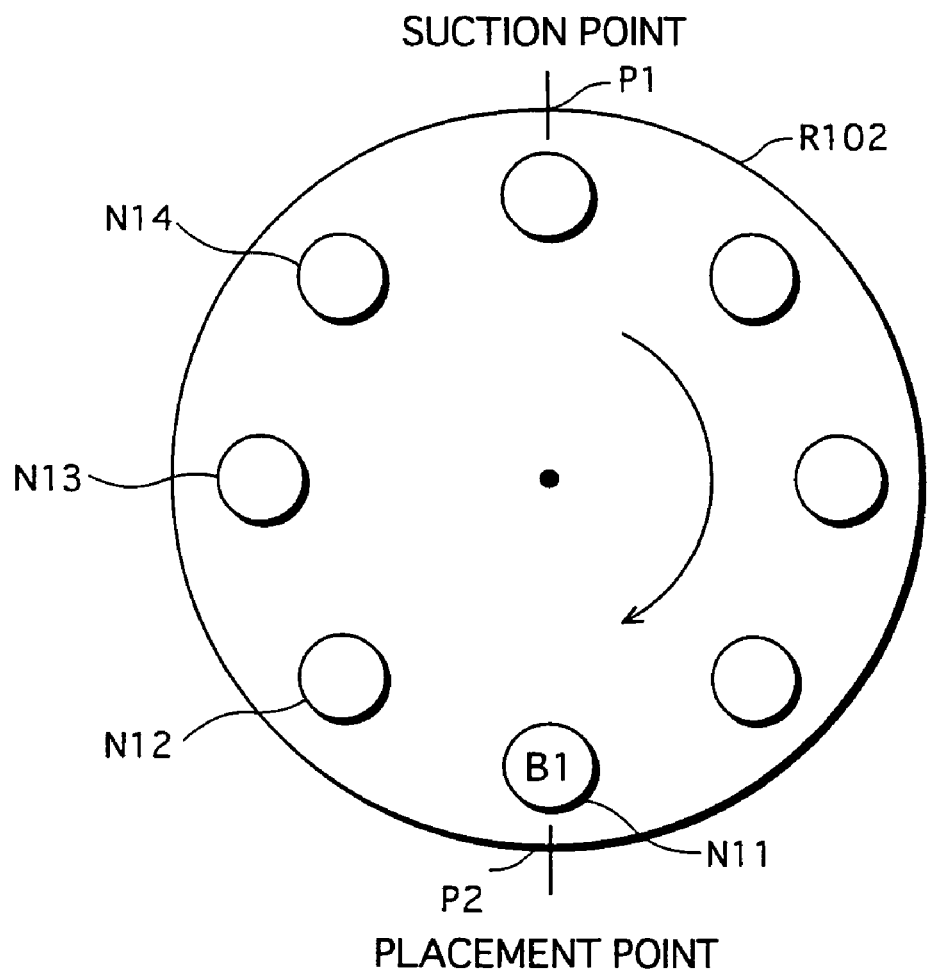
FIG. 30 is a view of the rotary head of the high-speed placement machine 124 from below, and shows the rotary head at a time t8.

FIG. 29 and FIG. 30 show the rotary head of the high-speed placement machine 124 as seen from underneath the rotary head.

A rotary head R101 is shown in FIG. 29 in a state at time t4. The rotary head R101 rotates in a clockwise direction on a point P11. The rotary head R101 has eight nozzles N11, N12, N13, N14, N15, etc. At the time t4, the nozzle N11 is positioned at a suction point P1, and the nozzle N15 is positioned at a placement point P2.

The nozzle N14 picks up a component A (component number A1), the nozzle N13 picks up a component A (component number A2), and the nozzle N12 picks up a component A (component number A3). At the time t4, the nozzle N11 is about to pick up a component B (component number B1).

FIG. 30 shows a rotary head R102 at a time t8 after the rotary has rotated a half turn. At the time t8, the nozzle N11 is in the placement position P2, and the nozzle N15 is in the suction position P1.

The nozzle N11 is about to place a component B (component number B1) on a circuit board.

Figure 31:
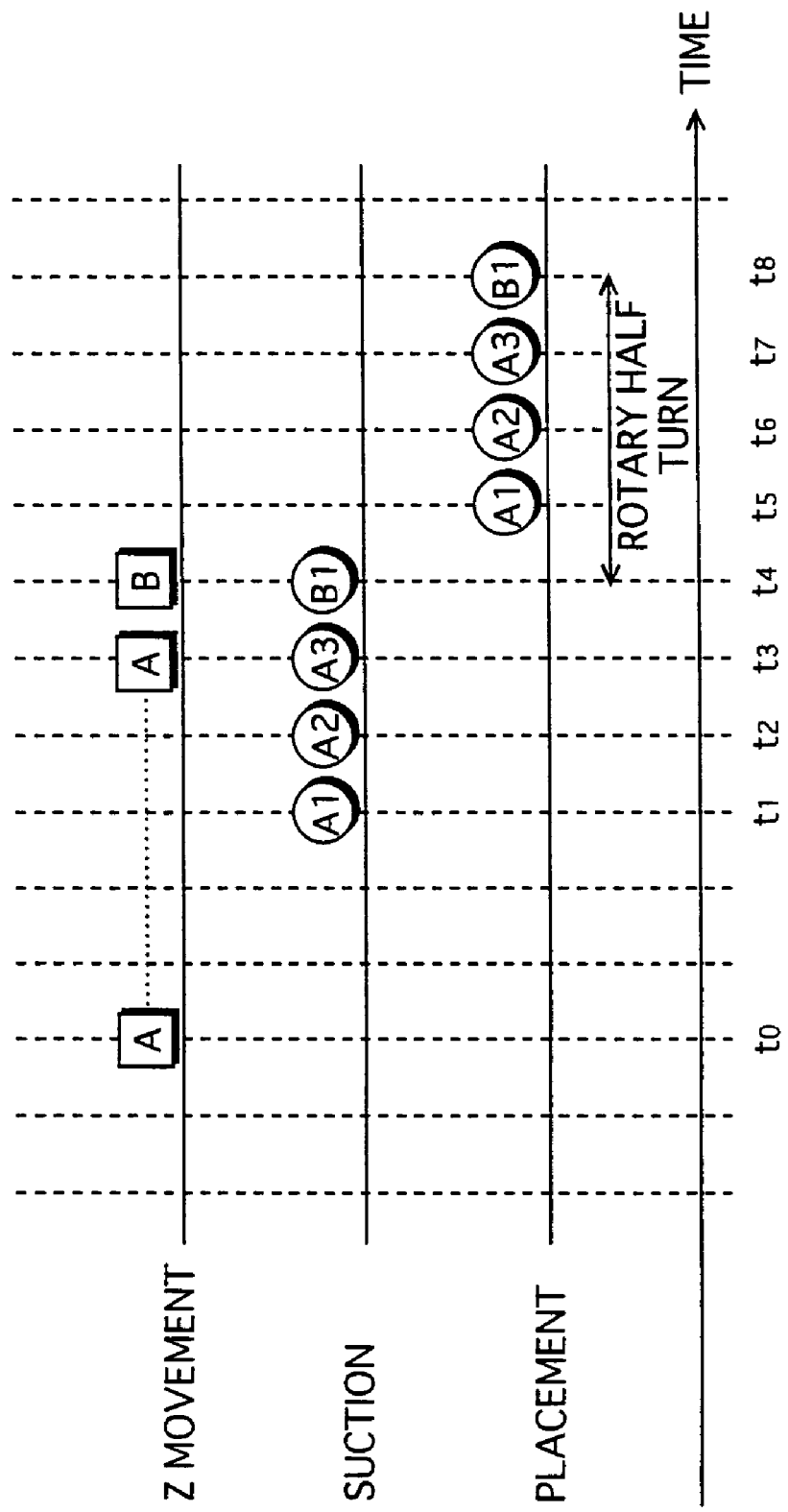
FIG. 31 is a time chart showing movement of the component feeder in the Z direction, and the change in the picked up components and the placed components.

FIG. 31 is a time chart showing movement of the component feeder in the Z direction and changes in the state of components that are picked up and components that are placed, with the lapse of time.

At times t0 to t3, the component feeder is positioned so that the nozzle at the suction point can pick up a component A from the parts cassette that supplies components A.

At t1, the nozzle N14 picks up a component A (component number A1).

At t2, the nozzle N13 picks up a component A (component number A2).

At t3, the nozzle N12 picks up a component A (component number A3).

At times t3 to t4, the component feeder moves so that the nozzle at the suction point can pick up a component B from the parts cassette that supplies components B.

At time T3, the nozzle N11 picks up a component B (component number B1).

At time t5, before which the rotary has rotated a half turn from t1, the nozzle n14 places a component A (component number A1) on the circuit board.

Similarly, at times t6 and t7, the nozzles place components A on the circuit board.

At time t8, before which the rotary has rotated a half turn from t4, the nozzle N11 places a component B (component number B1) on the circuit board.

As described, the Z movement tact has a further delay equal to the half turn of the rotary.

Consequently, in the third embodiment, when calculating the Z movement tact, the optimization unit 203 may further add the time taken for a half turn of the rotary. When calculating the total movement tact, the optimization unit 203 uses the Z movement tact that includes the time for a half turn of the rotary.

4. Fourth Embodiment

The assembly system 1 of the fourth embodiment has the same structure as the assembly system 1 of the first embodiment.

The following focuses on describing the points that differ from the assembly system 1 of the first embodiment.

Figure 32:
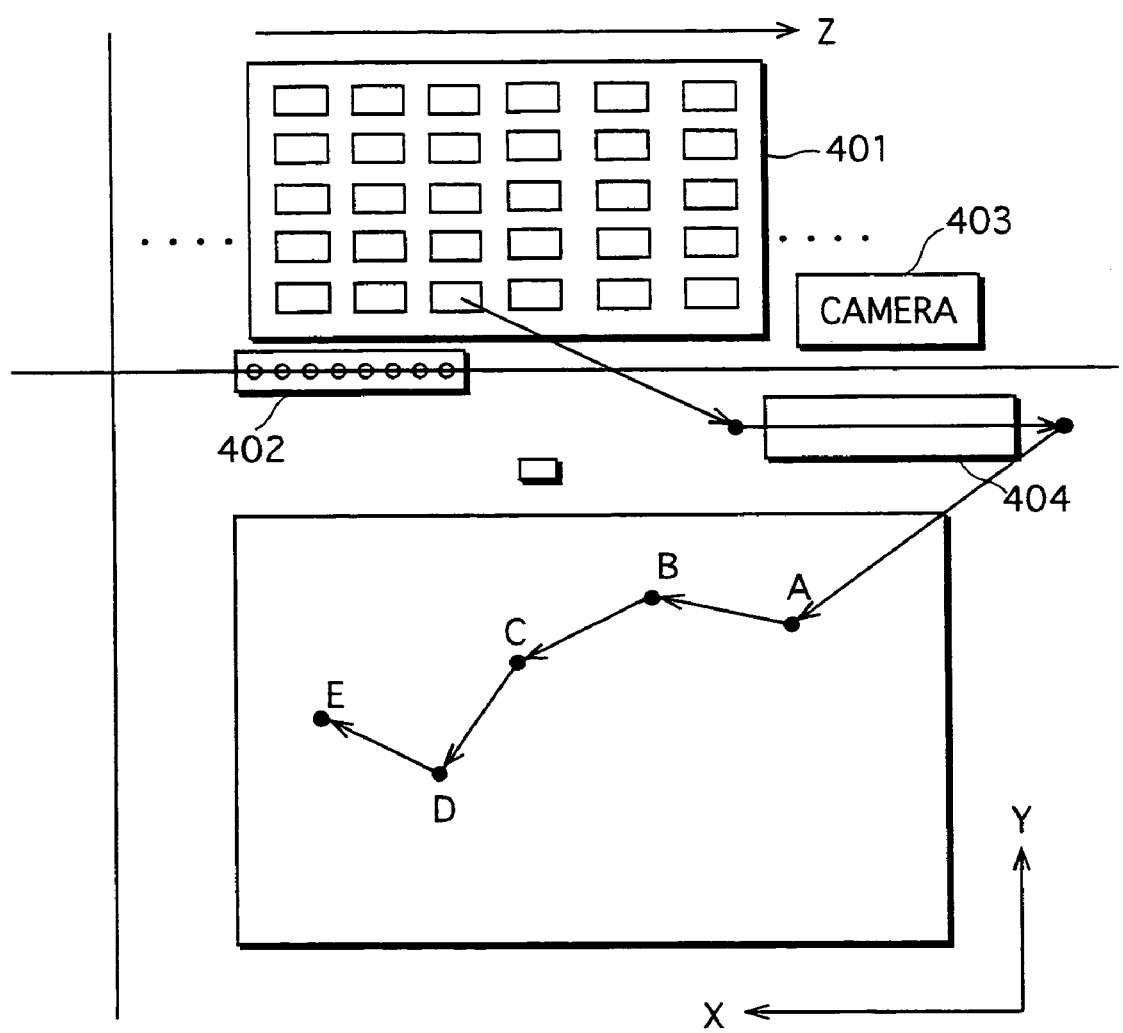
FIG. 32 is an outline showing the positional relationship of the component supply tray of the multifunctional placement machine, the placement head, and the circuit board.

The multifunctional placement machine 125, as shown in FIG. 32, includes a component feeder tray 401. Components of one type are arranged on the component feeder tray 401. One type of component is supplied from the feeder tray 401 feeds the components. A component feeder (not illustrated) moves one of a plurality of component feeder trays to a suction position of a head 402. The direction in which the component feeder tray moves is referred to as the Z axis.

The multifunctional placement machine 125 includes a head 402. The head 402 is provided with a plurality of nozzles. Each nozzle, when in a suction position, picks up a component from one of component supply trays 401.

The multifunction placement machine 125 further includes a camera 403.

After picking up a component, the head 402 moves across a photographic range 404 of the camera 403, and then, in the placement position, places the component on the circuit board 405.

As the rotary head 302 repeatedly picks up and places components, a plurality of components are successively placed on the circuit board 303.

The characters A, B, C, etc. shown on the circuit board 405 indicate components. The arrows shown in the drawing indicate the path along which the head 402 moves.

4.1 Structure of the Optimization Apparatus 200

(1) Information Storage Unit 205

The information storage unit 205 has a component name list, a Z axis list, a plurality of task lists, a final placement point list, a maximum Z coordinate list, a task pair list, and a placement order list.

<Component Name List>

The component name list, as shown in one example in FIG. 33, stores a plurality of pieces of component name information, each of which includes a component name, a component count, a nozzle, and other items.

The component name identifies a component.

The component count indicates how many of the component are placed on the circuit board.

The nozzle is an identifier indicating a type of nozzle.

<Z Axis List>

The Z axis list, as shown in one example in FIG. 35, includes an area for storing a plurality of pieces of Z axis information, each piece of Z axis information consisting of a component name and a Z coordinate.

The component name identifies a component.

The Z coordinate indicates a position of a parts cassette or a tray in the component feeder that feeds the component shown by the corresponding component name.

<Task List>

Each task list, as shown in one example in FIG. 37, has an area for storing a task number and a plurality of pieces of task information.

Here, a task denotes a series of operations consisting of: the placement head moving to the component feeder, picking up a plurality of electronic components, and then moving at a set speed across the photographic range of the recognition camera; the recognition camera photographing all the electronic components picked up by the placement head; and the placement head placing the plurality of electronic components on the circuit board. Each placement apparatus places components on a circuit board by executing a plurality of tasks.

Each task list includes pieces of placement information equal in number to the nozzles of the placement head.

The task number is for identifying the task.

Each piece of task information includes a placement order, a component name, a component number, an X coordinate value, a Y coordinate value, a Z coordinate value, and other items.

The placement order indicates a position in an order in which components corresponding to the placement information are placed in the task.

The component name identifies a component to be placed.

The component number identifies a component.

The X coordinate value and Y coordinate value is, respectively, the X coordinate value and the Y coordinate value of the position in which the component is placed on the circuit board.

The Z coordinate value indicates the position of the cassette or the tray, in the component feeder, that feeds the component.

<Final Placement Point List>

The final placement point list, as shown in one example in FIG. 38, includes an area for storing a plurality of pieces of final placement point information, each piece of final placement point information consisting of a task number and a final placement point X coordinate value.

The task number identifies a task.

The final placement point X coordinate value indicates the X value coordinate of the position in which the final component in the task is placed on the circuit board.

<Maximum Z Coordinate List>

The maximum Z coordinate list, as shown in one example in FIG. 39, includes an area for storing a plurality of pieces of maximum Z coordinate information, each piece of maximum Z coordinate information consisting of a task number and a maximum Z coordinate value.

The task number identifies a task.

The maximum Z coordinate value indicates the greatest Z coordinate value among the Z coordinate values indicating the position of a cassette or a tray in the component feeder.

<Task Pair List>

The task pair list, as shown in one example in FIG. 40, includes a plurality of pieces of task pair information, each of which includes a variable a, a former task number and a latter task number.

The variable a is a variable used in return optimization which is described later.

The former task number identifies a task performed before a latter task.

The latter task number identifies the task performed subsequent to the former task.

<Placement Order List>

The placement order list, as shown in one example in FIG. 41, is a data table that stores information indicating the order in which tasks are executed.

The placement order list includes an area for storing a plurality of pieces of placement order information, each of which consists of a placement order and a task number.

The placement order indicates the position of the task in the order of execution by the placement apparatus.

The task number identifies the task.

(2) Optimization Unit 203

The optimization unit 203 rearranges the pieces of component name information in the component name list stored in the information storage unit 205, into descending order of component count. The component name list rearranged in descending order of component count is shown in FIG. 33.

Next, the optimization unit 203 calculates an average X coordinate value Xm and an average Y coordinate value Ym on the circuit board for each component name indicated in the stored component name list, using the following expressions.

<Expressions>

$$Xm = \{X0 + X1 + \ldots + Xn\}/n$$

$$Ym = \{Y0 + Y1 + \ldots + Yn\}/n$$

Here, n indicates how many of the specific component are to be placed on the circuit board.

Figure 34:
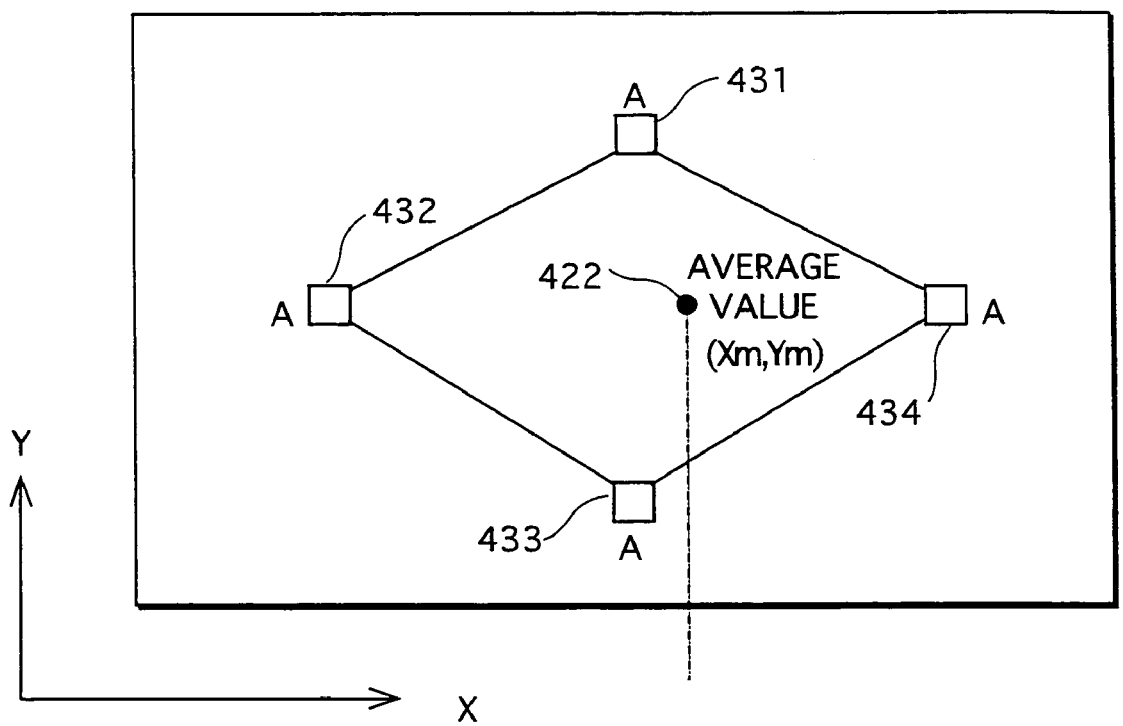
FIG. 34 shows a planar view of a circuit board 421 in FIG. 34.

FIG. 34 shows a planar view of a circuit board 421. FIG. 34 shows, in a case in which four components indicated by the component name A are placed on the circuit board 421, positions 431 to 434 of the components placed on the circuit board, and a position 422 indicated by an X coordinate value Xm and a Y coordinate value Ym calculated using the aforementioned expressions. Next, for each component in the order that the component name information is stored in the component name list, and assuming that the component is to be placed in a position indicated by the calculated X coordinate value Xm and Y coordinate value Ym, the optimization unit 203 determines the Z coordinate value of the parts cassette or tray in the component feeder, so that movement in the Z direction in order to pick up the component is as little as possible. Next, the optimization unit 203 writes the determined Z coordinate value to the Z axis list, in correspondence with the component indicating the component. FIG. 35 shows an example of a Z axis list generated in this way.

As described, the optimization unit 203 determines the Z coordinate value for each component in the order in which the component name information is stored in the component name list, and therefore the Z coordinate value is set such that the greater the component count of the type, the less movement by the component feeder in the Z axis direction.

Next, the optimization unit 203 generates a plurality of groups by rearranging the component name information included in the component name list, according to the nozzle or tool included in the component name information. FIG. 36 shows the component name list in which the component name information has been rearranged in this way. Here, component name information that includes nozzle "S" forms group 1, component name information that includes nozzle "M" forms group 2, and component name information that includes nozzle "L" forms group 3.

Next, the optimization unit 203 generates a plurality of task lists by determining task assignment for each component in the component table. An example of a generated task list is shown in FIG. 37.

Next, the optimization unit 203 determines a path for each nozzle, or for each cassette/tray, according to return optimization. Details of return optimization are described below.

Next, the optimization unit 203 finds, for each group, a point on which the group can be most quickly placed on the circuit board, and connects the cassette path and the tray path.

<Operations for Path Determination According to Return Optimization>

The following describes operations by the optimization unit 203 for path determination according to return optimization.

The optimization unit 203, for each task, extracts the X coordinate value from the task information that is last in the placement order in the task list corresponding to the task, generates final placement point information consisting of the task number identifying the task and the extracted X coordinate value, and writes the generated final placement point information to the final placement point list.

Next, the optimization unit 203 rearranges the final placement point information in the final placement point list, so as to be in descending order of X coordinate value of the final placement point, and overwrites the former final placement point list with the final placement point list in which the final placement point information has been rearranged. An example of the final placement point list is shown in FIG. 38.

Next, the optimization unit 203, for each task, finds the maximum Z coordinate value in the task list corresponding to the task, and writes the maximum Z coordinate value composed of the task number identifying the task and found maximum Z coordinate value, to the maximum Z coordinate list. The maximum Z coordinate list is generated in this way. FIG. 39 shows an example of the maximum Z coordinate list. The optimization unit 203 then rearranges the maximum Z coordinate information in the maximum Z coordinate list, so as to be in descending order of maximum Z coordinate, and rewrites the former maximum Z coordinate list with the maximum Z coordinate list in which the maximum Z coordinate information has been arranged.

Next, the optimization unit 203 repeatedly executes the following processing while incrementing the variable a starting from 1, until the variable a reaches a value equal to the task number.

1) The optimization unit 203 sets the task identified by the task number included in the final placement point information that is the a-th in the final placement point list, as the former task in the a-th task pair.

2) The optimization unit 203 sets the task identified by the task number included in the maximum Z coordinate information that is the a-th in the maximum Z coordinate list, as the latter task in the a-th task pair.

3) The optimization unit 203 generates task pair information consisting of the variable a, the former task number that identifies the former task, and the latter task number that identifies the latter task, and writes the generated task pair information to the task pair list.

Next, the optimization unit 203 extracts, from each task list, the piece of task information that is last in the placement order, and then extracts, from the plurality of pieces of extracted task information, the piece of task information that has the greatest X coordinate value. The optimization unit 203 assigns the position "1" in the placement order to the task identified by the task number in the task list in the extracted pieces of task information, generates task order information consisting of the task number and the position "1", and writes the generated placement order information to the placement order list.

Next, the optimization unit 203 repeatedly executes the following processing while incrementing the variable a by 1 starting from 1, until all tasks have been assigned a position in the placement order.

1) The optimization unit 203 finds the task number that identifies the task having a position a in the placement order, from the placement order list.

2) The optimization unit 203 finds, from the task list, the task pair information that includes the former task number identifying the former task, the former task being the task identified by the found task number.

3) The optimization unit 203 finds the latter task number from the found task pair information.

4) The optimization unit 203 judges, using the placement order list, whether or not a position in placement order has been assigned to the latter task identified by the found latter task number.

5)-1 If a position in the placement order has been assigned, the optimization unit 203 judges whether there are any unassigned tasks to which a position in the placement order has not been assigned, and if any such unassigned tasks exist, assigns the position "a+1" to the remaining unassigned task having the greatest final placement X coordinate.

5)-2 If a position in the placement order has not been assigned, the optimization unit 203 assigns the position "a+1" to the latter task.

Next, the optimization unit 203 calculates the movement amount of the head in the following way for each task.

FIG. 42 is a planar view showing the positional relationship between the circuit board 451 and the head 441. In FIG. 42, nozzles 443, 444, etc. are provided on the head 441. The nozzles are separated from each other by an offset 450.

Here it is assumed that the nozzles 443, 444 provided on the head 441 respectively pick up components N1 and N2, and place the components on placement points 452 and 453. Here, assuming that the coordinates of the placement points 452 and 453 are (100, 200) and (200, 200), respectively, the movement amount $\Delta X$ of a central point 442 of the head in the X direction and the movement amount $\Delta Y$ of a central point 442 of the head in the Y direction are, respectively, as follows.

$\Delta X = X$ coordinate of placement point of $N2 - X$ coordinate of placement point $N1 -$ offset $= 200 - 100 - 20 = 80$ $\Delta Y = Y$ coordinate of placement point of $N2 - Y$ coordinate of placement point $N1 = 200 - 200 = 0$ In this way, the optimization unit 203 calculates the movement amount of the center point of the head taking the offset into account.

Next, the optimization unit 203 calculates a total P1 of the head movement amount of all tasks.

Next, the optimization unit 203 sets the value of a variable task2 to 1, sets a variable task2 to (variable task2+1), calculates a movement amount of the head for each task, and calculates a total movement amount olength of the head for all tasks.

Next, the optimization unit 203 swaps the placement order of task1 and task2, calculates the head movement amount for each task, and calculates a total movement amount nlength of the head for all tasks.

Next, the optimization unit 203 compares the total olength with the total nlength, and when the total olength is equal to or greater than the total nlength, employs the switched placement order. When the total olength is less than the total nlength, the optimization unit 203 employs the original (un-switched) placement order.

Next, the optimization unit 203 adds 1 to the value of task2, compares task2 with the task count, and if task2 is equal to or less than the task count, repeats the described processing.

When task2 is greater than the task count, the optimization unit 203 adds 1 to the value of task2, compares task2 with the task count, and when task2 is equal to or less than the task count, repeats the described processing.

When task2 is greater than the task count, the optimization unit 203 calculates the head movement amount for each task in the swapped placement order, and calculates the total movement amount P2 of the head in all tasks.

Next, the optimization unit 203 compares P2 with P1, and when P2 is less than P1, substitutes P1 with P2, and repeats the described processing.

When P2 is greater than or equal to P1, the optimization unit 203 ends the processing.

4.2 Operations by the Optimization Apparatus 200

The following describes operations by the optimization apparatus 200.

(1) Outline of Operations by the Optimization Unit 203

Figure 43:
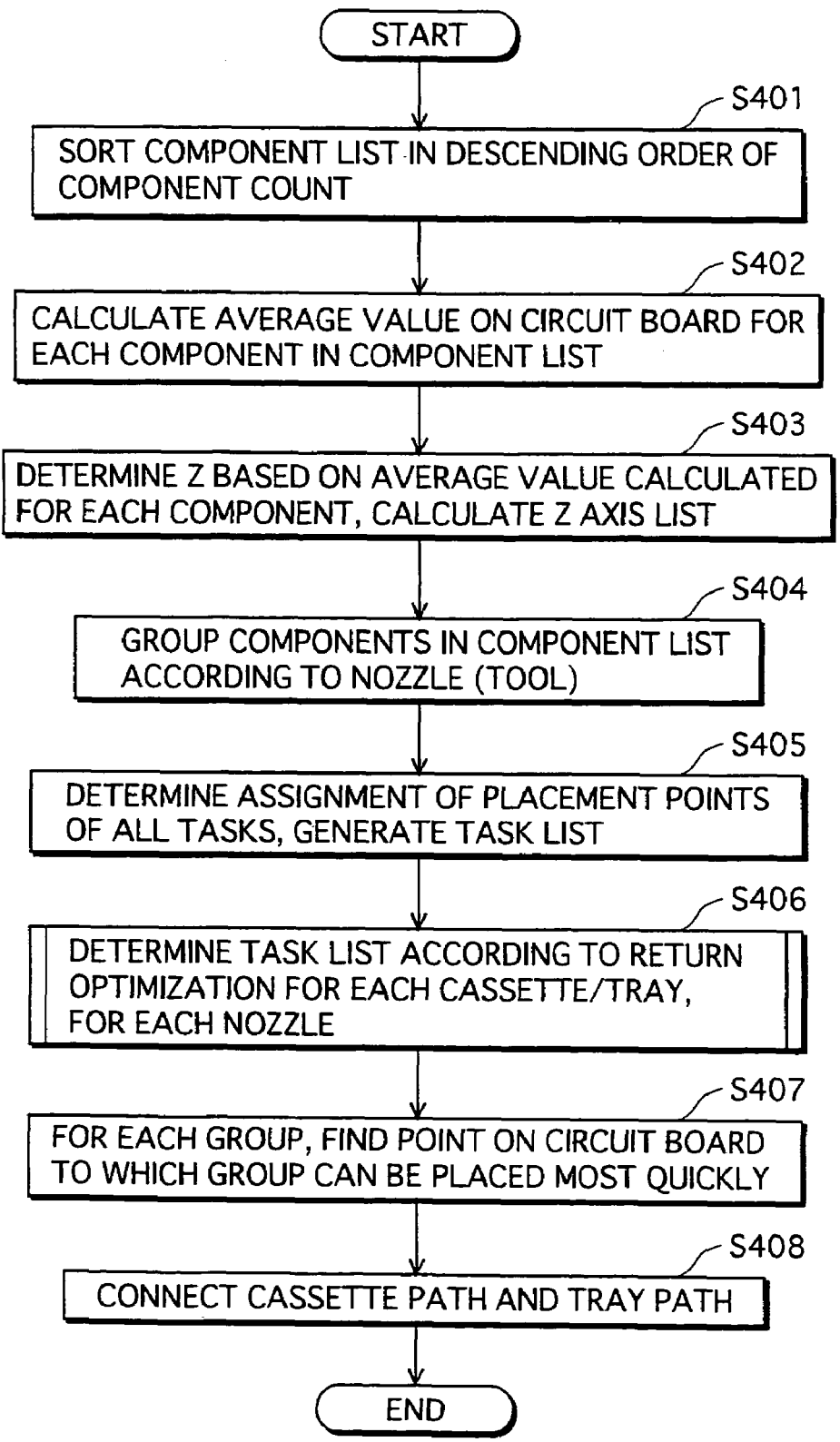
FIG. 43 is a flowchart showing an outline of operations by the optimization unit 203.
Figure 44:
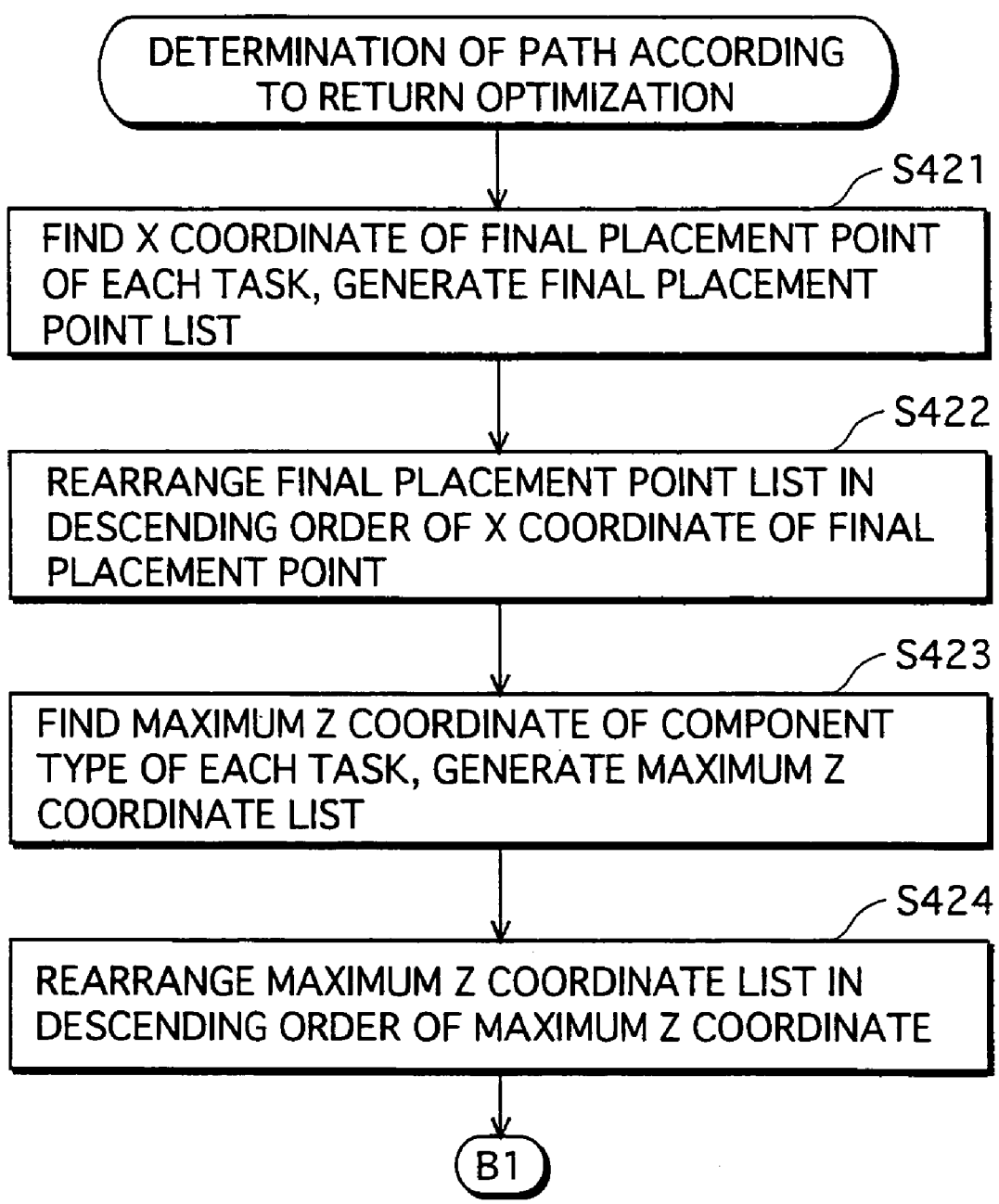
FIG. 44 is a flowchart showing operations for path determination according to return optimization, and continues in FIG. 45.
Figure 45:
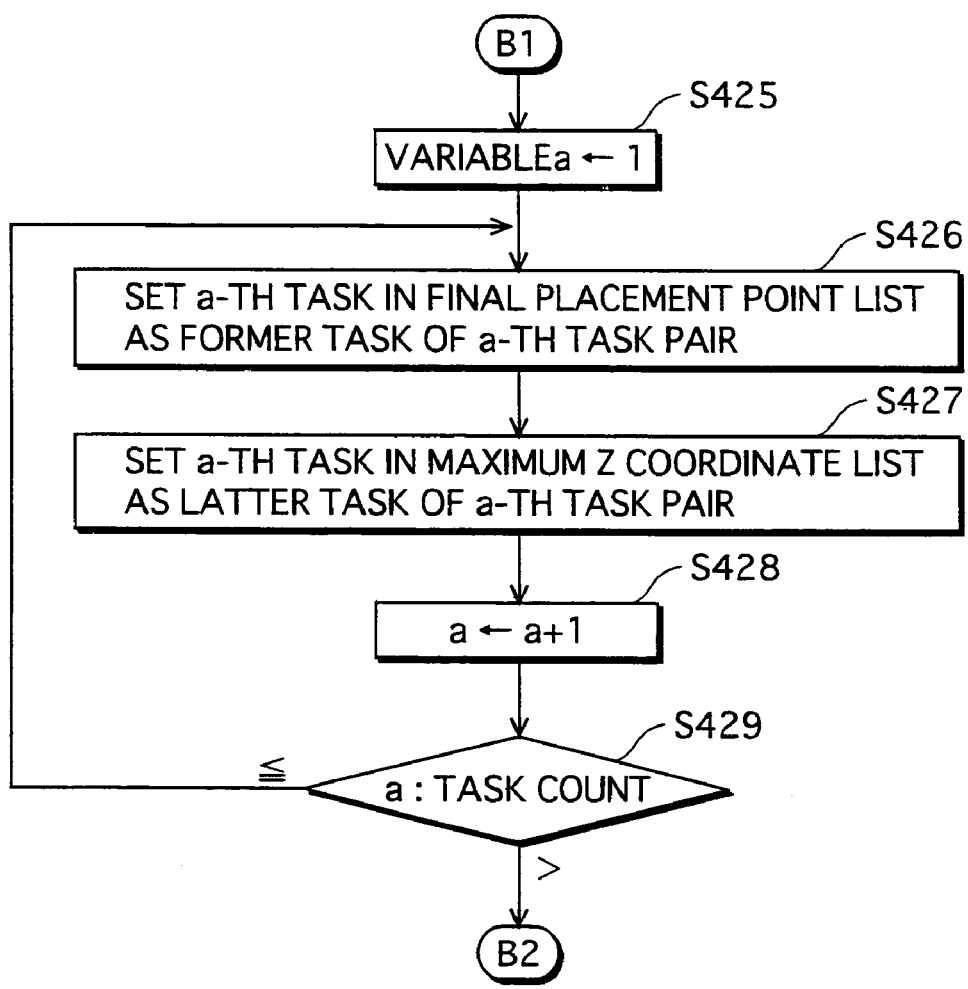
FIG. 45 is a flowchart showing operations for path determination according to return optimization, and continues in FIG. 46.
Figure 46:
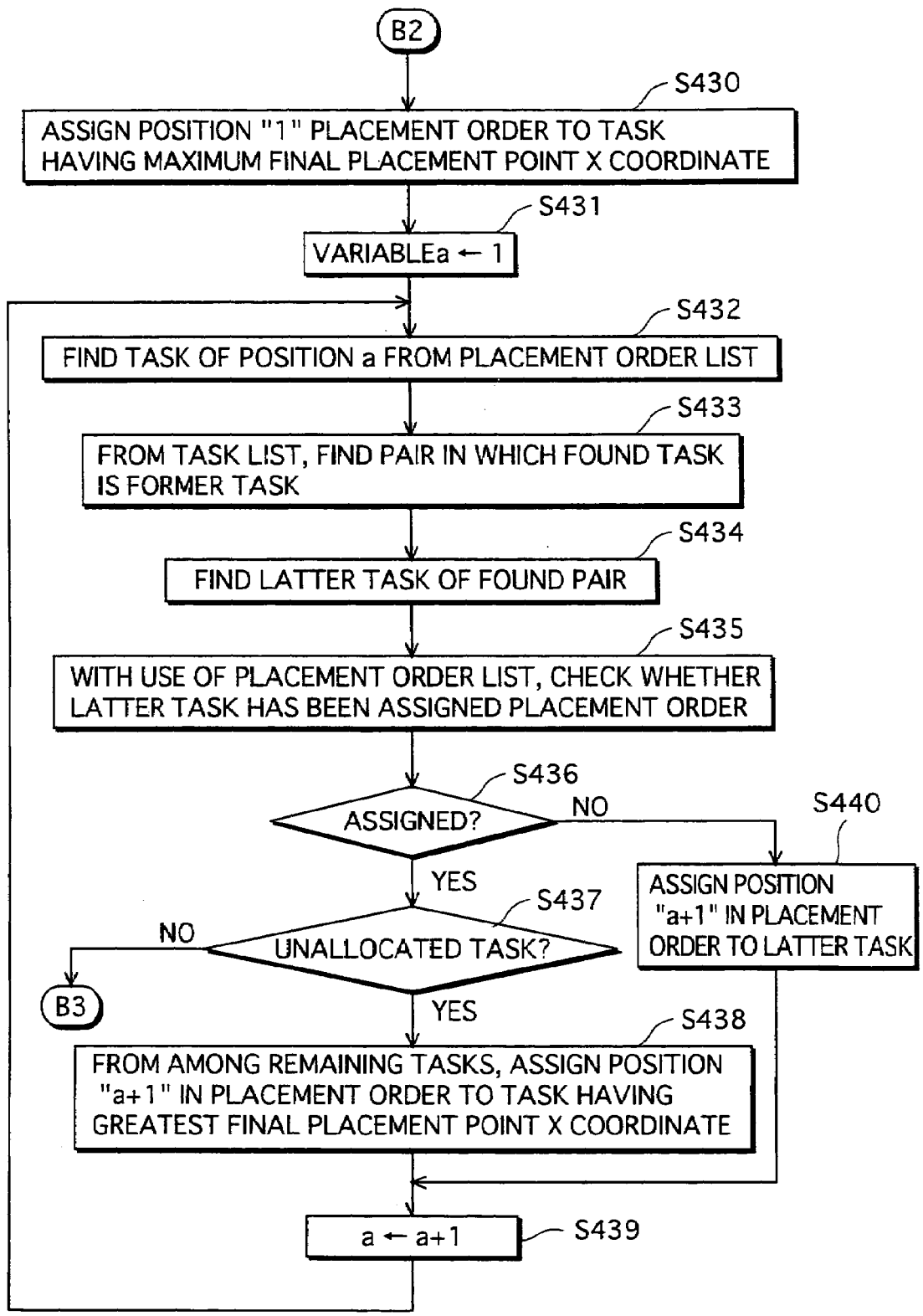
FIG. 46 is a flowchart showing operations for path determination according to return optimization, and continues in FIG. 47.
Figure 47:
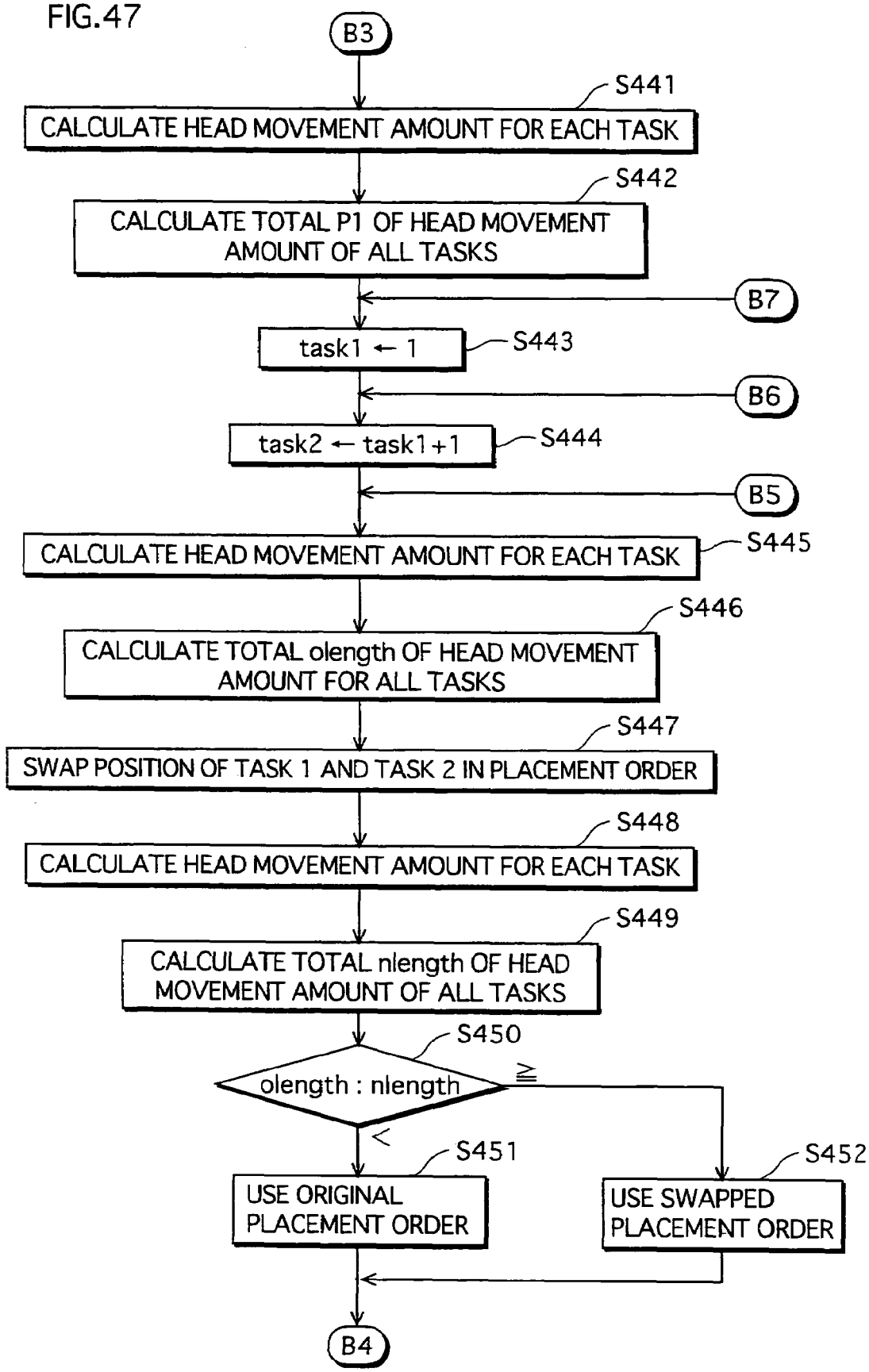
FIG. 47 is a flowchart showing operations for path determination according to return optimization, and continues in FIG. 48.
Figure 48:
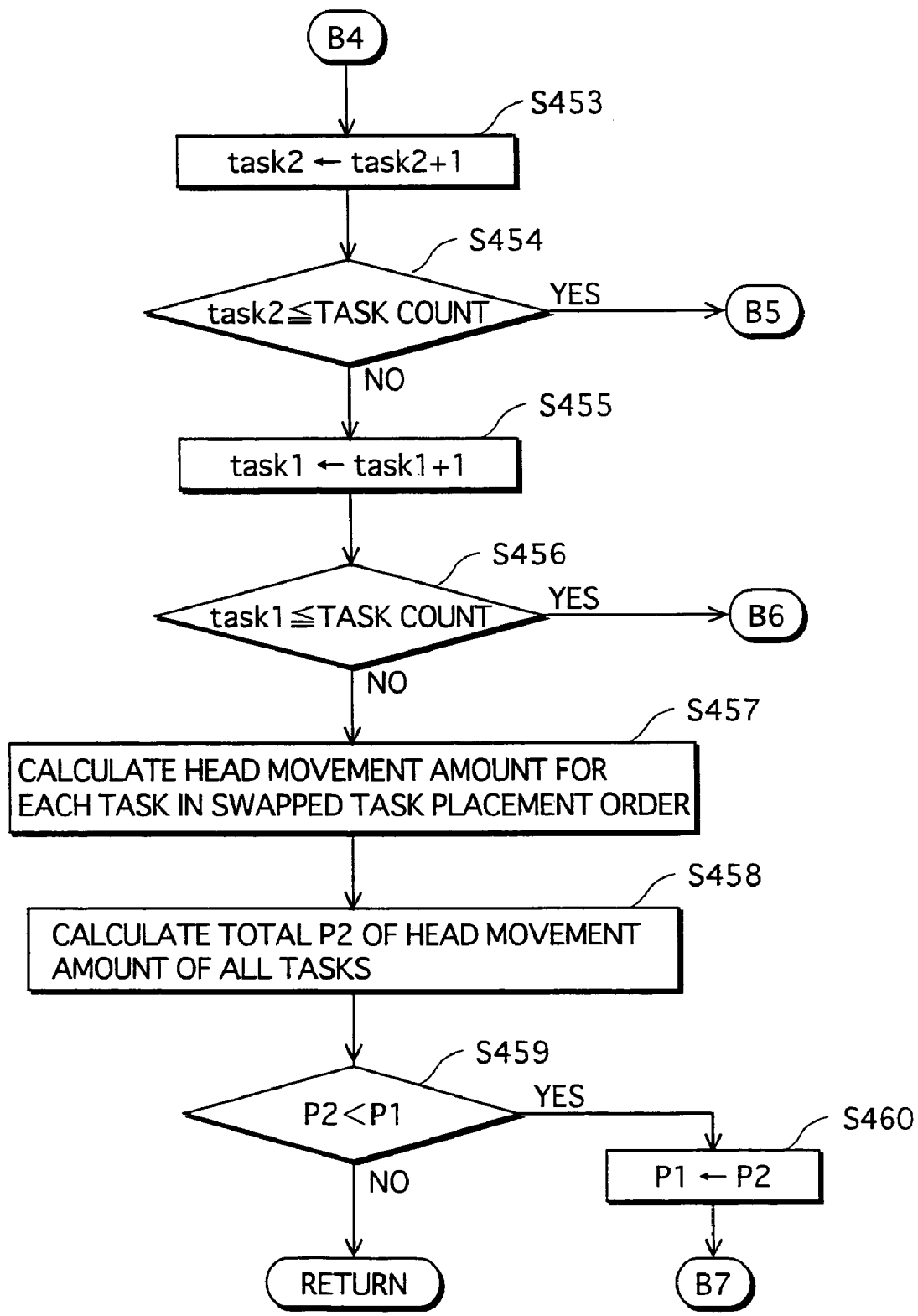
FIG. 48 is a flowchart showing operations for path determination according to return optimization, and continues from FIG. 47.

The following describes an outline of operations by the optimization unit 203, with use of the flowchart shown in FIG. 43.

The optimization unit 203 rearranges the pieces of component name information included in the component list, so as to be in descending order of component count (step S401), calculates, for each component, the average value on the circuit board (step S402), determines Z based on the average value calculated for each component, and generates the Z axis list (step S403), rearranges the pieces of component name information in the component name list, according to nozzle (or tool), thereby generating a plurality of groups (step S404), assigns a placement point to each task, and generates a task list (step S405).

Next, the optimization unit 203 determines, for each nozzle or for each cassette/tray, a path according to return optimization (step S406), finds, for each group, a point to which the group can be most quickly placed on the circuit board (step S407), and connects the cassette path and the tray path (step S408).

(2) Path Determining Operations According to Return Optimization

The following describes path determination operations according to return optimization, with use of the flowcharts in FIG. 44 to FIG. 48.

The optimization unit 203 finds the X coordinate of the final placement point of each task and generates a final placement point list (step S421), rearranges the final placement point list, so as to be in descending order of X coordinates (step S422), finds the maximum Z coordinate of the component type for each task and generates a maximum Z coordinate list (step S423), and rearranges the generated maximum Z coordinate list so as to be in descending order of maximum Z coordinate (step S424).

Next, the optimization unit 203 sets the variable a to "1" (step S425), sets the a-th task in the final placement point list as the former task in the a-th task pair (step S426), sets the a-th task in the maximum Z coordinate list as the latter task in the a-th task pair (step S427), adds "1" to the variable a (step S428), compares the variable a with the task count, and if the variable a is equal to or less than the task count (step S429), returns to step S426 and repeats the processing.

When the variable a is greater than the task count (step S429), the optimization unit 203 assigns the position "1" in the task order to the task having the greatest final placement point X coordinate (step S430).

Next, the optimization unit 203 sets the value of the variable a to "1" (step S431), finds the task that is a-th in the placement order in the placement order list (step S432), finds, from the task list, the pair in which the found task is the former task (step S433), finds the latter task of the found pair (step S434), and judges whether or not a position in the placement order has been assigned to the latter task, using the placement order list (step S435). If a position in the placement order has been allocated (step S436), the optimization unit 203 judges whether or not there are any unassigned tasks to which a position in the placement order has not been assigned, and if any such tasks exist (step S437), assigns a position "a+1" in the placement order to the remaining task having the greatest final placement point X coordinate (step S438), adds "1" to the variable a (step S439), and then returns to step S432 and repeats the processing.

If the latter task has not been assigned a placement order (step S436), the optimization unit 203 assigns the position "a+1" to the latter task (step S440), adds "1" to the variable a (step S439), and then returns to step S432 and repeats the processing.

If there are no unassigned tasks (step S437), the optimization unit 203 calculates the head movement amount for each task (step S441), calculates a total head movement amount P1 of all tasks (step S442), sets the variable task1 to "1" (step S443), sets the variable task2 to (task1+1) (step S444), calculates the head movement amount for each task (step S445), calculates the total head movement amount olength of all tasks (step S446), swaps task1 and task2 in the placement order (step S447), calculates a head movement amount for each task (step S448), and calculates a head total movement amount nlength for all tasks (step S449).

Next, the optimization unit 203 compares the total olength with the total nlength, and if the total olenght is greater than the total nlength (step S450), employs the swapped placement order (step S452). If the total olength is less than the total nlength (step S450), the optimization unit 203 employs the original placement order (step S451).

Next, the optimization unit 203 adds "1" to task2 (step S453), compares task2 with the task count, and if task2 is equal to or less than the task count (step S454), returns to step S445 and repeats the processing.

If task2 is greater than the task count (step S454), the optimization unit 203 adds "1" to task2 (step S455), compoares task2 and the task count, and when task2 is less than or equal to the task count (step S456), returns to step S444 and repeats the processing.

If task1 is greater than the task count (step S456), the optimization unit 203 calculates the head movement amount for each task in the swapped task placement order (step S457), and calculates the head total movement amount P2 of all tasks (step S458).

Next, the optimization unit 203 compares P1 and P2, and if P2 is less than P1 (step S459), substitutes P1 with P2 (step S460), and returns to step S443 and repeats the processing.

If P2 is equal to or greater than P1 (step S459), the optimization unit 203 ends the processing.

4.3 Conclusion

In this way, according to the fourth embodiment, a path can be determined to achieve optimum XY movement tasks taking nozzle replacement and the like into account.

Figure 49:
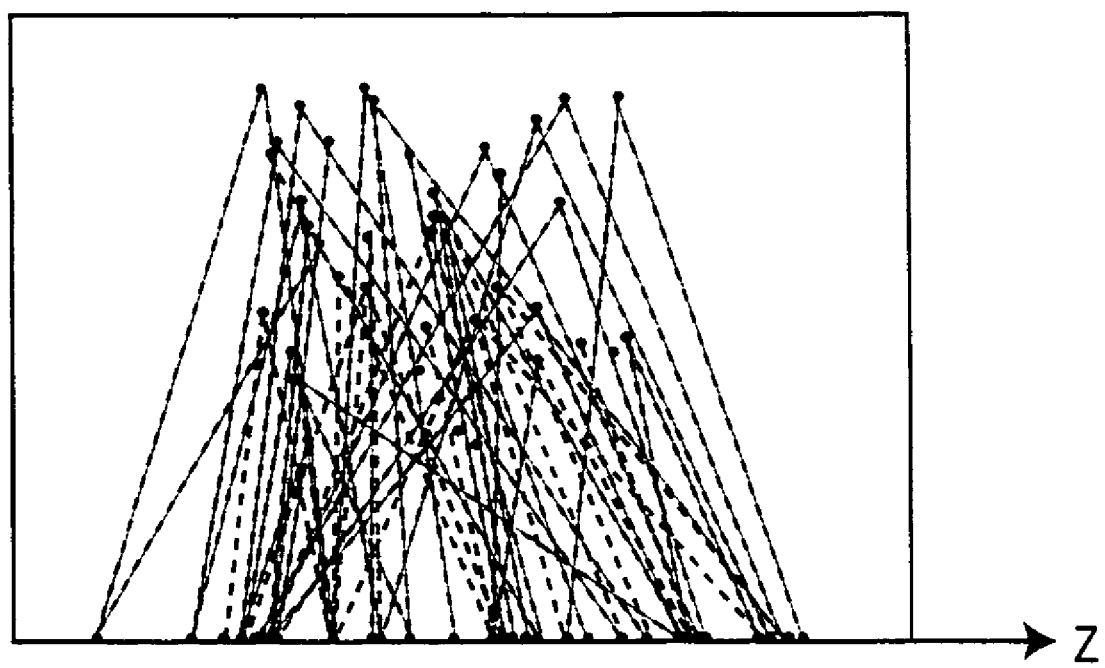
FIG. 49 shows an example of the paths of tasks according to a conventional technique.
Figure 50:
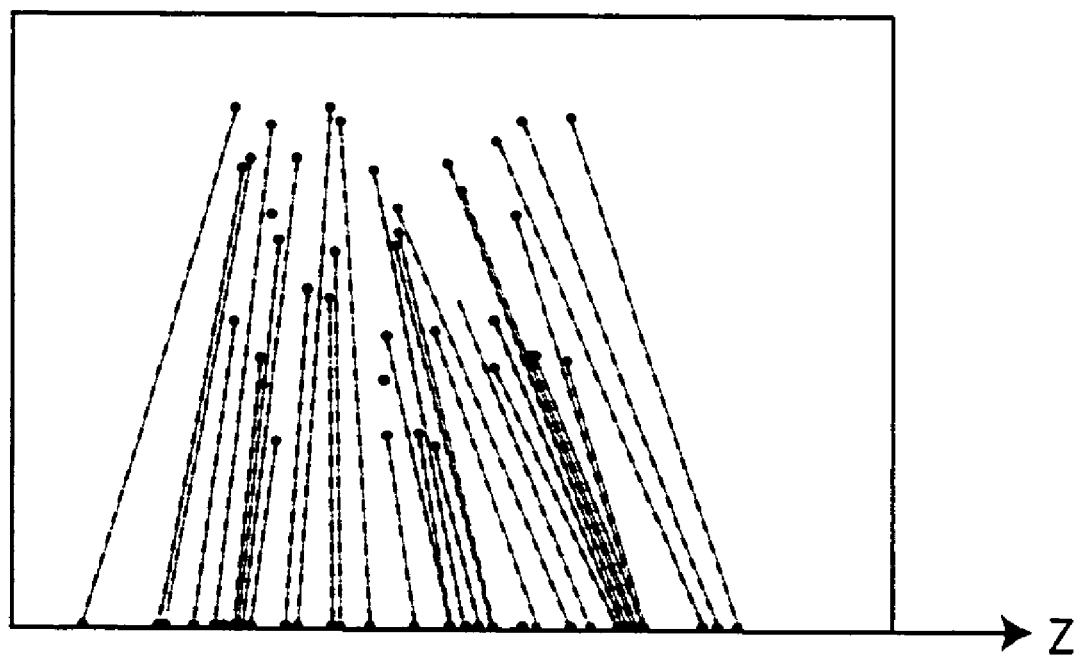
FIG. 50 shows an example of the trajectory of tasks according to the fourth embodiment.

Here, FIG. 49 shows an example of the paths for the tasks when a conventional technique is used. Furthermore, FIG. 50 shows an example of the paths for the tasks according to the fourth embodiment. Comparing these figures, it can be seen that less crossover between paths is evident according to the present invention.

Note that the optimization unit may determine the position for the cassette (or tray) of the component feeder for each component in the following manner.

The optimization unit may calculate, for a cassette Z1, a total movement path movement time from Z1 to all components of the component name A.

total path movement time of $Z1 = \Sigma(\text{speed} * \text{distance } i)$

Here, the speed is the movement speed of the head, and the distance i is the distance from the cassette Z1 of the component feeder to a component i of the component name A.

The optimization unit calculates the total path movement time for all cassettes (or trays) in the same way.

Next, the optimization unit selects the lowest of the calculated total path movement times, and uses the cassette (or tray) corresponding to the selected total path movement for the component of the component name A.

The optimization unit determines the cassette (or tray) for other components in the same way.

If a cassette (or tray) is selected more than once, the optimization unit selects a cassette (or tray) in descending order of component count.

5. Fifth Embodiment

The assembly system 1 of the fifth embodiment has the same structure as the assembly system 1 of the first embodiment.

The following focuses on describing the points that differ from the assembly system 1 of the first embodiment.

Figure 51:
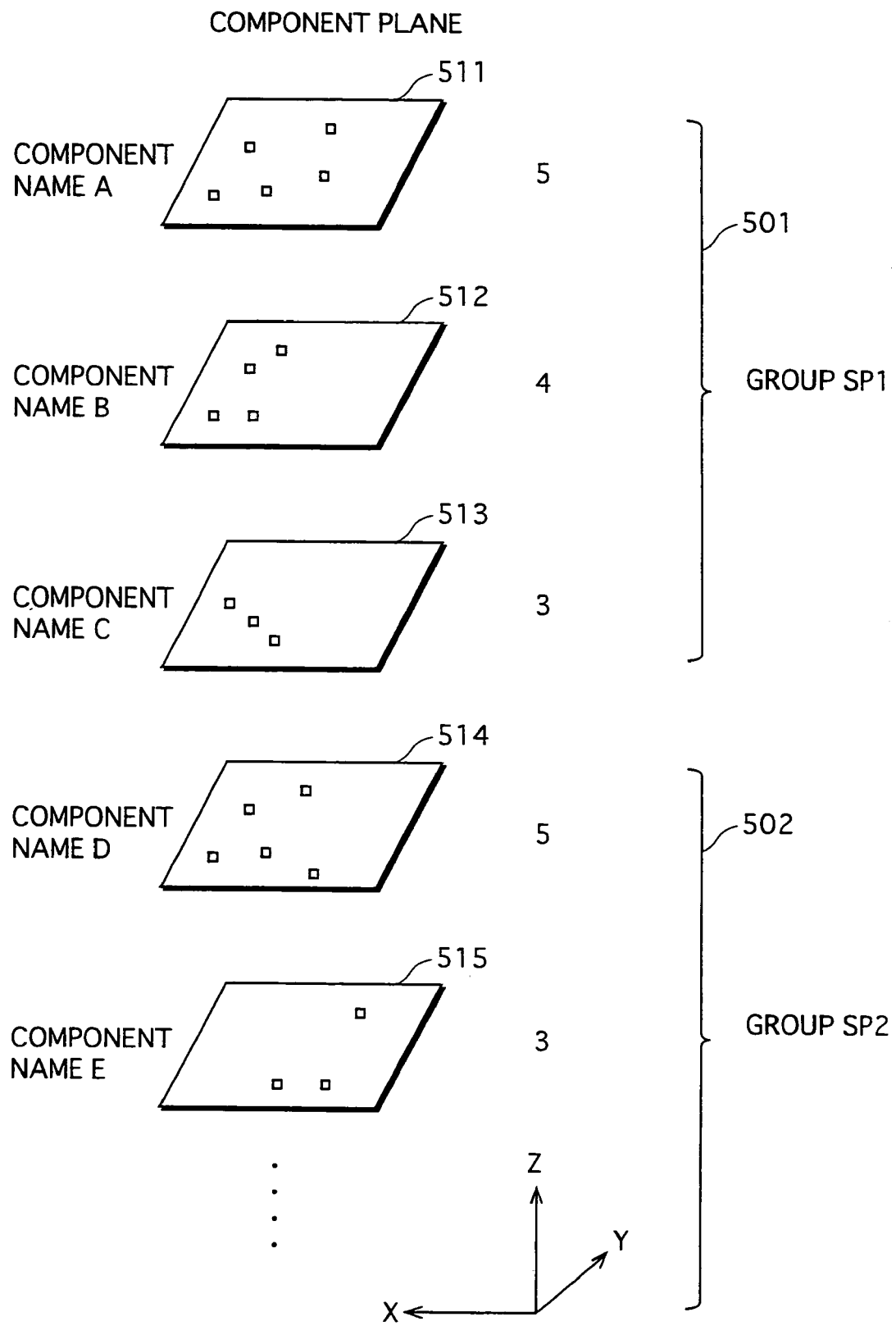
FIG. 51 shows a plurality of imaginary component planes.

The optimization apparatus 200 of the fifth embodiment works on the assumption that a circuit board plane is composed of a plurality of component planes as shown FIG. 51, each of which is formed for a different type of component, and rearranges the component planes, determines an optimal path within each component plane, and determines the order for placing the components on the circuit board by generating 3D paths that connect the component planes.

5.1 Structure of the Optimization Apparatus 200

The following describes the structure of the optimization apparatus 200.

(1) Optimization Unit 203

<Component Plane Generation>

The optimization unit 203 rearranges the pieces of component name information in the component name list based on XY speed and component count, so as to be in descending order of XY speed and descending order of component count. Here, the component name list is that shown in FIG. 21 with the addition of a component count in each piece of component name information, that indicates how many of the components indicated by the component name in the piece of component name information are to be placed on the circuit board. Next, the optimization unit 203 writes the rearranged component name information to a plane list.

The component name list generated in this way forms a plurality of groups. Each group includes component name information that includes the same XY speed, and the groups are arranged in descending order of XY speed.

Furthermore, the pieces of component name information in each group are arranged in descending order of total component count.

Next, the optimization unit 203 generates each component plane by treating each piece of component name information as being equivalent to a component plane.

The component planes generated in this way are shown in the schematic drawing in FIG. 51.

As shown in FIG. 51, component planes 511, 512, etc. correspond respectively to the pieces of component information including the component names A, B, etc. Component planes 511, 512 and 513 belong to a group SP1, and components 514, 515, etc. belong to a group SP2. SP1 and SP2 indicate respective XY speeds, and the XY speed of SP1 is greater than that of SP2. In each of the groups, the component planes are arranged in descending order of component count.

<Component Plane Rearrangement>

Figure 52:
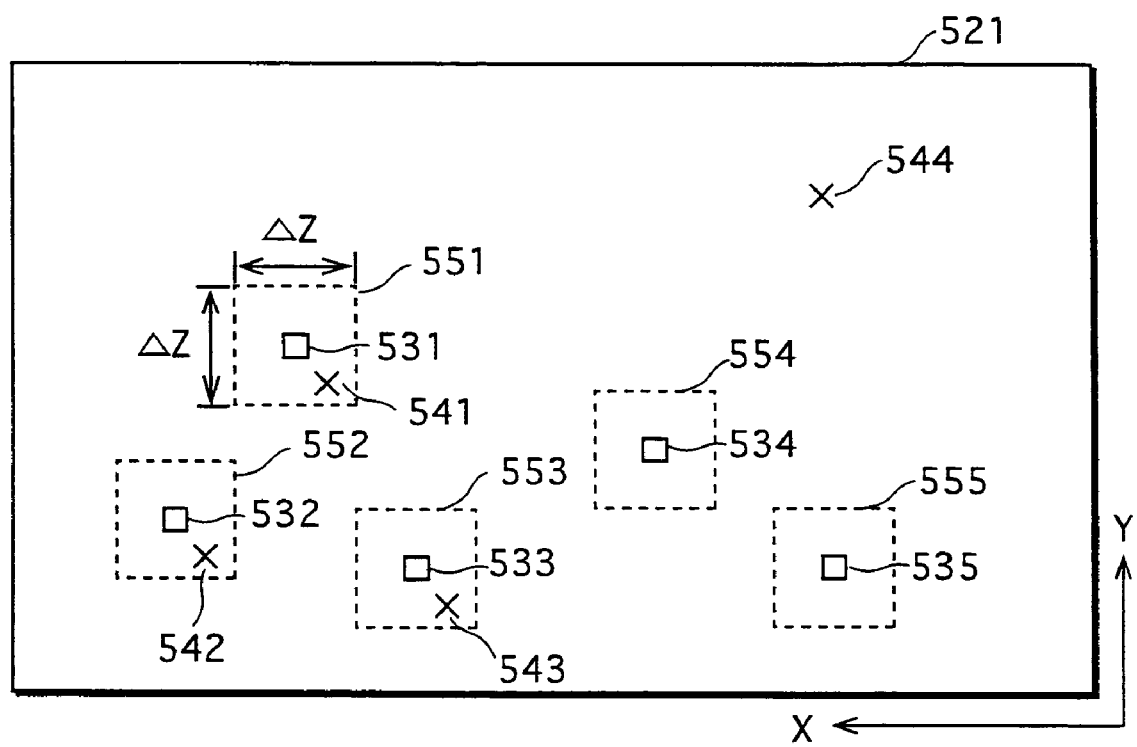
FIG. 52 shows positions in which electronic components are placed on an original component plane, and square areas.

The optimization unit 203, as shown in FIG. 52, selects one original component plane 521. Here, it is supposed that components identified by the component name A are to be placed in positions 531 to 535 on the original component plane 521.

The optimization unit 203 selects a next component plane from among remaining component planes. It is supposed that components identified by the component name B are placed in positions 541 to 544 on the next component plane.

In the original component plane 521, the optimization unit 203 sets square-shaped areas 551 to 555 respectively for the positions 531 to 535, the center of each square-shaped area 551 to 555 being the respective position 531 to 535, and each side of each area 551 to 555 being a length $\Delta Z$. Here, $\Delta Z$ indicates the movement amount of the component feeder from a component placed on the original component plane 521 to a component placed on the next component plane. Specifically, $\Delta Z$ is 1 second in terms of time and 15 mm in terms of distance.

Next, the optimization unit 203 judges whether or not any of the positions 541 to 544 are in the area 551, and counts how may of the positions 541 to 544 are in the area 551. In the same way, the optimization unit 203 counts the how many positions 541 to 544 are in each of the areas 552 to 555. The optimization unit 203 totals the counted number of positions, calculates a total number of candidates for an exit ("exit candidates") from the original component plane to the next component plane, and writes the calculated total exit candidates to an area that corresponds to an exist candidate list.

In the manner described above, the optimization unit 203 sets each component plane as an original plane, sets all other planes as next component planes, calculates a total number of exit candidates from each component plane to each next component plane, and writes each calculated number of exit candidates to the exit candidate list.

Next, the optimization unit 203 totals the number of exit candidates in the exit candidate list for each original component plane, and writes the calculated total number of exit candidates to the area corresponding to the exit candidate list. An example of the generated exit candidate list is shown in FIG. 54.

Next, the optimization unit 203 selects, from the exit candidate list, the original component plane having the least total number of exit candidates, and sets the original component plane selected in this way as a first component plane. The optimization unit 203 then selects the next component plane having the greatest number of exit candidates, and sets the next component plane selected in this way as a second component plane. By repeating this procedure, a plurality of component planes and their component planes are successively selected.

The following describes the aforementioned procedure, with use of the exit candidate list shown in FIG. 54 as an example.

1) The optimization unit 203 selects the original component plane having the lowest total number of exit candidates, from the exit candidate list. In the exit candidate list shown in FIG. 54, the exit candidate totals are "5", "4" and "3", the lowest exit candidate total being "3". Here, the original component planes D and E which both have an exit candidate total of "0" are excluded. The lowest exit candidate total of "3" is that of the original component plane C, and therefore the optimization unit 203 selects the original component plane C. The original component plane C selected in this way is set as the first component plane.

2) Next, the optimization unit 203 selects, for the selected original component plane C, the next component plane having the greatest exit candidate total. The exit candidate totals of the original component plane are "1", "2", "0" and "0". Since the greatest exit candidate total is "2", the optimization unit 203 selects the next component plane B, and sets the next component plane B selected in this way as the second component plane.

In this way, the order of two component planes is determined, i.e., component plane C, component plane B.

Subsequently, the optimization unit 203 repeats the described processing, resulting in the order of three component planes being determined, i.e., component plane C, component plane B, and then component plane A.

The optimization unit 203 rearranges the pieces of component information in the plane list so as to be in the order of component planes determined in this way.

Note that the order generated according to the exit candidate list shown as an example in FIG. 54 is, coincidentally, the same as the order in the plane list shown as an example in FIG. 53. Consequently, rearranging the pieces of component information included in the plane list does not change the order.

<Generation of Optimum Path Within the Component Plane>

The optimization unit 203 repeats the following processing for each component plane.

1) The optimization unit 203 selects one exit candidate in the component plane.

2) Next, the optimization unit 203 generates a cluster by linking all components in order starting from the selected exit candidate, so that the tact is a minimum.

3) If a path occurs that causes a loss in tact, the optimization unit 203 divides the path, and generates a plurality of clusters.

<3D Path Generation>

The optimization unit 203 generates paths connecting the clusters on each component plane in the Z axis direction, so that the Z movement is a minimum. Here, the exit candidate in each component plane is the point where the path leads to another component plane.

(2) Information Storage Unit 205

The information storage unit 205 has a plane list and an exit candidate list.

<Plane List>

The plane list, as shown in one example in FIG. 53, has an area for storing a plurality of pieces of component plane information, each of which is composed of a component name, an XY speed, a component count, and other items.

The component names, XY speed, and component count are the same as described earlier, and therefore a description thereof is omitted here.

<Exit Candidate List>

The exit candidate list, as shown in one example in FIG. 54, has an area for storing the number of exit candidates to the next component plane for each original component plane, and an area for storing the exit candidate total for each original component plane.

The number of exit candidates and the exit candidate total are as described earlier, and therefore a description thereof is omitted here.

5.2 Operations by the Optimization Apparatus 200

The following describes operations by the optimization apparatus 200.

(1) Outline of Overall Operations by the Optimization Apparatus 200

Figure 55:
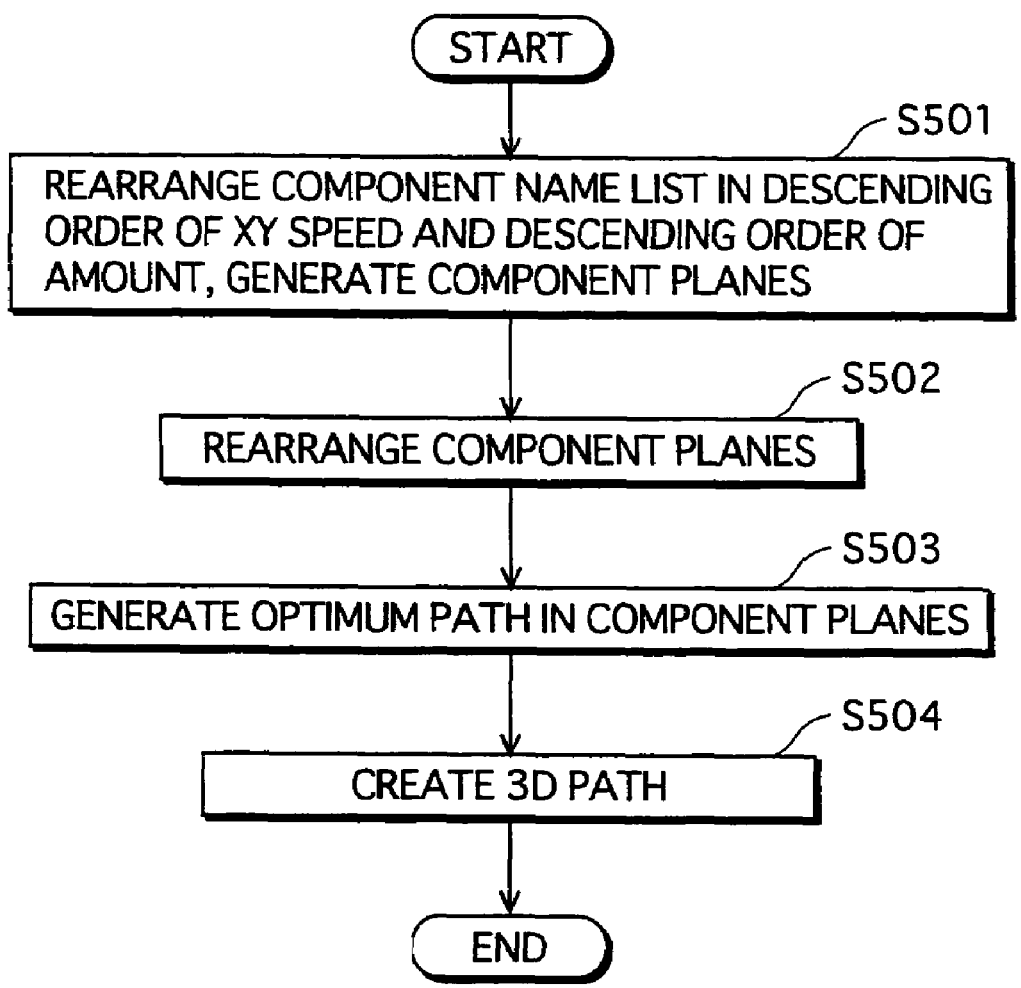
FIG. 55 is a flowchart showing an outline of overall operations by the optimization apparatus 200.

The following describes an outline of overall operations by the optimization unit 200, with use of the flowchart in FIG. 55.

The optimization unit 203 rearranges the component name list so as to be in descending order of XY speed and descending order of component count, and generates component planes (step S501). The optimization unit 203 rearranges the component planes and generates a plane list (step S502), generates the optimum path in the component plane, thereby generating a cluster (step S503), and generates a 3D path by generating paths that connect the clusters in each plane in the Z axis direction, so that Z movement is a minimum (step S504).

(2) Operations for Rearranging the Component Planes

Figure 56:
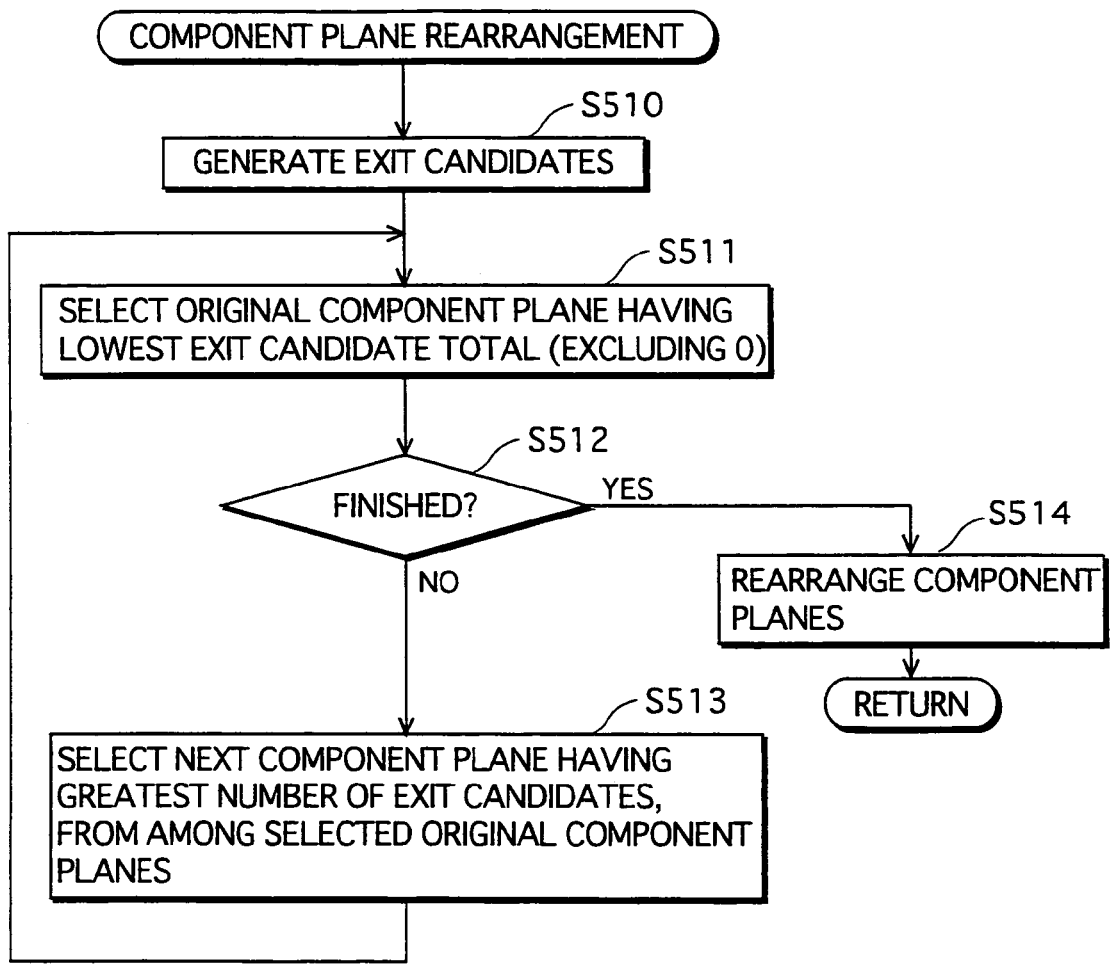
FIG. 56 is a flowchart showing operations for rearranging component planes.

The following describes operations for rearranging the component planes, with use of the flowchart in FIG. 56.

The optimization unit 203 generates an exit candidate list (step S510), selects the original component plane having the lowest exit candidate total (step S511), and when finished selecting (step S512), rearranges the pieces of component information in the plane list, according to the order of the selected component planes (step S514), and ends there arrangement processing.

If the selection is not finished (step S512), the optimization unit 203 selects, from among the selected original component planes, the former component candidate having the greatest amount of exit candidates (step S513), and returns to step S511 and repeats the processing.

(3) Optimum Path Generation in Component Planes

Figure 57:
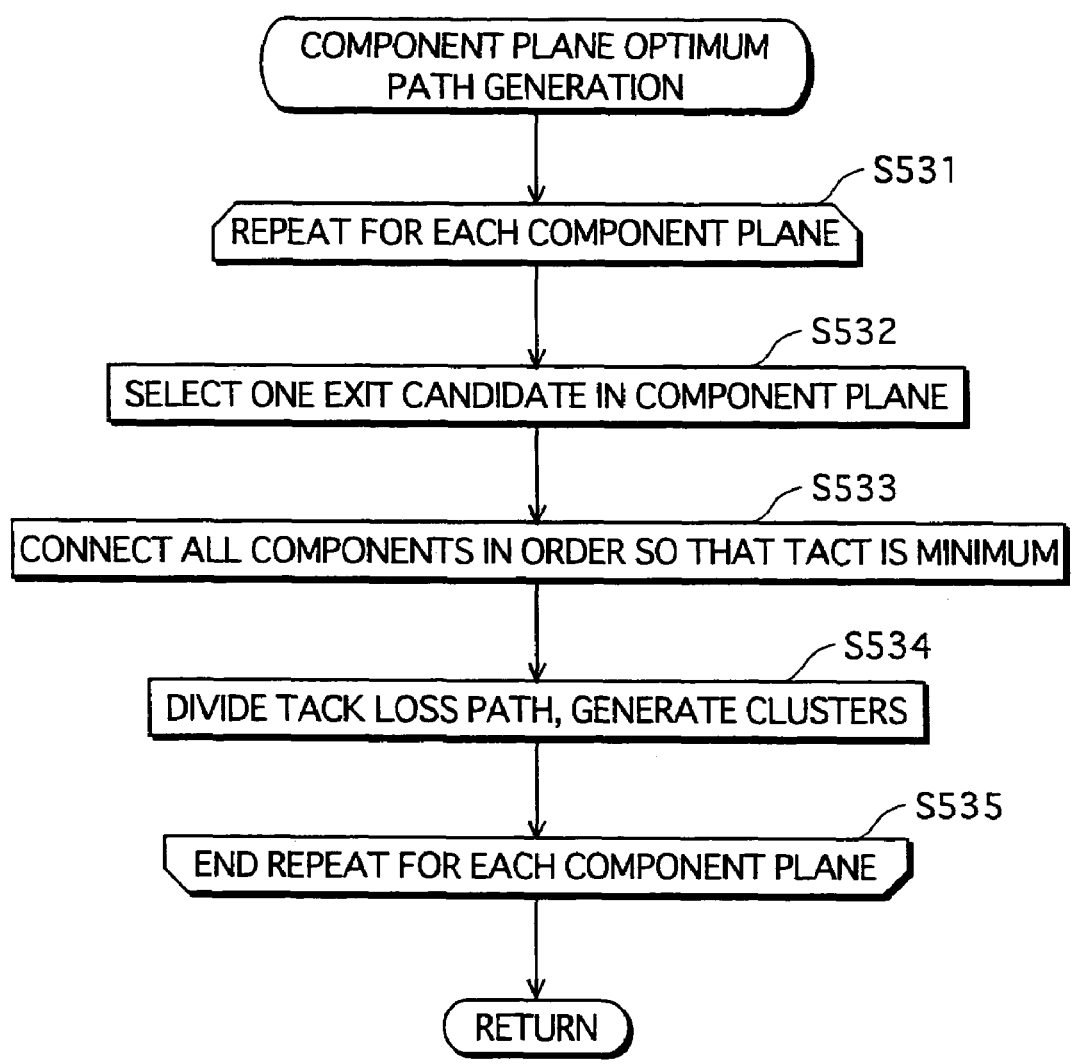
FIG. 57 is a flowchart showing operations for generating optimum paths in component planes.

The following describes operations for generating optimization paths in the component planes, with use of the flowchart in FIG. 57.

The optimization unit 203 repeats the processing from steps S531 to S535 for each component plane.

The optimization unit 203 selects one exit candidate from the component plane (step S532), and generates one cluster by linking all components in order starting from the selected exit candidate, so that the tact is a minimum (step S533). If there is a loss in tact, the optimization unit 203 divides the path that is the cause of the tact loss, thereby generating a plurality of clusters (step S534).

5.3 Conclusion

According to the fifth embodiment, imaginary component planes are generated for each type of electronic component and arranged in a predetermined order, the order of the component planes is rearranged, an optimum path connecting each component in the component plane is generated, and a 3D path that connects the component planes is generated by connecting the path in each component plane with the path in another component plane. This enables the shortest path to be determined, and enables the next electronic component to be placed to be determined in the Z movement tact.

6. Other Embodiments

The present invention has been described based on the above preferred embodiment, however the present invention is not limited to these preferred embodiments. The following cases are included in the present invention.

(1) The present invention may be methods shown by the above. Furthermore, the methods may be a computer program realized by a computer, and may be a digital signal of the computer program.

Furthermore, the present invention may be a computer-readable recording medium such as a flexible disk, a hard disk, a CD-ROM, an MO, a DVD-ROM, a DVD-RAM or a semiconductor memory, that stores the computer program or the digital signal. Furthermore, the present invention may be the computer program or the digital signal recorded on any of the aforementioned recording media.

Furthermore, the present invention may be the computer program or the digital signal transmitted on a electric communication line, a wireless or wired communication line, or a network of which the Internet is representative.

Furthermore, the present invention may be a computer system that includes a microprocessor and a memory, the memory storing the computer program, and the microprocessor operating according to the computer program.

Furthermore, by transferring the program or the digital signal to the recording medium apparatus, or by transferring the program or the digital signal via a network or the like, the program or the digital signal may be executed by another independent computer system.

(2) The present invention may be any combination of the above-described embodiment and modifications. 7. Effects of the invention As described, the present invention is the present invention is an optimization apparatus in an electronic component placement system further including two or more placement apparatuses that place electronic components on a circuit board, the optimization apparatus optimizing a placement order in which the electronic components are placed on the circuit board by the placement apparatuses and including: a first assignment unit operable to assign each type of electronic component to one of the placement apparatuses, thereby determining a first assignment for each type of electronic component; a first calculation unit operable to calculate, for each placement apparatus, a first placement time required for the placement apparatus to place all electronic components assigned thereto according to the first assignments on the circuit board; a second assignment unit operable to select two placement apparatuses from the placement apparatuses, select, for each of the two selected placement apparatuses, one type of electronic component that has been assigned to the placement apparatus, and determine a second assignment by swapping the two selected types of electronic components between the two placement apparatuses; a second calculation unit operable to calculate, for each of the two placement apparatuses, a second placement time required for the placement apparatus to place all electronic components assigned thereto according to the second assignment on the circuit board; and an adoption determination unit operable to determine adoption of one of the first assignment and the second assignment that enables a shortest placement time, by comparing a greatest first placement time and a greatest second placement time from among the first placement times and the second placement times calculated for the two placement apparatuses selected for interchanging by the second assignment unit.

According to the stated structure, an effect is achieved of placement times being more even between placement apparatuses.

Here, the first assignment unit may include: a component count storage sub-unit operable to store, for each type of electric component, a component count of electronic components of the type; a placement time calculation sub-unit operable to calculate (i) for one electrical component of each type and for each placement apparatus, a reference placement time required for the placement apparatus to place the electrical component, and (ii) for each type of electrical component and for each placement apparatus, using the component count of the type, a placement time required for the placement apparatus to place all electronic components of the type on the circuit board; and an assignment determination sub-unit operable to determine, using the placement times calculated for each of the placement apparatuses for each type of electronic component, an assignment of electronic components of the type to one of the placement apparatuses.

According to the stated structure, the electronic components are assigned to the placement apparatuses based on a total placement time calculated using the reference placement time determined for each type of electric component and the component count. Therefore, electronic components can be reliably assigned to the placement apparatuses.

Here, the second assignment unit may assign a type of electronic component, from among the types of electronic components, that can only be placed by a particular placement apparatus to the particular placement apparatus, the assignment being performed with priority over other types of electronic components.

According to the stated structure, a particular type of electronic component is assigned to a particular placement apparatus. Therefore, the electronic components of the particular type can be reliably placed on the circuit board.

Here, the second assignment unit may assign a type of electronic component that has, from among the placement times calculated for each placement apparatus and each type of electronic component, a placement time smaller than a predetermined value, to a placement apparatus that is upstream-most among placement apparatuses having a placement time smaller than a predetermined value, the assignment being performed with priority over other types of electronic components and other placement apparatuses.

According to the stated structure, electronic components having the shortest placement time are assigned to the placement apparatus located upstream-most. Therefore, electronic components that are placed at high speed are assigned to the placement apparatus that is closer to the upstream side, and electronic components that are placed at low speed are assigned to the placement apparatus that is closer to the downstream side.

Here, each of the first calculation unit and the second calculation unit may include: a component count storage sub-unit operable to store, for each electronic component type assigned to the placement apparatuses, a component count that indicates how many electronic components of the type are to be placed on the circuit board; a total time calculation sub-unit operable to calculate, for each placement apparatus, a total placement time indicating a total time for placing all electronic components assigned to the placement apparatus; and a placement time calculation sub-unit operable to calculate, for each placement apparatus and each type of electronic component, a placement time for all electronic components of the type assigned to the placement apparatus, by multiplying the calculated total placement time by the component count of the type of electronic component, and then dividing by a component count of all electronic components assigned to the placement apparatus, wherein the first calculation unit and the second calculation unit set the respective calculated placement times as the first placement times and the second placement times, respectively.

According to the stated structure, a placement time is calculated for each type of electronic component assigned to the placement apparatuses, by multiplying the calculated total placement time with the component count of the electronic component type, and dividing by a component count of all electronic components assigned to the placement apparatus. Therefore, a placement time that is closer to the actual placement time can be calculated. Here, each of the first calculation unit and the second calculation unit may include a request output sub-unit, tact calculation sub-units equal in number to the placement apparatuses, and a placement time reception sub-unit, the tact calculation sub-units corresponding respectively to the placement apparatuses, wherein the request generation sub-unit outputs to each placement apparatus, a type identifier identifying a type of electronic component, and a component count of electronic components assigned to the placement apparatus, each tact calculation sub-unit calculates, based on the output type identifier and component count, a time required for the corresponding placement apparatus to place the electronic components on the circuit board, and outputs the calculated placement time, the placement time reception sub-unit receives each placement time, and the first calculation unit and the second calculation unit set the respective received placement times as the first placement times.

According to the stated structure, each of the first calculation unit and the second calculation unit has tact calculation sub-units that correspond to the placement apparatuses. Therefore, appropriate placement times that can be calculated in accordance with the structure of the placement apparatuses.

Here, each of the first calculation unit and the second calculation unit may include a request output sub-unit and a placement time reception sub-unit, and each placement apparatus may include a tact calculation unit, wherein the request generation sub-unit outputs to each placement apparatus, a type identifier identifying a type of electronic component, and a component count of electronic components assigned to the placement apparatus, each tact calculation unit calculates, based on the output type identifier and component count, a time required for the placement apparatus to place the electronic components on the circuit board, and outputs the calculated placement time, the placement time reception sub-unit receives each placement time, and the first calculation unit and the second calculation unit set the respective received placement times as the first placement times.

According to the stated structure, each placement apparatus has corresponding tact calculation units. Therefore, appropriate placement times that can be calculated in accordance with the structure of the placement apparatuses.

Here, each of the first calculation unit and the second calculation unit may include a request output sub-unit, conversion sub-units, tact calculation sub-units, reverse conversion sub-units, and a placement time reception sub-unit, the conversion sub-units, the tact calculation sub-units and the reversion conversion sub-units being equal in number to and corresponding respectively to the placement apparatuses, wherein the request generation sub-unit outputs to each placement apparatus, a type identifier identifying a type of electronic component, and a component count of electronic components assigned to the placement apparatus, each conversion unit coverts the output type identifier and component count to a format compatible with the corresponding placement apparatus, each tact calculation sub-unit calculates, based on the converted type identifier and component count, a time required for the corresponding placement apparatus to place the electronic components on the circuit board, and outputs the calculated placement time, each reverse conversion sub-unit converts the output placement time to a format compatible with the optimization apparatus, the placement time reception sub-unit receives the converted placement times, and the first calculation unit and the second calculation unit set the respective received, converted placement times as the first placement times.

According to the stated structure, the conversion sub-units and the reverse conversion sub-units perform conversion and reverse conversion for each placement apparatus. Therefore, information can be converted and reverse converted according to a data format unique to each placement apparatus.

Furthermore, the present invention is, in an electronic component placement system composed of at least one placement apparatus that places electronic components on a circuit board, an information generation apparatus for changing movement speed information relating to the circuit board when the electronic components are placed thereon, and including: a movement speed storage unit operable to store circuit board movement speed information for each type of electronic component; an assignment storage unit operable to store, for each type of electronic component, an assignment of the type of electronic component type to one of the placement apparatuses; a selection unit operable to select, from the plurality of placement apparatuses, two adjacent placement apparatuses; an extraction unit operable to extract slowest movement speed information having a slowest movement speed among electronic component types assigned to a placement apparatus that is located upstream-most of the two selected placement apparatuses; an extraction unit operable to extract movement speed information having a faster movement speed than the extracted slowest movement speed information from among electronic component types assigned to a placement apparatus that is located downstream-most of the two selected placement apparatuses; and a replacement unit operable to replace the extracted movement speed information with the slowest movement speed information, in the movement speed information storage unit.

According to the stated structure, an electronic component information table in which the XY speed of the downstream process apparatus is arranged so as not to exceed the XY speed of the upstream process apparatus.

Furthermore, the present invention is an optimization apparatus for optimizing an electronic component placement order used in a placement apparatus in which a feeder that supplies at least one electronic component of at least one type of electronic component moves to a suction position of a placement head, and the placement head picks up electronic components from the feeder and places the electronic components on a circuit board, the optimization apparatus including: a first selection unit operable to select one of the electronic components and set the electronic component as a first electronic component; a calculation unit operable to select electronic components other than the first electronic component one at a time, set the selected electronic component as a second electronic component, and calculate (a) a head movement time required for the placement head of the placement apparatus to move relatively from a position where the first electronic component is to be placed to a position where the second electronic component is to be placed, (b) a feeder movement time required for a feeder that supplies the second electronic component to move to the placement head suction position if the second electronic is to be placed, and (c) a return movement time required for a feeder that supplies the first electronic component to move to the placement head suction position after the second electronic component is placed; and a selection unit operable to select, based on the head movement times, feeder movement times and return movement times calculated for all electronic components other than the first electronic component, an electronic component from among all the electronic components, other than the first electronic component, that is to be placed next after the first electronic component.

According to the stated structure, the feeder that supplies electronic components does not make large movements, and tact loss can be reduced.

Here, the selection unit includes an operation sub-unit operable, for each electronic component other than the first electronic component, to calculate a value that is a total of (a) twice the return time and (b) the feeder movement time, and adopt the greater of the calculated head movement time and the calculated value; and an electronic component selection sub-unit operable to select, as a next electronic component to be placed after the first electronic component, an electronic component corresponding to a smallest value among all the values adopted by the operation sub-unit for the electronic components other than the first electronic component.

According to the stated structure, a value that is the total of twice a return time and a feeder movement time is calculated, and a value which is the greater of a calculated head movement time and the calculated value is adopted. Therefore, the placement time can be predicted with more accuracy.

Here, the placement apparatus includes a rotary placement head, and the selection unit selects one electronic component based on the calculated head movement times, feeder movement times, return movement times, and a rotary placement head half-rotation time.

According to the stated structure, the placement time in a placement apparatus that has a rotary placement head can be predicted with more accuracy.

Furthermore, the present invention is an optimization apparatus for optimizing an electronic component placement order used in a placement apparatus that places electronic components on a circuit board by repeatedly performing tasks until all electronic components to be placed have been placed, each task being composed of: a feeder that supplies at least one electric component of at least one type of electronic component moving to a suction position of a placement head that includes at least one nozzle, and the placement head picking up at least one electronic component from the feeder and placing the at least one picked up electronic component on a circuit board, the optimization apparatus including: a task information storage unit operable to store task information for each task, each task information including (a) a placement order of electronic components in the task, (b) placement positions, each of which indicates where a different one of the electronic components is to be placed, and (c) a feeder position indicating a position of the feeder that supplies the electronic components; a first generation unit operable to generate an X coordinate list by rearranging the task information for all tasks so as to be in descending order of X coordinate of placement position of an electronic component last in the placement order in each task information; a second generation unit operable to generate a Z coordinate list by rearranging the task information so as to be in ascending order of a greatest feeder position in each task information; and an assignment unit operable to alternately select a task from a top of the X coordinate list and a top of the Z coordinate list in the stated order, and assign each task a position in the placement order according to an order in which the tasks were selected.

According to the stated structure, tasks are selected alternately from the top of the X coordinate list and the top of the Z coordinate list, and the tasks are given a position in the placement order according to the order in which the tasks were selected. This has an effect of reducing crossover between the paths of the tasks.

Here, the optimization apparatus further includes: a calculation unit operable to calculate a first total movement amount that indicates a distance that the head moves if all tasks are executed in the placement order assigned by the assignment unit; a task selection unit operable to select two tasks; an interchange unit operable to swap the two selected tasks with each other in the placement order; a calculation unit operable to calculate a second total movement amount that indicates a distance that the head moves if all tasks are executed in the placement order in which the interchange unit has interchanged the two tasks; and an adoption sub-unit operable to adopt a placement order of all tasks that corresponds to a smaller of the first total movement amount and the second total movement amount.

According to the stated structure, a placement order with an even shorter placement time can be employed.

Furthermore, the present invention is an optimization apparatus for optimizing an electronic component placement order used in a placement apparatus in which a feeder that supplies at least one electronic component of at least one type of electronic component move to a suction position of a placement head, and the placement head picks up electronic components from the feeder and places the electronic components on a circuit board, the optimization apparatus including: a plane generation unit operable to generate, for each electronic component type, an imaginary component plane that includes positions in which electronic components of the type are to be placed, and arrange the generated component planes in a predetermined order; a rearrangement unit operable to rearrange the component planes; an optimum path generation unit operable to generate, within each component plane, an optimum path that connects the components on the component plane; and a 3D path generation unit operable to generate a 3D path that connects the component planes, by connecting the path within each component plane with the paths within other component planes.

According to the stated structure, an imaginary component plane is generate for each type of electronic component, and the component planes are arranged in a predetermined order. Then, the order of the component planes is switched, and in each component plane an optimum path is generated that connects the electronic components in the component plane. Next, the paths in the component planes are connected to each other with 3D paths. This enables the shortest path to be determined.

Here, the rearrangement unit includes an extraction sub-unit operable to extract, for each component plane, an exit electronic component, the exit electronic component being an electronic component for which the placement head movement time from the exit component on an original component plane that is the component plane, to an electronic component on a next component plane that is another component plane, is within a feeder movement time; a calculation sub-unit operable to calculate, for each original component plane and each next component plane, an exit candidate count that is a total number of exit electronic components, and calculate, for each original component plane, an exit candidate total that is a total number of exit electronic components; a selection sub-unit operable to select an original component plane having a smallest exit candidate total and set the selected original component plane as a first component plane, and select a next component plane that has a greatest exit candidate count with respect to selected the first component plane, and set the selected next component plane as a second component plane; and a component plane interchange sub-unit operable to interchange the first component plane and the second component plane in a component plane order. Furthermore, the extraction unit sets a square-shaped area, each side of the square-shaped area being a length corresponding to a movement time of a feeder, and a center of the square-shaped area being a position where an exit electronic component is to be placed, and, if an electronic component on the next component plane falls within the set square area, judges that the placement head movement time is less than the feeder movement time.

According to the stated structure, the next electronic component to be mounted within the Z movement tact can be determined.

Furthermore, the present invention is, in an electronic component placement system composed of at least one placement apparatus that places electronic components on a circuit board, an information generation apparatus for changing movement speed information relating to the circuit board when the electronic components are placed thereon, and including: a movement speed storage unit operable to store circuit board movement speed information for each type of electronic component; an assignment storage unit operable to store, for each type of electronic component, an assignment of the type of electronic component type to one of the placement apparatuses; a selection unit operable to select, from the plurality of placement apparatuses, two adjacent placement apparatuses; an extraction unit operable to extract slowest movement speed information having a slowest movement speed among electronic component types assigned to a placement apparatus that is located upstream-most of the two selected placement apparatuses; an extraction unit operable to extract movement speed information having a faster movement speed than the extracted slowest movement speed information from among electronic component types assigned to a placement apparatus that is located downstream-most of the two selected placement apparatuses; and a replacement unit operable to replace the extracted movement speed information with the slowest movement speed information, in the movement speed information storage unit.

Furthermore, the present invention is, in an electronic component placement system composed of at least one placement apparatus that places electronic components on a circuit board, an information generation apparatus for changing tact information relating to the circuit board when the electronic components are placed thereon, and includes: a tact storage unit operable to store circuit board tact information for each type of electronic component; an assignment storage unit operable to store, for each type of electronic component, an assignment of the type of electronic component type to one of the placement apparatuses; a selection unit operable to select, from the plurality of placement apparatuses, two adjacent placement apparatuses; an extraction unit operable to extract slowest tact information having a slowest tact among electronic component types assigned to a placement apparatus that is located upstream-most of the two selected placement apparatuses; an extraction unit operable to extract tact information having a faster tact than the extracted slowest tact information from among electronic component types assigned to a placement apparatus that is located downstream-most of the two selected placement apparatuses; and a replacement unit operable to replace the extracted tact information with the slowest tact information, in the tact information storage unit.

Furthermore, the present invention is a computer-readable recording medium storing thereon circuit board movement speed information relating to different types of electronic component, and storing thereon movement speed information that has been replaced by the information generation apparatus.

Furthermore, the present invention is, in an electronic component placement system composed of at least one placement apparatus that places electronic components on a circuit board, an information generation method used in an information generation apparatus for changing movement speed information relating to the circuit board when the electronic components are placed thereon, the information generation apparatus including: a movement speed storage unit operable to store circuit board movement speed information for each type of electronic component; and an assignment storage unit operable to store, for each type of electronic component, an assignment of the type of electronic component type to one of the placement apparatuses, and the information generation method including: a selection step of selecting, from the plurality of placement apparatuses, two adjacent placement apparatuses; an extraction step of extracting slowest movement speed information having a slowest movement speed among electronic component types assigned to a placement apparatus that is located upstream-most of the two selected placement apparatuses; an extraction step of extracting movement speed information having a faster movement speed than the extracted slowest movement speed information from among electronic component types assigned to a placement apparatus that is located downstream-most of the two selected placement apparatuses; and a replacement unit operable to replace the extracted movement speed information with the slowest movement speed information, in the movement speed information storage unit.

Furthermore, the present invention is, in an electronic component placement system composed of at least one placement apparatus that places electronic components on a circuit board, an information generation program used in a computer for changing movement speed information relating to the circuit board when the electronic components are placed thereon, the computer including: a movement speed storage unit operable to store circuit board movement speed information for each type of electronic component; and an assignment storage unit operable to store, for each type of electronic component, an assignment of the type of electronic component type to one of the placement apparatuses, and the information generation method including: a selection step of selecting, from the plurality of placement apparatuses, two adjacent placement apparatuses; an extraction step of extracting slowest movement speed information having a slowest movement speed among electronic component types assigned to a placement apparatus that is located upstream-most of the two selected placement apparatuses; an extraction step of extracting movement speed information having a faster movement speed than the extracted slowest movement speed information from among electronic component types assigned to a placement apparatus that is located downstream-most of the two selected placement apparatuses; and a replacement unit operable to replace the extracted movement speed information with the slowest movement speed information, in the movement speed information storage unit.

Furthermore, the present invention is, in an electronic component placement system composed of at least one placement apparatus that places electronic components on a circuit board, an a computer-readable recording medium having recorded thereon an information generation program used in a computer for changing movement speed information relating to the circuit board when the electronic components are placed thereon, the computer including: a movement speed storage unit operable to store circuit board movement speed information for each type of electronic component; and an assignment storage unit operable to store, for each type of electronic component, an assignment of the type of electronic component type to one of the placement apparatuses, and the information generation program including: a selection step of selecting, from the plurality of placement apparatuses, two adjacent placement apparatuses; an extraction step of extracting slowest movement speed information having a slowest movement speed among electronic component types assigned to a placement apparatus that is located upstream-most of the two selected placement apparatuses; an extraction step of extracting movement speed information having a faster movement speed than the extracted slowest movement speed information from among electronic component types assigned to a placement apparatus that is located downstream-most of the two selected placement apparatuses; and a replacement unit operable to replace the extracted movement speed information with the slowest movement speed information, in the movement speed information storage unit.

Furthermore, the present invention is an optimization apparatus for optimizing an electronic component placement order used in a placement apparatus in which a feeder that supplies at least one electronic component of at least one type of electronic component moves to a suction position of a placement head, and the placement head picks up electronic components from the feeder and places the electronic components on a circuit board, the optimization apparatus including: a first selection unit operable to select one of the electronic components and set the electronic component as a first electronic component; a calculation unit operable to select electronic components other than the first electronic component one at a time, set the selected electronic component as a second electronic component, and calculate (a) a head movement time required for the placement head of the placement apparatus to move relatively from a position where the first electronic component is to be placed to a position where the second electronic component is to be placed, (b) a feeder movement time required for a feeder that supplies the second electronic component to move to the placement head suction position if the second electronic is to be placed, and (c) a return movement time required for a feeder that supplies the first electronic component to move to the placement head suction position after the second electronic component is placed; and a selection unit operable to select, based on the head movement times, feeder movement times and return movement times calculated for all electronic components other than the first electronic component, an electronic component from among all the electronic components, other than the first electronic component, that is to be placed next after the first electronic component.

Here, the selection unit includes an operation sub-unit operable, for each electronic component other than the first electronic component, to calculate a value that is a total of (a) twice the return time and (b) the feeder movement time, and adopt the greater of the calculated head movement time and the calculated value; and an electronic component selection sub-unit operable to select, as a next electronic component to be placed after the first electronic component, an electronic component corresponding to a smallest value among all the values adopted by the operation sub-unit for the electronic components other than the first electronic component.

Here, the placement apparatus includes a rotary placement head, and the selection unit selects one electronic component based on the calculated head movement times, feeder movement times, return movement times, and a rotary placement head half-rotation time.

Furthermore, the present invention is an optimization method used in an optimization apparatus for optimizing an electronic component placement order used in a placement apparatus in which a feeder that supplies at least one electronic component of at least one type of electronic component moves to a suction position of a placement head, and the placement head picks up electronic components from the feeder and places the electronic components on a circuit board, the optimization method including: a first selection step of selecting one of the electronic components and set the electronic component as a first electronic component; a calculation step of selecting electronic components other than the first electronic component one at a time, setting the selected electronic component as a second electronic component, and calculating (a) ahead movement time required for the placement head of the placement apparatus to move relatively from a position where the first electronic component is to be placed to a position where the second electronic component is to be placed, (b) a feeder movement time required for a feeder that supplies the second electronic component to move to the placement head suction position if the second electronic is to be placed, and (c) are turn movement time required for a feeder that supplies the first electronic component to move to the placement head suction position after the second electronic component is placed; and a selection step of selecting, based on the head movement times, feeder movement times and return movement times calculated for all electronic components other than the first electronic component, an electronic component from among all the electronic components, other than the first electronic component, that is to be placed next after the first electronic component.

Furthermore, the present invention is an optimization program used in a computer for optimizing an electronic component placement order used in a placement apparatus in which a feeder that supplies at least one electronic component of at least one type of electronic component moves to a suction position of a placement head, and the placement head picks up electronic components from the feeder and places the electronic components on a circuit board, the optimization program including: a first selection step of selecting one of the electronic components and set the electronic component as a first electronic component; a calculation step of selecting electronic components other than the first electronic component one at a time, setting the selected electronic component as a second electronic component, and calculating (a) a head movement time required for the placement head of the placement apparatus to move relatively from a position where the first electronic component is to be placed to a position where the second electronic component is to be placed, (b) a feeder movement time required for a feeder that supplies the second electronic component to move to the placement head suction position if the second electronic is to be placed, and (c) a return movement time required for a feeder that supplies the first electronic component to move to the placement head suction position after the second electronic component is placed; and a selection step of selecting, based on the head movement times, feeder movement times and return movement times calculated for all electronic components other than the first electronic component, an electronic component from among all the electronic components, other than the first electronic component, that is to be placed next after the first electronic component.

Furthermore, the present invention is a computer-readable recording medium having recorded thereon an optimization program used in a computer for optimizing an electronic component placement order used in a placement apparatus in which a feeder that supplies at least one electronic component of at least one type of electronic component moves to a suction position of a placement head, and the placement head picks up electronic components from the feeder and places the electronic components on a circuit board, the optimization program including: a first selection step of selecting one of the electronic components and set the electronic component as a first electronic component; a calculation step of selecting electronic components other than the first electronic component one at a time setting the selected electronic component as a second electronic component, and calculating (a) a head movement time required for the placement head of the placement apparatus to move relatively from a position where the first electronic component is to be placed to a position where the second electronic component is to be placed, (b) a feeder movement time required for a feeder that supplies the second electronic component to move to the placement head suction position if the second electronic is to be placed, and (c) a return movement time required for a feeder that supplies the first electronic component to move to the placement head suction position after the second electronic component is placed; and a selection step of selecting, based on the head movement times, feeder movement times and return movement times calculated for all electronic components other than the first electronic component, an electronic component from among all the electronic components, other than the first electronic component, that is to be placed next after the first electronic component.

Furthermore, the present invention is an optimization apparatus for optimizing an electronic component placement order used in a placement apparatus that places electronic components on a circuit board by repeatedly performing tasks until all electronic components to be placed have been placed, each task being composed of: a feeder that supplies at least one electric component of at least one type of electronic component moving to a suction position of a placement head that includes at least one nozzle, and the placement head picking up at least one electronic component from the feeder and placing the at least one picked up electronic component on a circuit board, the optimization apparatus including: a task information storage unit operable to store task information for each task, each task information including (a) a placement order of electronic components in the task, (b) placement positions, each of which indicates where a different one of the electronic components is to be placed, and (c) a feeder position indicating a position of the feeder that supplies the electronic components; a first generation unit operable to generate an X coordinate list by rearranging the task information for all tasks so as to be in descending order of X coordinate of placement position of an electronic component last in the placement order in each task information; a second generation unit operable to generate a Z coordinate list by rearranging the task information so as to be in ascending order of a greatest feeder position in each task information; and an assignment unit operable to alternately select a task from a top of the X coordinate list and a top of the Z coordinate list in the stated order, and assign each task a position in the placement order according to an order in which the tasks were selected.

Here, the optimization apparatus further includes: a calculation unit operable to calculate a first total movement amount that indicates a distance that the head moves if all tasks are executed in the placement order assigned by the assignment unit; a task selection unit operable to select two tasks; an interchange unit operable to swap the two selected tasks with each other in the placement order; a calculation unit operable to calculate a second total movement amount that indicates a distance that the head moves if all tasks are executed in the placement order in which the interchange unit has interchanged the two tasks; and an adoption subunit operable to adopt a placement order of all tasks that corresponds to a smaller of the first total movement amount and the second total movement amount.

Furthermore, the present invention is an optimization method used in an optimization apparatus for optimizing an electronic component placement order used in a placement apparatus that places electronic components on a circuit board by repeatedly performing tasks until all electronic components to be placed have been placed, each task being composed of: a feeder that supplies at least one electric component of at least one type of electronic component moving to a suction position of a placement head that includes at least one nozzle, and the placement head picking up at least one electronic component from the feeder and placing the at least one picked up electronic component on a circuit board, the optimization apparatus including: a task information storage unit operable to store task information for each task, each task information including (a) a placement order of electronic components in the task, (b) placement positions, each of which indicates where a different one of the electronic components is to be placed, and (c) a feeder position indicating a position of the feeder that supplies the electronic components, and the optimization method including: a first generation step of generating an X coordinate list by rearranging the task information for all tasks so as to be in descending order of X coordinate of placement position of an electronic component last in the placement order in each task information; a second generation step of generating a Z coordinate list by rearranging the task information so as to be in ascending order of a greatest feeder position in each task information; and an assignment step of alternately selecting a task from a top of the X coordinate list and a top of the Z coordinate list in the stated order, and assigning each task a position in the placement order according to an order in which the tasks were selected.

Furthermore, the present invention is an optimization program used in a computer for optimizing an electronic component placement order used in a placement apparatus that places electronic components on a circuit board by repeatedly performing tasks until all electronic components to be placed have been placed, each task being composed of: a feeder that supplies at least one electric component of at least one type of electronic component moving to a suction position of a placement head that includes at least one nozzle, and the placement head picking up at least one electronic component from the feeder and placing the at least one picked up electronic component on a circuit board, the computer including: a task information storage unit operable to store task information for each task, each task information including (a) a placement order of electronic components in the task, (b) placement positions, each of which indicates where a different one of the electronic components is to be placed, and (c) a feeder position indicating a position of the feeder that supplies the electronic components, and the optimization program including: a first generation step of generating an X coordinate list by rearranging the task information for all tasks so as to be in descending order of X coordinate of placement position of an electronic component last in the placement order in each task information; a second generation step of generating a Z coordinate list by rearranging the task information so as to be in ascending order of a greatest feeder position in each task information; and an assignment step of alternately selecting a task from a top of the X coordinate list and a top of the Z coordinate list in the stated order, and assigning each task a position in the placement order according to an order in which the tasks were selected.

Furthermore, the present invention is a computer-readable recording medium having recorded thereon an optimization program used in a computer for optimizing an electronic component placement order used in a placement apparatus that places electronic components on a circuit board by repeatedly performing tasks until all electronic components to be placed have been placed, each task being composed of: a feeder that supplies at least one electric component of at least one type of electronic component moving to a suction position of a placement head that includes at least one nozzle, and the placement head picking up at least one electronic component from the feeder and placing the at least one picked up electronic component on a circuit board, the computer including: a task information storage unit operable to store task information for each task, each task information including (a) a placement order of electronic components in the task, (b) placement positions, each of which indicates where a different one of the electronic components is to be placed, and (c) a feeder position indicating a position of the feeder that supplies the electronic components, and the optimization program including: a first generation step of generating an X coordinate list by rearranging the task information for all tasks so as to be in descending order of X coordinate of placement position of an electronic component last in the placement order in each task information; a second generation step of generating a Z coordinate list by rearranging the task information so as to be in ascending order of a greatest feeder position in each task information; and an assignment step of alternately selecting a task from a top of the X coordinate list and a top of the Z coordinate list in the stated order, and assigning each task a position in the placement order according to an order in which the tasks were selected.

Furthermore, the present invention is an optimization apparatus for optimizing an electronic component placement order used in a placement apparatus in which a feeder that supplies at least one electronic component of at least one type of electronic component move to a suction position of a placement head, and the placement head picks up electronic components from the feeder and places the electronic components on a circuit board, the optimization apparatus including: a plane generation unit operable to generate, for each electronic component type, an imaginary component plane that includes positions in which electronic components of the type are to be placed, and arrange the generated component planes in a predetermined order; a rearrangement unit operable to rearrange the component planes; an optimum path generation unit operable to generate, within each component plane, an optimum path that connects the components on the component plane; and a 3D path generation unit operable to generates a 3D path that connects the component planes, by connecting the path within each component plane with the paths within other component planes.

Here, the rearrangement unit includes an extraction sub-unit operable to extract, for each component plane, an exit electronic component, the exit electronic component being an electronic component for which the placement head movement time from the exit component on an original component plane that is the component plane, to an electronic component on a next component plane that is another component plane, is within a feeder movement time; a calculation sub-unit operable to calculate, for each original component plane and each next component plane, an exit candidate count that is a total number of exit electronic components, and calculate, for each original component plane, an exit candidate total that is a total number of exit electronic components; a selection sub-unit operable to select an original component plane having a smallest exit candidate total and set the selected original component plane as a first component plane, and select a next component plane that has a greatest exit candidate count with respect to selected the first component plane, and set the selected next component plane as a second component plane; and a component plane interchange sub-unit operable to interchange the first component plane and the second component plane in a component plane order.

Here, the extraction unit sets a square-shaped area, each side of the square-shaped area being a length corresponding to a movement time of a feeder, and a center of the square-shaped area being a position where an exit electronic component is to be placed, and, if an electronic component on the next component plane falls within the set square area, judges that the placement head movement time is less than the feeder movement time.

Furthermore, the present invention is an optimization method used in an optimization apparatus for optimizing an electronic component placement order used in a placement apparatus in which a feeder that supplies at least one electronic component of at least one type of electronic component move to a suction position of a placement head, and the placement head picks up electronic components from the feeder and places the electronic components on a circuit board, the optimization method including: a plane generation step of generating, for each electronic component type, an imaginary component plane that includes positions in which electronic components of the type are to be placed, and arranging the generated component planes in a predetermined order; a rearrangement step of rearranging the component planes; an optimum path generation step of generating, within each component plane, an optimum path that connects the components on the component plane; and a 3D path generation step of generating a 3D path that connects the component planes, by connecting the path within each component plane with the paths within other component planes.

Furthermore, the present invention is an optimization program used in a computer for optimizing an electronic component placement order used in a placement apparatus in which a feeder that supplies at least one electronic component of at least one type of electronic component move to a suction position of a placement head, and the placement head picks up electronic components from the feeder and places the electronic components on a circuit board, the optimization program including: a plane generation step of generating, for each electronic component type, an imaginary component plane that includes positions in which electronic components of the type are to be placed, and arranging the generated component planes in a predetermined order; a rearrangement step of rearranging the component planes; an optimum path generation step of generating, within each component plane, an optimum path that connects the components on the component plane; and a 3D path generation step of generating a 3D path that connects the component planes, by connecting the path within each component plane with the paths within other component planes.

Furthermore, the present invention is a computer-readable recording medium having recorded thereon an optimization program used in a computer for optimizing an electronic component placement order used in a placement apparatus in which a feeder that supplies at least one electronic component of at least one type of electronic component move to a suction position of a placement head, and the placement head picks up electronic components from the feeder and places the electronic components on a circuit board, the optimization program including: a plane generation step of generating, for each electronic component type, an imaginary component plane that includes positions in which electronic components of the type are to be placed, and arranging the generated component planes in a predetermined order; a rearrangement step of rearranging the component planes; an optimum path generation step of generating, within each component plane, an optimum path that connects the components on the component plane; and a 3D path generation step of generating a 3D path that connects the component planes, by connecting the path within each component plane with the paths within other component planes.

INDUSTRIAL APPLICABILITY

The optimization apparatus of the present invention can be used to improve efficiency of placing electronic components in a placement apparatus that places the electronic components on a circuit board.

The invention claimed is:

1. An optimization method used in an optimization apparatus in an electronic component placement system further including two or more placement apparatuses that place electronic components on a circuit board, the optimization apparatus optimizing a placement order in which the electronic components are placed on the circuit board by the placement apparatuses, the optimization method comprising:
   a first assignment step of assigning each type of electronic component to one of the placement apparatuses, thereby determining a first assignment for each type of electronic component;
   a first calculation step of calculating, for each placement apparatus, a first placement time required for the placement apparatus to place all electronic components assigned thereto according to the first assignments on the circuit board;
   a second assignment step of selecting two placement apparatuses from the placement apparatuses, selecting, for each of the two selected placement apparatuses, one type of electronic component that has been assigned to the placement apparatus, and determining a second assignment by swapping the two selected types of electronic components between the two placement apparatuses;
   a second calculation step of calculating, for each of the two placement apparatuses, a second placement time required for the placement apparatus to place all electronic components assigned thereto according to the second assignment on the circuit board; and
   an adoption determination step of determining adoption of one of the first assignment and the second assignment that enables a shortest placement time, by comparing a greatest first placement time and a greatest second placement time from among the first placement times and the second placement times calculated for the two placement apparatuses selected for interchanging by the second assignment unit,
   wherein each placement apparatus is a multifunction apparatus operable to pick up electronic components with use of a mounting head, move the placement head to a position on a circuit board, and place the picked-up electronic components on the circuit board, and
   each placement apparatus places, on the circuit board, electronic components in accordance with the one of the first assignment and the second assignment determined to be adopted by the adoption determination step.

2. The optimization method of claim 1 wherein the first assignment step includes storing, for each type of electronic component, a component count of the electron components of that type and calculating (i) for one electronic component of each type and for each placement apparatus, a reference placement time required for the placement apparatus to place the electronic component, and (ii) for each type of electrical component and for each placement apparatus, using the component count of the type, a placement time required for the placement apparatus to place all electronic components of the type on the circuit board, and
   using the placement times calculated for each of the placement apparatuses for each type of electronic component to provide an assignment of electronic components of the type to one of the placement apparatuses.

3. The optimization method of claim 2 wherein the second assignment step assigns a type of electronic component, from among the types of electronic components, that can only be placed by a particular placement apparatus to that particular placement apparatus, the assignment being performed with priority over other types of electronic components.

4. The optimization method of claim 3 wherein the second assignment step assigns a type of electronic component that has, from among the placement times calculated for each placement apparatus and each type of electronic component, a placement time smaller than a predetermined value, to a placement apparatus that is upstream-most among placement apparatuses having a placement time smaller than a predetermined value, the assignment being performed with priority over other types of electronic components and other placement apparatuses.

5. The optimization method of claim 1 wherein each placement apparatus includes an electronic feeder of electronic components to a placement head, wherein the first and second calculating steps each include calculating a feeder movement time for moving of each electronic component to the placement head and a placement head time for movement of the placement head to each successive electronic component position.

6. The optimization method of claim 5 wherein the first and second assignment steps include determining an optimum path that connects electronic components within common component planes and between component planes when more than one component plane is determined.

* * * * *